(12) United States Patent
Akimoto et al.

(10) Patent No.: US 10,079,307 B2
(45) Date of Patent: Sep. 18, 2018

(54) SEMICONDUCTOR DEVICE AND MANUFACTURING METHOD FOR THE SAME

(71) Applicant: Semiconductor Energy Laboratory Co., Ltd., Atsugi-shi, Kanagawa-ken (JP)

(72) Inventors: Kengo Akimoto, Atsugi (JP); Junichiro Sakata, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/585,953

(22) Filed: Dec. 30, 2014

(65) Prior Publication Data

US 2015/0108478 A1    Apr. 23, 2015

Related U.S. Application Data

(63) Continuation of application No. 13/552,805, filed on Jul. 19, 2012, now Pat. No. 8,946,700, which is a
(Continued)

(30) Foreign Application Priority Data

Oct. 21, 2009    (JP) ................. 2009-242256

(51) Int. Cl.
*H01L 29/786*    (2006.01)
*H01L 27/12*    (2006.01)

(52) U.S. Cl.
CPC .... *H01L 29/78618* (2013.01); *H01L 27/1225* (2013.01); *H01L 29/7869* (2013.01)

(58) Field of Classification Search
CPC ............... H01L 29/7869; H01L 29/786; H01L 27/1214; H01L 27/1225
See application file for complete search history.

(56) References Cited

U.S. PATENT DOCUMENTS 5,198,379 A    3/1993    Adan
5,644,147 A    7/1997    Yamazaki et al.
(Continued)

FOREIGN PATENT DOCUMENTS

EP    1624333 A    2/2006
EP    1737044 A    12/2006
(Continued)

OTHER PUBLICATIONS

Taiwanese Office Action (Application No. 101127542) dated Jul. 8, 2015.
(Continued)

*Primary Examiner* — Michele Fan
(74) *Attorney, Agent, or Firm* — Eric J. Robinson; Robinson Intellectual Property Law Office, P.C.

(57) ABSTRACT

An object is to provide a method for manufacturing a highly reliable semiconductor device including thin film transistors which have stable electric characteristics and are formed using an oxide semiconductor. A method for manufacturing a semiconductor device includes the steps of: forming an oxide semiconductor film over a gate electrode with a gate insulating film interposed between the oxide semiconductor film and the gate electrode, over an insulating surface; forming a first conductive film including at least one of titanium, molybdenum, and tungsten, over the oxide semiconductor film; forming a second conductive film including a metal having lower electronegativity than hydrogen, over the first conductive film; forming a source electrode and a drain electrode by etching of the first conductive film and the second conductive film; and forming an insulating film in contact with the oxide semiconductor film, over the oxide semiconductor film, the source electrode, and the drain electrode.

29 Claims, 30 Drawing Sheets

Related U.S. Application Data continuation of application No. 12/906,553, filed on Oct. 18, 2010, now Pat. No. 8,470,650.

(56) References Cited

U.S. PATENT DOCUMENTS

| | | |
|---|---|---|
| 5,661,050 A | 8/1997 | Boer et al. |
| 5,731,856 A | 3/1998 | Kim et al. |
| 5,744,864 A | 4/1998 | Cillessen et al. |
| 5,818,070 A | 10/1998 | Yamazaki et al. |
| 5,831,284 A * | 11/1998 | Park .................. G02F 1/136213 257/296 |
| 5,872,370 A | 2/1999 | Gu et al. |
| 5,923,963 A | 7/1999 | Yamanaka |
| 6,265,730 B1 * | 7/2001 | Nakanishi ......... H01L 29/66757 257/57 |
| 6,294,274 B1 | 9/2001 | Kawazoe et al. |
| 6,303,946 B1 | 10/2001 | Sung |
| 6,451,632 B1 | 9/2002 | Sung |
| 6,563,174 B2 | 5/2003 | Kawasaki et al. |
| 6,727,522 B1 | 4/2004 | Kawasaki et al. |
| 6,972,822 B2 | 12/2005 | Miyashita |
| 6,982,194 B2 | 1/2006 | Tsunoda et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,348,631 B2 | 3/2008 | Hotta |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,550,772 B2 | 6/2009 | Toyota et al. |
| 7,564,058 B2 | 7/2009 | Yamazaki et al. |
| 7,580,276 B2 | 8/2009 | Sawa et al. |
| 7,611,930 B2 | 11/2009 | Yamazaki et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,763,502 B2 | 7/2010 | Kakehata et al. |
| 7,768,009 B2 | 8/2010 | Kobayashi et al. |
| 7,791,075 B2 | 9/2010 | Kobayashi et al. |
| 7,855,379 B2 | 12/2010 | Hayashi et al. |
| 7,872,722 B2 | 1/2011 | Kimura |
| 7,902,553 B2 | 3/2011 | Kim et al. |
| 7,910,490 B2 | 3/2011 | Akimoto et al. |
| 7,915,101 B2 | 3/2011 | Jeong et al. |
| 7,932,521 B2 | 4/2011 | Akimoto et al. |
| 7,940,345 B2 | 5/2011 | Yamazaki |
| 8,022,405 B2 | 9/2011 | Yamazaki |
| 8,030,655 B2 | 10/2011 | Yamazaki |
| 8,039,840 B2 | 10/2011 | Hosoya |
| 8,063,421 B2 | 11/2011 | Kang et al. |
| 8,067,775 B2 | 11/2011 | Miyairi et al. |
| 8,088,652 B2 | 1/2012 | Hayashi et al. |
| 8,133,771 B2 | 3/2012 | Kobayashi et al. |
| 8,164,152 B2 | 4/2012 | Lee et al. |
| 8,203,144 B2 | 6/2012 | Hoffman et al. |
| 8,212,953 B2 | 7/2012 | Hosoya |
| 8,273,611 B2 | 9/2012 | Kakehata et al. |
| 8,274,077 B2 | 9/2012 | Akimoto et al. |
| 8,304,298 B2 | 11/2012 | Ofuji et al. |
| 8,324,626 B2 | 12/2012 | Kimura et al. |
| 8,344,374 B2 | 1/2013 | Yamazaki et al. |
| 8,384,077 B2 | 2/2013 | Yano et al. |
| 8,389,993 B2 | 3/2013 | Kobayashi et al. |
| 8,400,187 B2 | 3/2013 | Yamazaki et al. |
| 8,420,462 B2 | 4/2013 | Kobayashi et al. |
| 8,436,349 B2 | 5/2013 | Sano et al. |
| 8,466,463 B2 | 6/2013 | Akimoto et al. |
| 8,486,775 B2 | 7/2013 | Kim et al. |
| 8,502,217 B2 | 8/2013 | Sato et al. |
| 8,586,979 B2 | 11/2013 | Son et al. |
| 8,642,402 B2 | 2/2014 | Yano et al. |
| 8,647,031 B2 | 2/2014 | Hoffman et al. |
| 8,785,240 B2 | 7/2014 | Watanabe |
| 8,946,700 B2 * | 2/2015 | Akimoto .................. 257/368 |
| 8,981,369 B2 | 3/2015 | Yano et al. |
| 2001/0008157 A1 | 7/2001 | Bishop et al. |
| 2001/0046027 A1 | 11/2001 | Tai et al. |
| 2002/0056838 A1 | 5/2002 | Ogawa |
| 2002/0126243 A1 | 9/2002 | Hibino et al. |
| 2002/0132454 A1 | 9/2002 | Ohtsu et al. |
| 2003/0189401 A1 | 10/2003 | Kido et al. |
| 2003/0218166 A1 | 11/2003 | Tsutsui |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0195574 A1 | 10/2004 | Ahn et al. |
| 2005/0017302 A1 | 1/2005 | Hoffman |
| 2005/0122443 A1 | 6/2005 | Kim et al. |
| 2005/0199959 A1 | 9/2005 | Chiang et al. |
| 2005/0263767 A1 | 12/2005 | Yamazaki et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 * | 11/2006 | Sugihara ........... H01L 29/66969 257/646 |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 * | 3/2007 | Akimoto ............. H01L 27/1225 438/795 |
| 2007/0090365 A1 | 4/2007 | Hayashi et al. |
| 2007/0108446 A1 | 5/2007 | Akimoto |
| 2007/0138475 A1 * | 6/2007 | Kitakado ............ G02F 1/13454 257/66 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 * | 8/2007 | Furuta ............... H01L 29/41733 257/347 |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0029767 A1 | 2/2008 | Nagata et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0093595 A1 | 4/2008 | Song et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0142797 A1 | 6/2008 | Lee et al. |

(56) References Cited

U.S. PATENT DOCUMENTS

| | | |
|---|---|---|
| 2008/0166834 A1 | 7/2008 | Kim et al. |
| 2008/0182358 A1 | 7/2008 | Cowdery-Corvan et al. |
| 2008/0197350 A1* | 8/2008 | Park ................. H01L 29/7869 257/43 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277663 A1 | 11/2008 | Kang et al. |
| 2008/0296568 A1 | 12/2008 | Ryu et al. |
| 2008/0299702 A1 | 12/2008 | Son et al. |
| 2008/0308796 A1 | 12/2008 | Akimoto et al. |
| 2008/0308805 A1 | 12/2008 | Akimoto et al. |
| 2008/0318394 A1 | 12/2008 | Kakehata et al. |
| 2009/0001374 A1* | 1/2009 | Inoue .................. H01L 29/7869 257/59 |
| 2009/0001375 A1 | 1/2009 | Yamazaki et al. |
| 2009/0002591 A1 | 1/2009 | Yamazaki et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0184315 A1 | 7/2009 | Lee et al. |
| 2009/0191672 A1 | 7/2009 | Kunii |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0025679 A1 | 2/2010 | Yamazaki et al. |
| 2010/0035379 A1* | 2/2010 | Miyairi ............... H01L 27/1225 438/104 |
| 2010/0051933 A1* | 3/2010 | Kim .................... H01L 29/7869 257/43 |
| 2010/0051934 A1* | 3/2010 | Choung ............. H01L 27/1225 257/43 |
| 2010/0051935 A1 | 3/2010 | Lee et al. |
| 2010/0051936 A1* | 3/2010 | Hayashi .............. H01L 29/7869 257/43 |
| 2010/0051937 A1 | 3/2010 | Kaji et al. |
| 2010/0065838 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065841 A1* | 3/2010 | Lee .................... H01L 27/1225 257/43 |
| 2010/0065842 A1 | 3/2010 | Yamazaki et al. |
| 2010/0065844 A1 | 3/2010 | Tokunaga |
| 2010/0072467 A1* | 3/2010 | Yamazaki ........... H01L 27/1225 257/43 |
| 2010/0084649 A1 | 4/2010 | Seo et al. |
| 2010/0084653 A1 | 4/2010 | Yamazaki et al. |
| 2010/0090217 A1 | 4/2010 | Akimoto |
| 2010/0092800 A1 | 4/2010 | Itagaki et al. |
| 2010/0102311 A1 | 4/2010 | Ito et al. |
| 2010/0102312 A1 | 4/2010 | Yamazaki et al. |
| 2010/0102314 A1 | 4/2010 | Miyairi et al. |
| 2010/0109002 A1 | 5/2010 | Itagaki et al. |
| 2010/0110623 A1* | 5/2010 | Koyama ............. H01L 27/1248 361/679.01 |
| 2010/0117076 A1 | 5/2010 | Akimoto et al. |
| 2010/0123132 A1* | 5/2010 | Nakata ............... H01L 29/66969 257/43 |
| 2010/0127266 A1* | 5/2010 | Saito .................. H01L 27/1225 257/59 |
| 2010/0136743 A1 | 6/2010 | Akimoto et al. |
| 2010/0163874 A1 | 7/2010 | Koyama et al. |
| 2010/0187523 A1* | 7/2010 | Sakata ................. H01L 29/16 257/43 |
| 2010/0193793 A1* | 8/2010 | Moriwaki ........... G02F 1/13452 257/59 |
| 2010/0200851 A1* | 8/2010 | Oikawa ............... H01L 27/1214 257/43 |
| 2010/0200916 A1 | 8/2010 | Gossner et al. |
| 2010/0219410 A1* | 9/2010 | Godo ................. H01L 29/78693 257/43 |
| 2010/0252826 A1 | 10/2010 | Yamazaki et al. |
| 2010/0283049 A1* | 11/2010 | Sato .................. H01L 29/78606 257/43 |
| 2010/0285632 A1 | 11/2010 | Inoue et al. |
| 2010/0295037 A1* | 11/2010 | Hironaka ........... H01L 29/78693 257/43 |
| 2010/0301326 A1* | 12/2010 | Miyairi ............... H01L 27/1225 257/43 |
| 2010/0301327 A1* | 12/2010 | Kang .................... G02F 1/1333 257/43 |
| 2010/0308324 A1* | 12/2010 | Kim .................... H01L 27/1214 257/43 |
| 2011/0003418 A1* | 1/2011 | Sakata ............... H01L 21/02554 438/34 |
| 2011/0003430 A1* | 1/2011 | Yamazaki ........... H01L 21/67109 438/104 |
| 2011/0006302 A1* | 1/2011 | Yamazaki ........... H01L 27/1225 257/43 |
| 2011/0012105 A1* | 1/2011 | Yamazaki ........... H01L 27/1251 257/43 |
| 2011/0012106 A1* | 1/2011 | Yamazaki ........... H01L 27/1225 257/43 |
| 2011/0012117 A1* | 1/2011 | Yamazaki ........... H01L 27/1225 257/59 |
| 2011/0024740 A1 | 2/2011 | Yamazaki et al. |
| 2011/0024750 A1* | 2/2011 | Yamazaki ........... H01L 27/1214 257/57 |
| 2011/0031498 A1 | 2/2011 | Kimura et al. |
| 2011/0050733 A1* | 3/2011 | Yano .................... C23C 14/086 345/690 |
| 2011/0057918 A1* | 3/2011 | Kimura ................ G09G 3/3648 345/211 |
| 2011/0059575 A1* | 3/2011 | Tsubuku ............ H01L 29/66969 438/104 |
| 2011/0062433 A1* | 3/2011 | Yamazaki ........... H01L 27/1225 257/43 |
| 2011/0062435 A1* | 3/2011 | Yamazaki ........... H01L 29/7869 257/43 |
| 2011/0079777 A1* | 4/2011 | Akimoto ............. H01L 29/7869 257/43 |
| 2011/0079784 A1 | 4/2011 | Im |
| 2011/0081747 A1* | 4/2011 | Yoshitomi ........... H01L 27/1225 438/104 |
| 2011/0084267 A1* | 4/2011 | Yamazaki ........... H01L 21/76828 257/43 |
| 2011/0084268 A1* | 4/2011 | Yamazaki ........... H01L 27/1214 257/43 |
| 2011/0084272 A1* | 4/2011 | Miyanaga ............... H01L 29/45 257/43 |
| 2011/0090184 A1* | 4/2011 | Yamazaki ................ G09G 3/20 345/204 |
| 2011/0104851 A1 | 5/2011 | Akimoto et al. |
| 2011/0114940 A1* | 5/2011 | Kim .................. H01L 21/02554 257/43 |
| 2011/0117697 A1 | 5/2011 | Akimoto et al. |
| 2011/0121290 A1 | 5/2011 | Akimoto et al. |
| 2011/0198595 A1 | 8/2011 | Yamazaki |
| 2011/0227060 A1* | 9/2011 | Miyanaga ........... H01L 29/7869 257/43 |
| 2011/0278577 A1 | 11/2011 | Yamazaki |
| 2012/0009742 A1 | 1/2012 | Yamazaki |
| 2012/0091452 A1* | 4/2012 | Ohta ...................... H01L 29/45 257/43 |
| 2012/0126227 A1* | 5/2012 | Maeda ............... H01L 27/1225 257/43 |
| 2012/0199891 A1* | 8/2012 | Suzuki .............. H01L 29/66969 257/288 |

(56) References Cited

U.S. PATENT DOCUMENTS

| | | | |
|---|---|---|---|
| 2012/0270348 A1 | 10/2012 | Hosoya | |
| 2012/0273780 A1 | 11/2012 | Yamazaki et al. | |
| 2013/0295731 A1 | 11/2013 | Kim et al. | |

FOREIGN PATENT DOCUMENTS

| | | | | |
|---|---|---|---|---|
| EP | 1770788 A | 4/2007 | | |
| EP | 1956656 A | 8/2008 | | |
| EP | 1995787 A | 11/2008 | | |
| EP | 1998373 A | 12/2008 | | |
| EP | 1998374 A | 12/2008 | | |
| EP | 1998375 A | 12/2008 | | |
| EP | 2086013 A | 8/2009 | | |
| EP | 2226847 A | 9/2010 | | |
| JP | 60-017962 A | 1/1985 | | |
| JP | 60-198861 A | 10/1985 | | |
| JP | 63-210022 A | 8/1988 | | |
| JP | 63-210023 A | 8/1988 | | |
| JP | 63-210024 A | 8/1988 | | |
| JP | 63-215519 A | 9/1988 | | |
| JP | 63-239117 A | 10/1988 | | |
| JP | 63-265818 A | 11/1988 | | |
| JP | 04-025178 A | 1/1992 | | |
| JP | 05-251705 A | 9/1993 | | |
| JP | 07-092491 A | 4/1995 | | |
| JP | 08-264794 A | 10/1996 | | |
| JP | 11-040814 A | 2/1999 | | |
| JP | 11-505377 | 5/1999 | | |
| JP | 2000-044236 A | 2/2000 | | |
| JP | 2000-150900 A | 5/2000 | | |
| JP | 2000-228526 A | 8/2000 | | |
| JP | 2002-076356 A | 3/2002 | | |
| JP | 2002-289859 A | 10/2002 | | |
| JP | 2003-086000 A | 3/2003 | | |
| JP | 2003-086808 A | 3/2003 | | |
| JP | 2003-107490 A | 4/2003 | | |
| JP | 2004-103957 A | 4/2004 | | |
| JP | 2004-273614 A | 9/2004 | | |
| JP | 2004-273732 A | 9/2004 | | |
| JP | 2006-080494 A | 3/2006 | | |
| JP | 2006-132720 A | 5/2006 | | |
| JP | 2007-096055 A | 4/2007 | | |
| JP | 2007-123861 A | 5/2007 | | |
| JP | 2007-298649 A | 11/2007 | | |
| JP | 2008-198643 A | 8/2008 | | |
| JP | WO 2008096768 A1 | * | 8/2008 | ............ C23C 14/086 |
| JP | 2008-219008 A | 9/2008 | | |
| JP | 2008-235871 A | 10/2008 | | |
| JP | 2008-281988 A | 11/2008 | | |
| JP | 2009-004733 A | 1/2009 | | |
| JP | 2009-021612 A | 1/2009 | | |
| JP | 2009-033124 A | 2/2009 | | |
| JP | 2009-081425 A | 4/2009 | | |
| JP | 2009-099847 A | 5/2009 | | |
| JP | WO 2009057444 A1 | * | 5/2009 | ......... G02F 1/13452 |
| JP | 2009-141002 A | 6/2009 | | |
| JP | WO 2009072532 A1 | * | 6/2009 | ....... H01L 29/78606 |
| JP | 2009-158940 A | 7/2009 | | |
| JP | 2009-224479 A | 10/2009 | | |
| KR | 2006-0132720 A | 12/2006 | | |
| KR | 2008-0073870 A | 8/2008 | | |
| KR | 2009-0084642 A | 8/2009 | | |
| TW | 200845397 | 11/2008 | | |
| TW | 200903810 | 1/2009 | | |
| TW | 200926417 | 6/2009 | | |
| WO | WO-2004/114391 | 12/2004 | | |
| WO | WO-2005/093850 | 10/2005 | | |
| WO | WO-2008/105250 | 9/2008 | | |
| WO | WO-2008/105347 | 9/2008 | | |
| WO | WO-2008/126879 | 10/2008 | | |
| WO | WO-2008/143304 | 11/2008 | | |
| WO | WO-2009/072532 | 6/2009 | | |
| WO | WO-2009/075281 | 6/2009 | | |

OTHER PUBLICATIONS

International Search Report (Application No. PCT/JP2010/067196) dated Nov. 16, 2010.

Written Opinion (Application No. PCT/JP2010/067196) dated Nov. 16, 2010.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3605-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

(56) References Cited

OTHER PUBLICATIONS

Parks et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTS", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposiun Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposiun Digest of Technical Papers, May 20, 2008, vol. 39, pp. 629-632.

(56) References Cited

OTHER PUBLICATIONS

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Song.I et al., "Short Channel Characteristics of Gallium-Indium-Zinc-Oxide Thin Film Transistors for Three-Dimensional Stacking Memory", IEEE Electron Device Letters, Jun. 1, 2008, vol. 29, No. 6, pp. 549-552.

Korean Office Action (Application No. 2012-7019093) dated Sep. 13, 2013.

Korean Office Action (Application No. 2013-7030134) dated Dec. 16, 2013.

Taiwanese Office Action (Application No. 105109222) dated Oct. 13, 2016.

Korean Office Action (Application No. 2012-7012808) dated Apr. 12, 2017.

Taiwanese Office Action (Application No. 105109222) dated Jan. 25, 2018.

Korean Office Action (Application No. 2017-7038571) dated Mar. 16, 2018.

\* cited by examiner

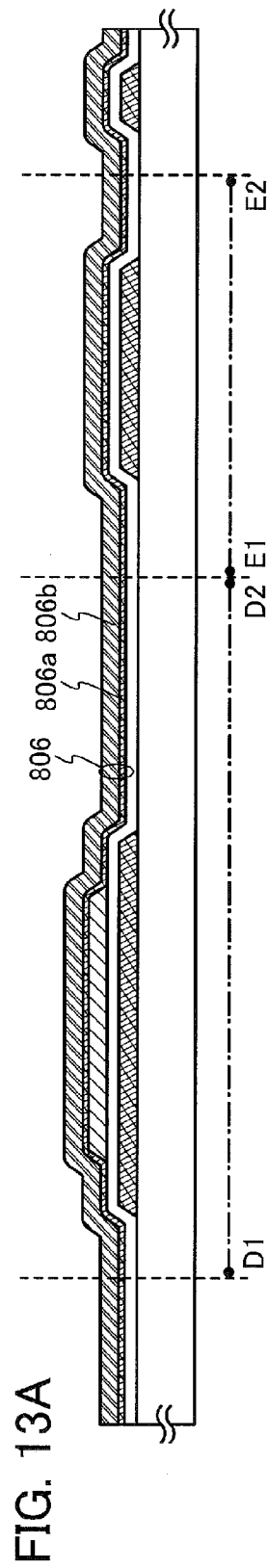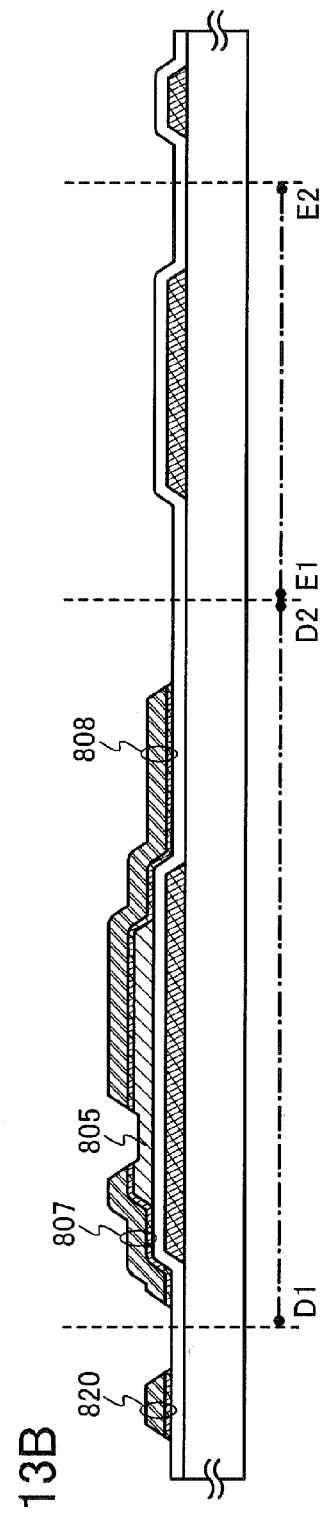

FIG. 15
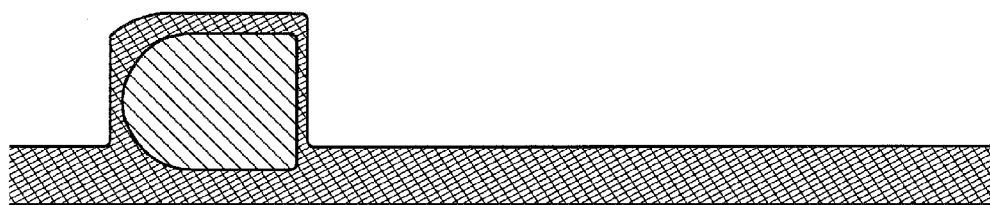
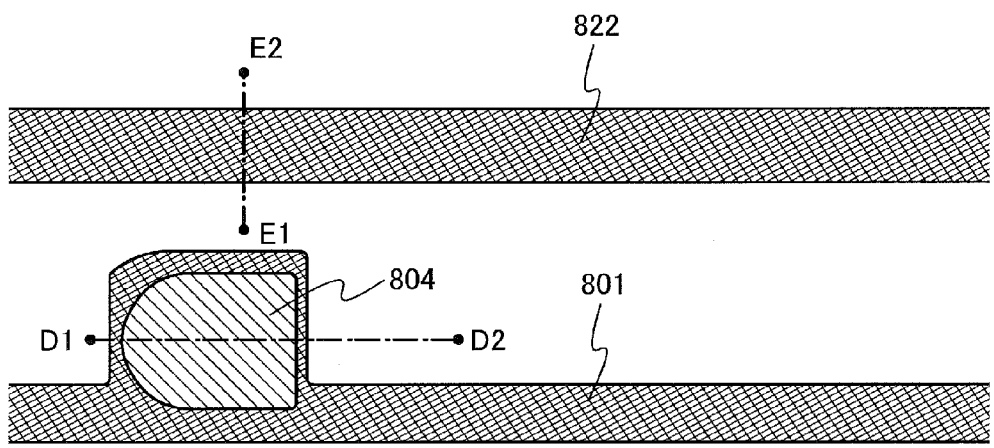
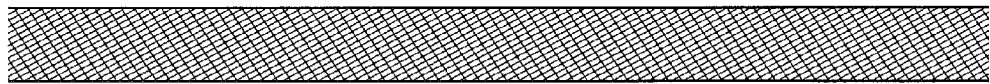

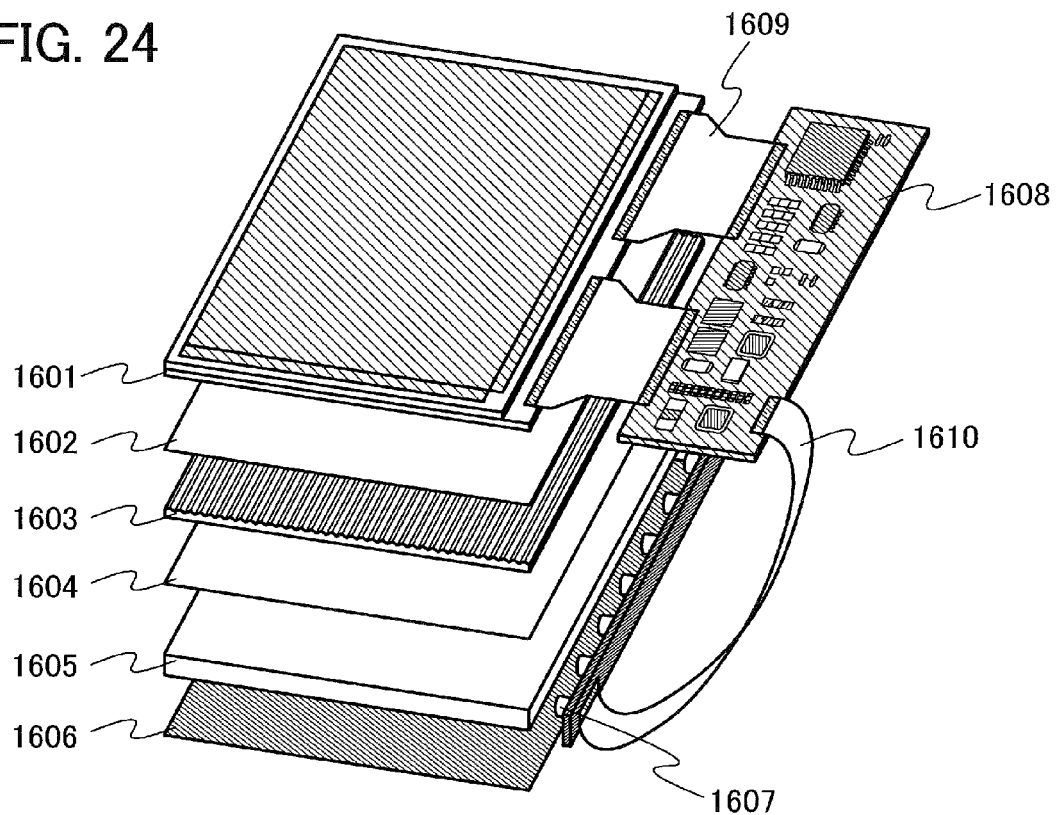

SEMICONDUCTOR DEVICE AND MANUFACTURING METHOD FOR THE SAME

TECHNICAL FIELD

The present invention relates to a semiconductor device including an oxide semiconductor and a manufacturing method thereof.

BACKGROUND ART

A thin film transistor formed using a semiconductor film formed over an insulating surface is a semiconductor element which is essential for a semiconductor device. Since a restriction of the allowable temperature limit of a substrate is imposed on manufacture of a thin film transistor, thin film transistors having active layers including amorphous silicon which can be deposited at relatively low temperature, polysilicon which is obtained in such a manner that crystallization is performed using laser light or a catalyst element, or the like become the mainstream of transistors used for semiconductor display devices.

In recent years, a metal oxide showing semiconductor characteristics has attracted attention, which is called an oxide semiconductor as a novel semiconductor material having high mobility obtained by polysilicon and having uniform element characteristics obtained by amorphous silicon. The metal oxide is used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, and zinc oxide. Thin film transistors in each of which a channel formation region is formed using such a metal oxide having semiconductor characteristics have been known (Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

Transistors used for semiconductor devices preferably have small variation in threshold voltage, which is caused by degradation over time, and good properties in on-state current or the like. When transistors having small variation in threshold voltage, which is caused by degradation over time are used, reliability of semiconductor devices can be increased. In addition, when transistors having good characteristics such as on-state current are used, semiconductor devices can be driven at a higher frequency.

It is an object of the present invention to provide a method for manufacturing a highly reliable semiconductor device. Alternatively, it is an object of the present invention to provide a method for manufacturing a semiconductor device which can operate at high speed. Alternatively, an object of the present invention is to provide a highly reliable semiconductor device. Alternatively, an object of the present invention is to provide a semiconductor device which can operate at high speed.

The present inventors have paid their attention to the fact that impurities such as hydrogen or water existing in an oxide semiconductor film cause degradation over time, such as shifts in threshold voltage, to transistors. Then, they have thought that a conductive film formed using a low electronegativity metal, specifically, a metal of lower electronegativity than hydrogen is used as a conductive film for a source electrode or a drain electrode and is formed over or below an oxide semiconductor film, so that impurities such as hydrogen or water existing in the oxide semiconductor film are extracted by the conductive film and purity of the oxide semiconductor film is increased; consequently, degradation of transistors over time due to the impurities such as hydrogen or water can be suppressed. The conductive film is processed into a desired shape by etching or the like, so that a source electrode and a drain electrode can be formed.

Specifically, according to one embodiment of the present invention, in manufacture of a semiconductor device having a transistor in which an oxide semiconductor film is used for an active layer, a first conductive film formed using a metal material having low contact resistance to the oxide semiconductor film, such as titanium, tungsten, or molybdenum, is formed so as to be in contact with the oxide semiconductor film. In addition, a second conductive film formed using a low electronegativity metal, a low electronegativity metal compound, or a low electronegativity alloy is formed so as to overlap with the oxide semiconductor film with the first conductive film between the second conductive film and the oxide semiconductor film. Then, the first conductive film and the second conductive film are processed into desired shapes by etching or the like, whereby a source electrode and a drain electrode are formed.

Alternatively, the first conductive film is formed so as to be in contact with the oxide semiconductor film, and the second conductive film is formed so as to overlap with the oxide semiconductor film with the first conductive film between the second conductive film and the oxide semiconductor film, and then the second conductive film is removed by etching. In this case, after the second conductive film is removed, a third conductive film formed using a low electronegativity metal, a low electronegativity metal compound, or a low electronegativity alloy is additionally formed so as to overlap with the oxide semiconductor film with the first conductive film between the third conductive film and the oxide semiconductor film. Then, the first conductive film and the third conductive film are processed into desired shapes by etching or the like, whereby the source electrode and the drain electrode are formed.

Further alternatively, the first conductive film is formed so as to be in contact with the oxide semiconductor film, and the second conductive film is formed so as to overlap with the oxide semiconductor film with the first conductive film between the second conductive film and the oxide semiconductor film, and then the second conductive film is removed by etching. Next, after the second conductive film is removed, the third conductive film formed using a low electronegativity metal, a low electronegativity metal compound, or a low electronegativity alloy is formed so as to overlap with the oxide semiconductor film with the first conductive film between the third conductive film and the oxide semiconductor film. Further, over the third conductive film, a fourth conductive film formed using a metal material having low contact resistance to the oxide semiconductor film, such as titanium, tungsten, or molybdenum, is formed so as to overlap with the oxide semiconductor film. Note that in the case, a fifth conductive film formed using a metal material having low contact resistance to the oxide semiconductor film, such as titanium, tungsten, or molybdenum may be formed between the first conductive film and the third conductive film. Then, the first conductive film, the third conductive film, and the fourth conductive film, or the first conductive film, the third conductive film, the fourth conductive film, and the fifth conductive film are formed by processed into desired shapes by etching or the like, whereby the source electrode and the drain electrode are formed.

According to one embodiment of the present invention, the metal material having low contact resistance to the oxide semiconductor film is used for the first conductive film forming the source electrode and the drain electrode, and the first conductive film is in contact with the oxide semiconductor film, so that contact resistance between the source or drain electrode and the oxide semiconductor film is reduced. Accordingly, on-state current and field-effect mobility of a TFT can be increased. In addition, the second conductive film and the third conductive film are formed using a low electronegativity metal, a low electronegativity metal compound, or a low electronegativity alloy, so that impurities such as moisture or hydrogen existing in the oxide semiconductor film, a gate insulating film, or at an interface between the oxide semiconductor film and another insulating film and the vicinity thereof are occluded or adsorbed by the second conductive film or the third conductive film. Therefore, by elimination of impurities such as moisture or hydrogen, an oxide semiconductor which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

As the low electronegativity metal, aluminum, magnesium, and the like can be given. A mixture, a metal compound, or an alloy each including one or more of the above metals can be used for the second conductive film and the third conductive film. Alternatively, a heat-resistant conductive material such as an element selected from titanium, tantalum, tungsten, molybdenum, chromium, neodymium, or scandium; an alloy containing one or more of the above elements as a component; nitride containing any of the above elements as a component is combined with aluminum to be used as the second conductive film and the third conductive film.

Note that among the above metal having low contact resistance to the oxide semiconductor film, electronegativity of titanium is lower than that of hydrogen; therefore, impurities such as moisture or hydrogen are easily extracted from the oxide semiconductor film. Therefore, titanium is used for the first conductive film, the fourth conductive film, and the fifth conductive film, so that impurities in the oxide semiconductor film can be reduced and the source electrode and the drain electrode which have low contact resistance to the oxide semiconductor film can be formed.

In addition to the above structure, while the second conductive film, the third conductive film, or the fourth conductive film is exposed, heat treatment is performed under a reduced atmosphere or an inert gas atmosphere, so that moisture, oxygen, or the like which is adsorbed on a surface of or inside the second conductive film, the third conductive film, or the fourth conductive film may be removed. The temperature range of the heat treatment is 200° C. to 450° C. The heat treatment is performed, so that impurities such as moisture or hydrogen existing in the oxide semiconductor film, the gate insulating film, or at the interface between the oxide semiconductor film and another insulating film and the vicinity thereof can be easily occluded or adsorbed by the second conductive film, the third conductive film, or the fourth conductive film.

After the source electrode and the drain electrode are formed, a single-layer insulating film or a plurality of insulating films stacked may be formed so as to cover the source electrode, the drain electrode, and the oxide semiconductor film. A material having a high barrier property is preferably used for the insulating film. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a barrier property, such as a silicon oxide film or a silicon oxynitride film, is formed on the side close to the oxide semiconductor film. Then, the insulating film having a barrier property is formed so as to overlap with the source electrode, the drain electrode, and the oxide semiconductor film with the insulating film having lower proportion of nitrogen between the insulating film having a barrier property and the source electrode, the drain electrode, and the oxide semiconductor film. When the insulating film having a barrier property is used, moisture or oxygen can be prevented from being adsorbed on the surface of or inside the conductive film. In addition, the impurities such as moisture or hydrogen can be prevented from entering the oxide semiconductor film, the gate insulating film, or at the interface between the oxide semiconductor film and another insulating film and the vicinity thereof.

In addition, between a gate electrode and the oxide semiconductor film, a gate insulating film may be formed to have a structure in which an insulating film formed using a material having a high barrier property, and an insulating film having lower proportion of nitrogen, such as a silicon oxide film or a silicon oxynitride film, are stacked. The insulating film such as a silicon oxide film or a silicon oxynitride film is formed between the insulating film having a barrier property and the oxide semiconductor film. The insulating film having a barrier property is used, so that impurities in an atmosphere, such as moisture or hydrogen, or impurities included in a substrate, such as an alkali metal or a heavy metal, can be prevented from entering the oxide semiconductor film, the gate insulating film, or at the interface between the oxide semiconductor film and another insulating film and the vicinity thereof.

To reduce impurities such as moisture or hydrogen in the oxide semiconductor film, after the oxide semiconductor film is formed, heat treatment is performed in an inert gas atmosphere such as a nitrogen atmosphere or a rare gas (argon, helium, or the like) atmosphere while the oxide semiconductor film is exposed. The temperature range of the heat treatment is preferably higher than or equal to 500° C. and lower than or equal to 750° C. (or temperature of lower than or equal to a strain point of a glass substrate). Note that this heat treatment is performed at a temperature not exceeding the allowable temperature limit of the substrate to be used.

As the oxide semiconductor, a four-component metal oxide such as an In—Sn—Ga—Zn—O-based oxide semiconductor, a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, and a Sn—Al—Zn—O-based oxide semiconductor, or a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, an In—Ga—O-based oxide semiconductor, an In—O-based oxide semiconductor, a Sn—O-based oxide semiconductor, and a Zn—O-based oxide semiconductor can be used. Note that in this specification, for example, an In—Sn—Ga—Zn—O-based oxide semiconductor means a metal oxide including indium (In), tin (Sn), gallium (Ga), and zinc (Zn). There is no particular limitation on the composition ratio. The above oxide semiconductor may include silicon.

Alternatively, oxide semiconductors can be represented by the chemical formula, $InMO_3(ZnO)_m$ (m>0). Here, M represents one or more metal elements selected from Ga, Al, Mn, or Co.

Note that impurities such as moisture in the oxide semiconductor film are eliminated by the heat treatment, so that carrier concentration is increased and resistance is reduced. Then, when an insulating film such as a silicon oxide film or a silicon oxynitride film is formed so as to be in contact with the oxide semiconductor film with reduced resistance, oxygen is supplied to at least a region of the oxide semiconductor film with reduced resistance which is in contact with the insulating film, so that carrier concentration is reduced (preferably, less than $1\times10^{18}/cm^3$, more preferably less than or equal to $1\times10^{14}/cm^3$) and resistance is increased. In this manner, carrier concentration and resistance of the oxide semiconductor film can be controlled by the formation of the insulating film such as a silicon oxide film or a silicon oxynitride film in a process of a semiconductor device; therefore, a semiconductor device having a thin film transistor which has good electric characteristics and good reliability can be manufactured and provided.

The transistor may be a bottom gate transistor, a top gate transistor, or a bottom contact transistor. A bottom gate transistor has a gate electrode over an insulating surface; a gate insulating film over the gate electrode; an oxide semiconductor film which is over the gate insulating film and which overlaps with the gate electrode; a source electrode and a drain electrode which are over the oxide semiconductor film; and an insulating film over the source electrode, the drain electrode, and the oxide semiconductor film. A top gate transistor has an oxide semiconductor film over an insulating surface; a gate insulating film over the oxide semiconductor film; a gate electrode which overlaps with the oxide semiconductor film over the gate insulating film and functions as a conductive film; a source electrode; a drain electrode; and an insulating film over the source electrode, the drain electrode, and the oxide semiconductor film. A bottom contact transistor has a gate electrode over an insulating surface; a gate insulating film over the gate electrode; a source electrode and a drain electrode which are over the gate insulating film; an oxide semiconductor film which is over the source electrode and the drain electrode and which overlaps with the gate electrode over the gate insulating film; and an insulating film over the source electrode, the drain electrode, and the oxide semiconductor film.

For the heat treatment, heat treatment in a furnace or a rapid thermal annealing method (RTA method) is used. As the RTA method, a method using a lamp light source or a method in which heat treatment is performed for a short time while a substrate is moved in a heated gas can be employed. With the use of the RTA method, it is also possible to make the time necessary for heat treatment shorter than 0.1 hours. Note that in the case where a glass substrate is used as a substrate, heat treatment is performed at higher than or equal to 300° C. and less than or equal to the strain point of the glass substrate.

A method for manufacturing a semiconductor device with high reliability can be provided. In addition, a method for manufacturing a semiconductor device which can operate at high speed can be provided. Further, a highly reliable semiconductor device can be provided. In addition, a semiconductor device which can operate at high speed can be provided.

BRIEF DESCRIPTION OF DRAWINGS

FIGS. 13A and 13B are cross-sectional views illustrating a method for manufacturing a semiconductor device.

FIG. 15 is a top view illustrating a method for manufacturing a semiconductor device.

FIG. 24 is a view illustrating a structure of a liquid crystal display device module.

BEST MODE FOR CARRYING OUT THE INVENTION

Hereinafter, embodiments of the present invention will be described in detail with reference to the accompanying drawings. However, the present invention is not limited to the following description and it is easily understood by those skilled in the art that the mode and details can be changed in various ways without departing from the spirit and scope of the present invention. Accordingly, the present invention should not be construed as being limited to the description of the embodiments below.

The present invention can be applied to manufacture of any kind of semiconductor devices including microprocessors, integrated circuits such as image processing circuits, RF tags, and semiconductor display devices. A semiconductor device means any device which can function by utilizing semiconductor characteristics, and a semiconductor display device, a semiconductor circuit, and an electronic device are all included in the category of the semiconductor device. The semiconductor display devices include the following in its category: liquid crystal display devices, light-emitting devices in which a light-emitting element typified by an organic light-emitting element (OLED) is provided for each pixel, electronic paper, digital micromirror devices (DMDs), plasma display panels (PDPs), field emission displays (FEDs), and other semiconductor display devices in which a circuit element using a semiconductor film is included in a driver circuit.

Embodiment 1

A method for manufacturing a semiconductor device will be described with reference to FIGS. 1A to 1E, FIG. 2, and FIGS. 3A to 3C using a bottom gate thin film transistor having a channel etched structure as an example.

Figure 1A:
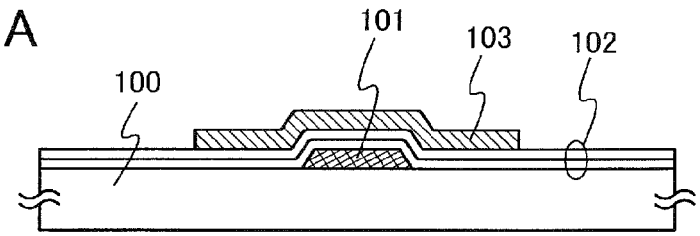
FIGS. 1A to 1E are cross-sectional views illustrating a method for manufacturing a semiconductor device.
Figure 1B:
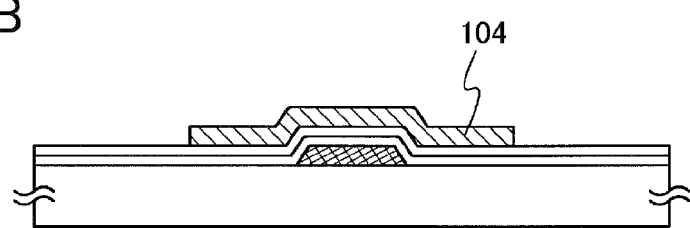

As illustrated in FIG. 1A, a gate electrode 101 is formed over a substrate 100.

An insulating film to serve as a base film may be formed between the substrate 100 and the gate electrode 101. As the base film, for example, a single layer of a silicon oxide film, a silicon oxynitride film, a silicon nitride film, a silicon nitride oxide film, an aluminum nitride film, or an aluminum nitride oxide film or a stacked layer of a plurality of these films can be used. In particular, an insulating film having a high barrier property, for example, a silicon nitride film, a silicon nitride oxide film, an aluminum nitride film, or an aluminum nitride oxide film is used for the base film, so that impurities in an atmosphere, such as moisture or hydrogen, or impurities included in the substrate 100, such as an alkali metal or a heavy metal, can be prevented from entering the oxide semiconductor film, the gate insulating film or at the interface between the oxide semiconductor film and another insulating film and the vicinity thereof.

In this specification, oxynitride refers to a substance which includes more oxygen than nitrogen, and nitride oxide refers to a substance which includes more nitrogen than oxygen.

The gate electrode 101 can be formed with a single layer or a stacked layer using one or more of conductive films using a metal material such as molybdenum, titanium, chromium, tantalum, tungsten, neodymium, or scandium; an alloy material which includes any of these metal materials as a main component; or a nitride of any of these metals. Note that aluminum or copper can be used as the metal material as long as aluminum or copper can withstand temperature of heat treatment to be performed in a later process. Aluminum or copper is preferably combined with a refractory metal material so as to prevent a heat resistance problem and a corrosive problem. As the refractory metal material, molybdenum, titanium, chromium, tantalum, tungsten, neodymium, scandium, or the like can be used.

For example, as a two-layer structure of the gate electrode 101, the following structures are preferable: a two-layer structure in which a molybdenum film is stacked over an aluminum film, a two-layer structure in which a molybdenum film is stacked over a copper film, a two-layer structure in which a titanium nitride film or a tantalum nitride film is stacked over a copper film, and a two-layer structure in which a titanium nitride film and a molybdenum film are stacked. As a three-layer structure of the gate electrode 101, the following structure is preferable: a stacked structure containing an aluminum film, an alloy film of aluminum and silicon, an alloy film of aluminum and titanium, or an alloy film of aluminum and neodymium in a middle layer and any of a tungsten film, a tungsten nitride film, a titanium nitride film, and a titanium film in a top layer and a bottom layer.

Further, a light-transmitting oxide conductive film of indium oxide, an alloy of indium oxide and tin oxide, an alloy of indium oxide and zinc oxide, zinc oxide, aluminum zinc oxide, aluminum zinc oxynitride, gallium zinc oxide, or the like is used as the gate electrode 101, so that the aperture ratio of a pixel portion can be increased.

The thickness of the gate electrode 101 is 10 nm to 400 nm, preferably 100 nm to 200 nm. In this embodiment, after the conductive film for the gate electrode is formed to have a thickness of 150 nm formed with a sputtering method using a tungsten target, the conductive film is processed (patterned) into a desired shape by etching, whereby the gate electrode 101 is formed.

Next, a gate insulating film 102 is formed over the gate electrode 101. The gate insulating film 102 can be formed to have a single layer of a silicon oxide film, a silicon nitride film, a silicon oxynitride film, a silicon nitride oxide film, an aluminum oxide film, or a tantalum oxide film, or a stacked layer thereof with a plasma enhanced CVD method, a sputtering method, or the like. It is preferable that the gate insulating film 102 include impurities such as moisture or hydrogen as little as possible. The gate insulating film 102 may have a structure in which an insulating film formed using a material having a high barrier property and an insulating film having lower proportion of nitrogen such as a silicon oxide film or a silicon oxynitride film are stacked. In this case, the insulating film such as a silicon oxide film or a silicon oxynitride film is formed between the insulating film having a barrier property and the oxide semiconductor film. As the insulating film having a high barrier property, a silicon nitride film, a silicon nitride oxide film, an aluminum nitride film, an aluminum nitride oxide film, or the like can be given, for example. The insulating film having a barrier property is used, so that impurities in an atmosphere, such as moisture or hydrogen, or impurities included in the substrate, such as an alkali metal or a heavy metal, can be prevented from entering the oxide semiconductor film, the gate insulating film 102, or at the interface between the oxide semiconductor film and another insulating film and the vicinity thereof. In addition, the insulating film having lower proportion of nitrogen such as a silicon oxide film or a silicon oxynitride film is formed so as to be in contact with the oxide semiconductor film, so that the insulating film formed using a material having a high barrier property can be prevented from being in contact with the oxide semiconductor film directly.

In this embodiment, the gate insulating film 102 having a structure in which a silicon oxide film having a thickness of 100 nm formed with a sputtering method is stacked over a silicon nitride film having a thickness of 50 nm formed with a sputtering method is formed.

Next, an oxide semiconductor film is formed over the gate insulating film 102. The oxide semiconductor film is formed with a sputtering method using an oxide semiconductor as a target. Moreover, the oxide semiconductor film can be formed with a sputtering method in a rare gas (for example, argon) atmosphere, an oxygen atmosphere, or an atmosphere including a rare gas (for example, argon) and oxygen.

Note that before the oxide semiconductor film is formed with a sputtering method, dust attached to a surface of the gate insulating film 102 is preferably removed by reverse sputtering in which an argon gas is introduced and plasma is generated. The reverse sputtering refers to a method in which, without application of voltage to a target side, an RF power supply is used for application of voltage to a substrate side in an argon atmosphere and plasma is generated in the vicinity of the substrate to modify a surface. Note that instead of an argon atmosphere, a nitrogen atmosphere, a helium atmosphere, or the like may be used. Alternatively, an argon atmosphere to which oxygen, nitrous oxide, or the like is added may be used. Alternatively, an argon atmosphere to which chlorine, carbon tetrafluoride, or the like is added may be used.

For the oxide semiconductor film, the above-described oxide semiconductor can be used.

The thickness of the oxide semiconductor film is set to 10 nm to 300 nm, preferably, 20 nm to 100 nm. In this embodiment, as the oxide semiconductor film, an In—Ga—Zn—O-based oxide semiconductor film with a thickness of 30 nm, which is obtained with a sputtering method using an oxide semiconductor target including indium (In), gallium (Ga), and zinc (Zn) ($In_2O_3$:$Ga_2O_3$:ZnO=1:1:1 or 1:1:2 in a molar ratio), is used. In this embodiment, a DC sputtering method is employed, a flow rate of argon is 30 sccm, a flow rate of oxygen is 15 sccm, and a substrate temperature is a room temperature.

The gate insulating film 102 and the oxide semiconductor film may be formed successively without exposure to air. Successive film formation without exposure to air makes it possible to obtain each interface between stacked layers, which is not contaminated by atmospheric components or impurity elements floating in air, such as water, hydrocarbon, or the like. Therefore, variation in characteristics of the thin film transistor can be reduced.

Next, as illustrated in FIG. 1A, the oxide semiconductor film is processed (patterned) into a desired shape by etching or the like, whereby an island-shaped oxide semiconductor film 103 is formed over the gate insulating film 102 in a position where the island-shaped oxide semiconductor film 103 overlaps with the gate electrode 101.

Next, in an inert gas atmosphere (nitrogen, helium, neon, argon, or the like), heat treatment may be performed on the oxide semiconductor film 103. When the heat treatment is performed on the oxide semiconductor film 103, an oxide semiconductor film 104 in which moisture or hydrogen is eliminated is formed. Specifically, in a reduced atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb in the case where measurement is performed using a dew-point meter of a cavity ring-down laser spectroscopy (CRDS) system), rapid thermal annealing (RTA) treatment can be performed at a temperature of higher than or equal to 500° C. and lower than or equal to 750° C. (or lower than or equal to a strain point of a glass substrate) for approximately greater than or equal to one minute and less than or equal to ten minutes, preferably, at 600° C. for approximately greater than or equal to three minutes and less than or equal to six minutes. With an RTA method, dehydration or dehydrogenation can be performed in a short time; therefore, treatment can be performed even at a temperature higher than the strain point of the glass substrate. Note that the heat treatment is not necessarily performed after the island-shaped oxide semiconductor film 103 is formed, and the heat treatment may be performed on the oxide semiconductor film before the island-shaped oxide semiconductor film 103 is formed. The heat treatment may be performed more than once after the oxide semiconductor film 104 is formed. Impurities such as moisture or hydrogen are eliminated by the heat treatment, so that the island-shaped oxide semiconductor film 104 becomes an intrinsic (i-type) semiconductor or a substantially i-type semiconductor; therefore, deterioration of characteristics of the transistor due to the impurities, such as shifts in threshold voltage, can be prevented from being promoted and off-state current can be reduced.

In this embodiment, heat treatment is performed in a nitrogen atmosphere at 600° C. for six minutes in a state where the substrate temperature reaches the set temperature. Further, a heating method using an electric furnace, a rapid heating method such as a gas rapid thermal annealing (GRTA) method using a heated gas or a lamp rapid thermal annealing (LRTA) method using lamp light, or the like can be used for the heat treatment. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that it is preferable that in the heat treatment, moisture, hydrogen, or the like be not contained in nitrogen or a rare gas such as helium, neon, or argon. Alternatively, it is preferable that the purity of nitrogen or the rare gas such as helium, neon, or argon which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Figure 1C:
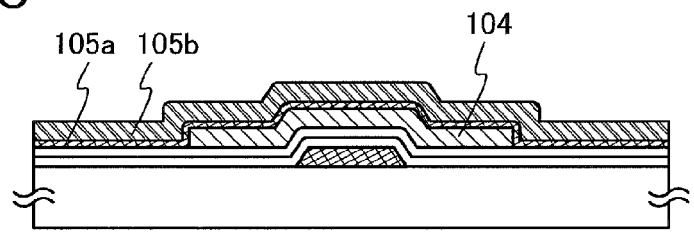

Next, as illustrated in FIG. 1C, a conductive film used for a source electrode and a drain electrode is formed over the island-shaped oxide semiconductor film 104. In this embodiment, a conductive film 105*b* formed using a low electronegativity metal, a low electronegativity metal compound, or a low electronegativity alloy is formed over a conductive film 105*a* formed using a metal material which has low contact resistance to the oxide semiconductor film 104, such as titanium, tungsten, or molybdenum.

As the low electronegativity metal, aluminum or magnesium can also be used. A mixture, a metal compound, or an alloy each including one or more of the above metals can be used for the conductive film 105b. When a low heat-resistance material such as aluminum is used, aluminum is combined with a heat-resistant conductive material such as an element selected from titanium, tantalum, tungsten, molybdenum, chromium, neodymium, or scandium; an alloy containing one or more of these elements as its component; or nitride containing the element as its component, so that heat resistance of the conductive film 105b may be increased.

The thickness of the conductive film 105a is preferably 10 nm to 200 nm, more preferably, 50 nm to 150 nm. The thickness of the conductive film 105b is preferably 100 nm to 300 nm, more preferably, 150 nm to 250 nm. In this embodiment, a titanium film having a thickness of 100 nm formed with a sputtering method is used as the conductive film 105a, and an aluminum film having a thickness of 200 nm formed with a sputtering method is used as the conductive film 105b.

In one embodiment of the present invention, the conductive film 105b is formed using a low electronegativity metal, a low electronegativity metal compound, or a low electronegativity alloy, so that impurities such as moisture or hydrogen existing in the oxide semiconductor film 104, the gate insulating film 102, or at an interface between the oxide semiconductor film 104 and another insulating film and the vicinity thereof are occluded or adsorbed by the conductive film 105b. Therefore, by elimination of impurities such as moisture or hydrogen, the oxide semiconductor film 104 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

In addition to above structure, the exposed conductive film 105b is subjected to heat treatment in a reduced atmosphere, or an inert gas atmosphere such as a nitrogen atmosphere or a rare gas (argon, helium, or the like) atmosphere, so that moisture, oxygen, or the like adsorbed on the surface of or inside the conductive film 105b may be removed. The temperature range of the heat treatment is 200° C. to 450° C. The heat treatment is performed, so that impurities such as moisture or hydrogen existing in the oxide semiconductor film 104, the gate insulating film 102 or at the interface between the oxide semiconductor film 104 and another insulating film and the vicinity thereof can be easily occluded or adsorbed by the conductive film 105b.

Figure 1D:
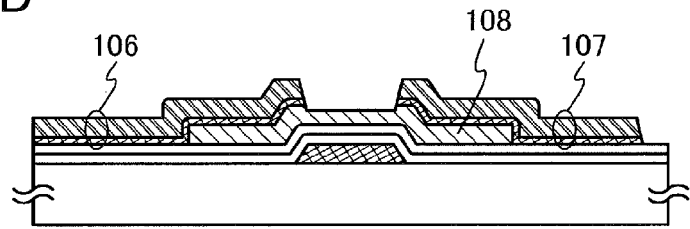

Next, as illustrated in FIG. 1D, the conductive film 105a and the conductive film 105b are processed (patterned) into desired shapes by etching or the like, whereby a source electrode 106 and a drain electrode 107 are formed. For example, when a titanium film is used for the conductive film 105a and an aluminum film is used for the conductive film 105b, after wet etching is performed on the conductive film 105b using a solution containing phosphoric acid, wet etching may be performed on the conductive film 105a using a solution (ammonia peroxide mixture) containing ammonia and oxygenated water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, a solution in which oxygenated water of 31 wt %, ammonia water of 28 wt %, and water are mixed at a volume ratio of 5:2:2 is used.

Alternatively, dry etching may be performed on the conductive film 105a and the conductive film 105b using a gas containing chlorine ($Cl_2$), boron chloride ($BCl_3$), or the like.

When the source electrode 106 and the drain electrode 107 are formed by the patterning, part of an exposed portion of the island-shaped oxide semiconductor film 104 is etched, so that a groove (a depressed portion) is formed in some cases. In this embodiment, the case in which an island-shaped oxide semiconductor film 108 having a groove (a depressed portion) is formed by the etching is described. The conductive film 105a serving as part of the source electrode 106 and the drain electrode 107 is in contact with the oxide semiconductor film 108. In addition, since the conductive film 105a is formed using a metal material having low contact resistance to the oxide semiconductor film 108 as described above, contact resistance between the source electrode 106 or the drain electrode 107 and the oxide semiconductor film 108 is reduced. Accordingly, on-state current and field-effect mobility of a TFT can be increased.

Figure 1E:
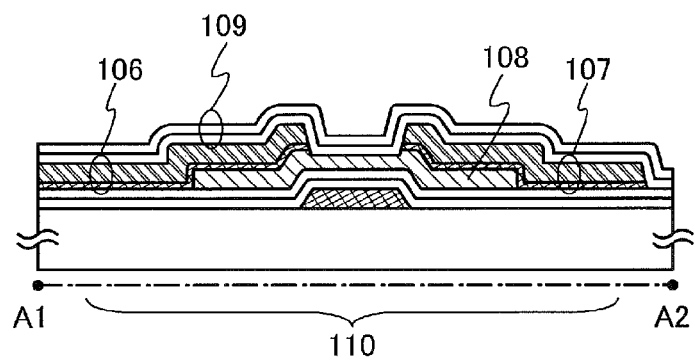

Note that as illustrated in FIG. 1E, after the source electrode 106 and the drain electrode 107 are formed, an insulating film 109 is formed so as to cover the source electrode 106, the drain electrode 107, and the oxide semiconductor film 108. The insulating film 109 preferably includes impurities such as moisture or hydrogen as little as possible, and the insulating film 109 may be formed using a single-layer insulating film or a plurality of insulating films stacked. A material having a high barrier property is preferably used for the insulating film 109. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a barrier property, such as a silicon oxide film or a silicon oxynitride film, is formed on the side close to the oxide semiconductor film 108. Then, the insulating film having a barrier property is formed so as to overlap with the source electrode 106, the drain electrode 107, and the oxide semiconductor film 108 with the insulating film having lower proportion of nitrogen between the insulating film having a barrier property and the source electrode 106, the drain electrode 107, and the oxide semiconductor film 108. When the insulating film having a barrier property is used, moisture or oxygen can be prevented from being adsorbed on the surfaces of or inside the source electrode 106 and the drain electrode 107. In addition, the impurities such as moisture or hydrogen can be prevented from entering the oxide semiconductor film 108, the gate insulating film 102, or at the interface between the oxide semiconductor film 108 and another insulating film and the vicinity thereof. In addition, the insulating film having lower proportion of nitrogen such as a silicon oxide film or a silicon oxynitride film is formed so as to be in contact with the oxide semiconductor film 108, so that the insulating film formed using a material having a high barrier property can be prevented from being in contact with the oxide semiconductor film directly.

In this embodiment, the insulating film 109 having a structure in which a silicon nitride film having a thickness of 100 nm formed with a sputtering method is stacked over a silicon oxide film having a thickness of 200 nm formed with a sputtering method is formed. The substrate temperature in film formation may be higher than or equal to room temperature and lower than or equal to 300° C. and in this embodiment, is 100° C.

An exposed region of the oxide semiconductor film 108 provided between the source electrode 106 and the drain electrode 107 and the silicon oxide film which forms the insulating film 109 are provided in contact with each other, so that oxygen is supplied to the region of the oxide semiconductor film 108, which is in contact with the insulating film 109, and resistance of the region is increased (carrier concentration is decreased, preferably, less than $1 \times 10^{18}/cm^3$), whereby the oxide semiconductor film 108 having a channel formation region with high resistance can be formed.

Note that after the insulating film 109 is formed, heat treatment may be performed. The heat treatment is preferably performed at higher than or equal to 200° C. and lower than or equal to 400° C., for example, higher than or equal to 250° C. and lower than or equal to 350° C. in an air atmosphere, a reduced atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb in the case where measurement is performed using a dew-point meter of a cavity ring-down laser spectroscopy (CRDS) system). For example, the heat treatment is performed at 250° C. for one hour in a nitrogen atmosphere in this embodiment. Alternatively, before the conductive film 105a and the conductive film 105b are formed, RTA treatment at high temperature for a short time may be performed in a manner similar to that of the heat treatment performed on the oxide semiconductor film. By the heat treatment, the oxide semiconductor film 108 is heated while being in contact with the silicon oxide film which forms the insulating film 109. In addition, the resistance of the oxide semiconductor film 108 is increased. Accordingly, electric characteristics of the transistor can be improved and variation in the electric characteristics thereof can be reduced. There is no particular limitation on when to perform this heat treatment as long as it is performed after the formation of the insulating film 109. When this heat treatment also serves as heat treatment in another step, for example, heat treatment in formation of a resin film or heat treatment for reducing resistance of a transparent conductive film, the number of steps can be prevented from increasing.

Figure 2:
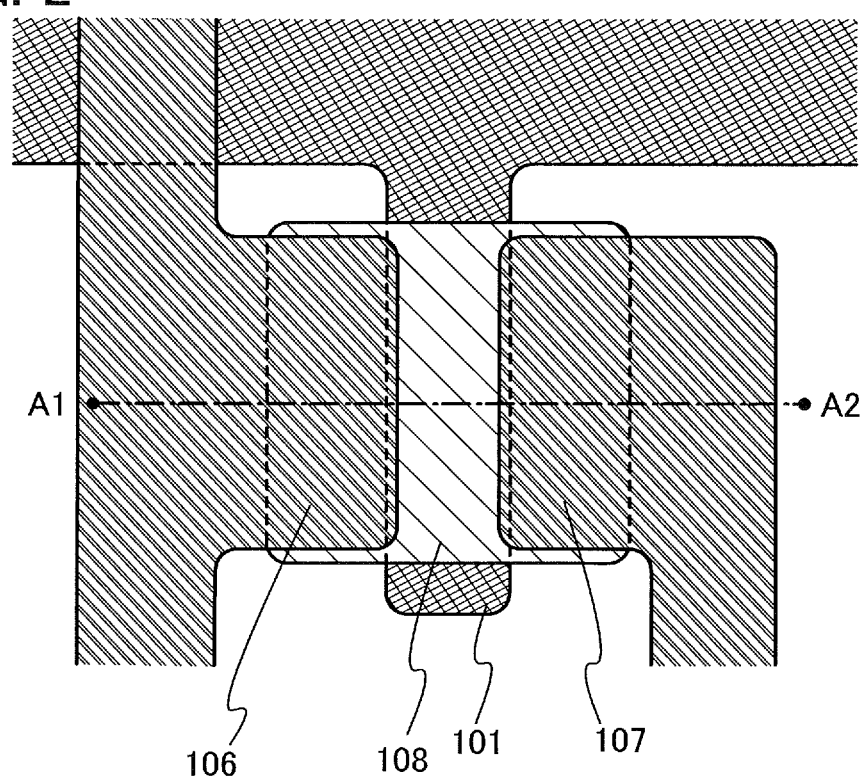
FIG. 2 is a top view of a thin film transistor.

FIG. 2 is a top view of the semiconductor device illustrated in FIG. 1E. FIG. 1E is a cross-sectional view taken along dashed line A1-A2 in FIG. 2.

A transistor 110 has the gate electrode 101; the gate insulating film 102 over the gate electrode 101; the oxide semiconductor film 108 over the gate insulating film 102; the source electrode 106 and the drain electrode 107 over the oxide semiconductor film 108; and the insulating film 109 over the source electrode 106, the drain electrode 107, and the oxide semiconductor film 108.

Figure 3A:
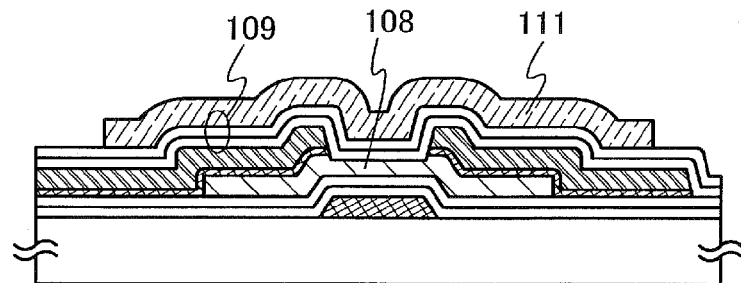
FIGS. 3A and 3B are cross-sectional views of a thin film transistor and FIG. 3C is a top view of a thin film transistor.

Next, after a conductive film is formed over the insulating film 109, the conductive film is patterned, so that a back gate electrode 111 may be formed so as to overlap with the oxide semiconductor film 108 as illustrated in FIG. 3A. The back gate electrode 111 can be formed using a material and a structure which are similar to those of the gate electrode 101 or the source electrode 106 and the drain electrode 107.

The thickness of the back gate electrode 111 is 10 nm to 400 nm, preferably 100 nm to 200 nm. In this embodiment, a conductive film in which a titanium film, an aluminum film, and a titanium film are sequentially stacked is formed. Then, a resist mask is formed by a photolithography method, an unnecessary portion is removed by etching and the conductive film is processed (patterned) into a desired shape, whereby the back gate electrode 111 is formed.

Figure 3B:
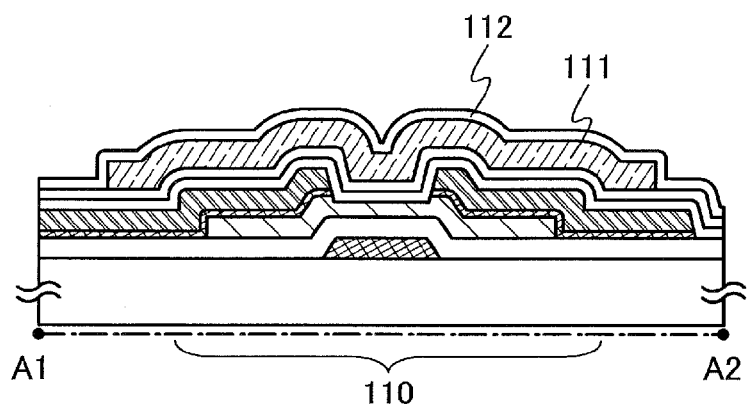

Next, as illustrated in FIG. 3B, an insulating film 112 is formed so as to cover the back gate electrode 111. The insulating film 112 is preferably formed using a material having a high barrier property which can prevent moisture, hydrogen, or the like in the atmosphere from affecting the characteristics of the transistor 110. For example, the insulating film 112 can be formed to have a single layer or a stacked layer using any of a silicon nitride film, a silicon nitride oxide film, an aluminum nitride film, an aluminum nitride oxide film, and the like as an insulating film having a high barrier property with a plasma enhanced CVD method, a sputtering method, or the like. The insulating film 112 is preferably formed to have a thickness of, for example, 15 nm to 400 nm so as to obtain an effective barrier property.

In this embodiment, an insulating film is formed to have a thickness of 300 nm with a plasma enhanced CVD method. The insulating film is formed under the following conditions: the flow rate of silane gas is 4 sccm; the flow rate of dinitrogen monoxide ($N_2O$) is 800 sccm; and the substrate temperature is 400° C.

Figure 3C:
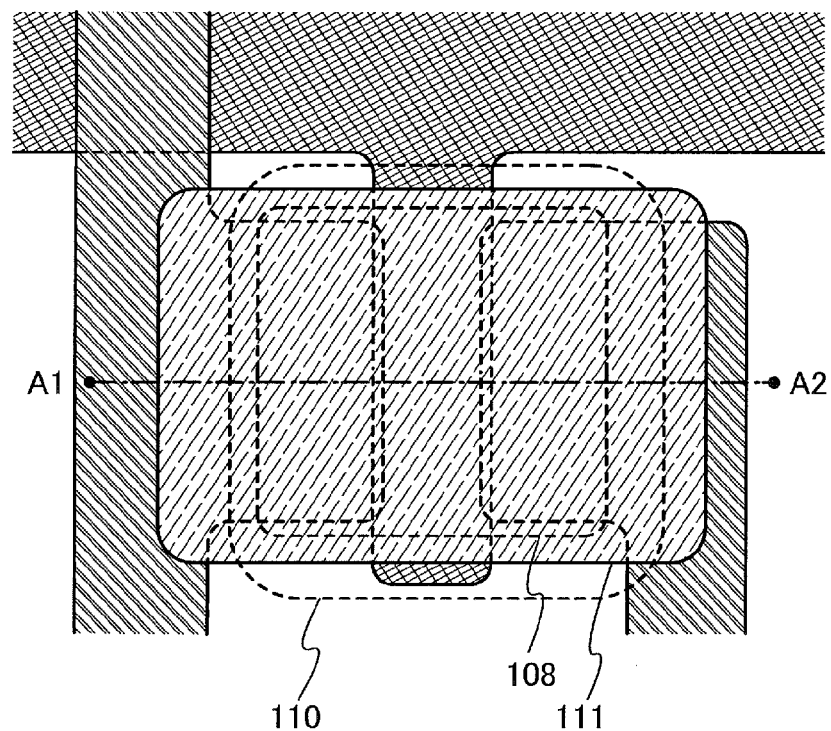

A top view of the semiconductor device illustrated in FIG. 3B is illustrated in FIG. 3C. FIG. 3B is a cross-sectional view taken along dashed line A1-A2 in FIG. 3C.

Note that in FIG. 3B, the case is illustrated in which the back gate electrode 111 covers the entire oxide semiconductor film 108; however, one embodiment of the present invention is not limited to this structure. The back gate electrode 111 may overlap with at least part of the channel formation region included in the oxide semiconductor film 108.

The back gate electrode 111 may be in a floating state, that is, electrically isolated, or a state where a potential is applied. In the latter state, to the back gate electrode 111, a potential which is the same level as the gate electrode 101 may be applied, or a fixed potential such as ground may be applied. The level of the potential applied to the back gate electrode 111 is controlled, so that the threshold voltage of the transistor 110 can be controlled.

As in this embodiment, how characteristics of the transistor are influenced by high purification of the oxide semiconductor film by removal of impurities such as hydrogen, water, or the like contained in the oxide semiconductor film as much as possible will be described.

Figure 27:
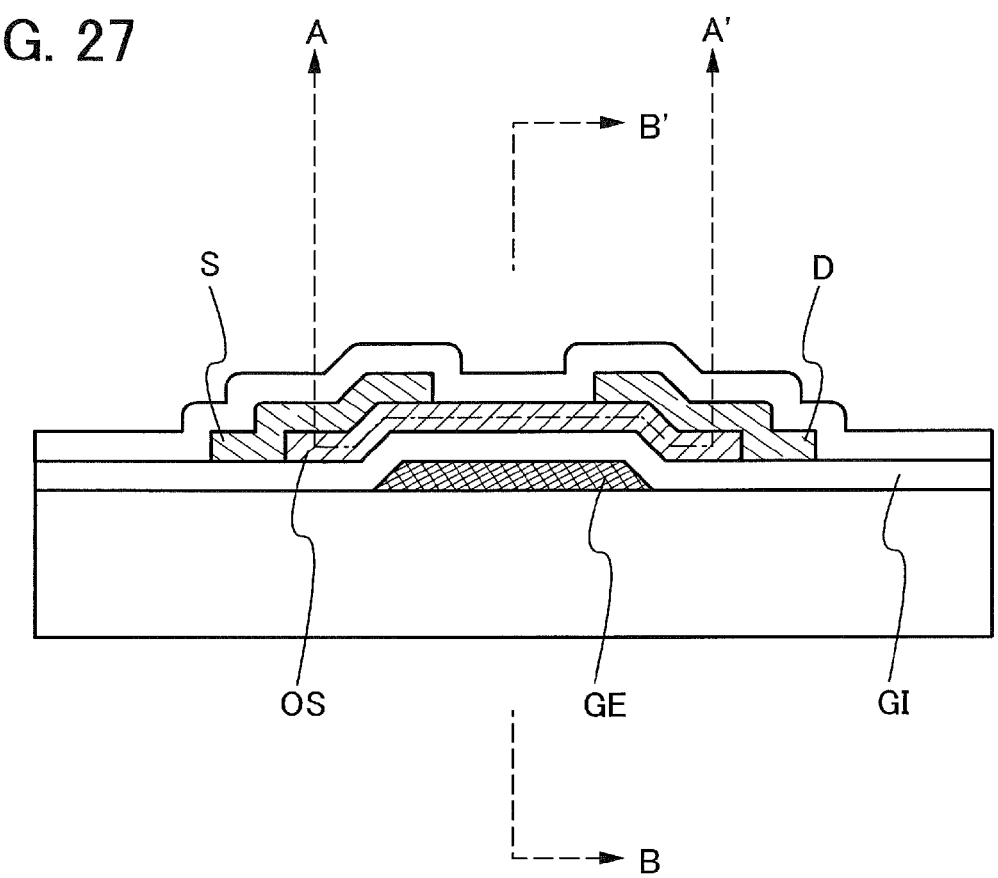
FIG. 27 is a cross-sectional view of an inverted staggered thin film transistor formed using an oxide semiconductor.

FIG. 27 is a cross-sectional view of an inverted staggered thin film transistor formed using an oxide semiconductor. An oxide semiconductor film (OS) is provided over a gate electrode (GE) with a gate insulating film (GI) therebetween, and a source electrode (S) and a drain electrode (D) are provided thereover.

Figure 28A:
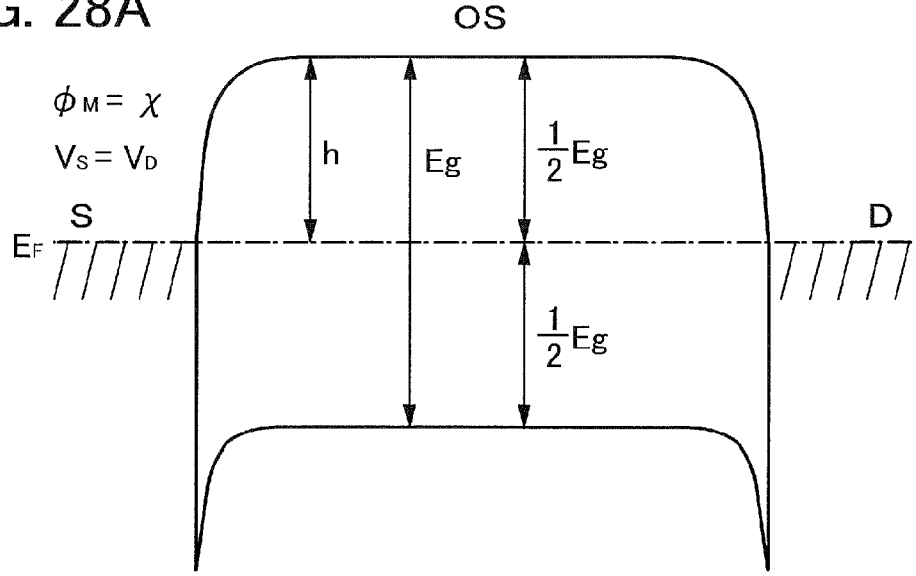
FIGS. 28A and 28B are energy band diagrams (schematic diagrams) of a cross-section taken along line A-A' in FIG. 27.
Figure 28B:
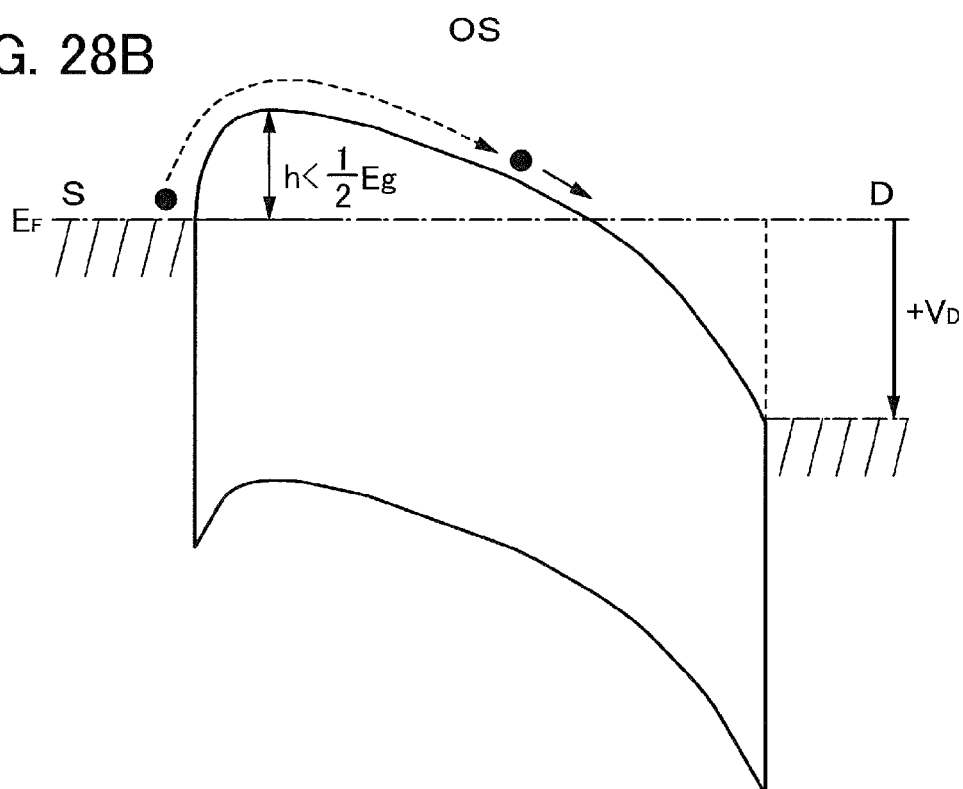

FIGS. 28A and 28B are energy band diagrams (schematic diagrams) of a cross-section taken along line A-A' in FIG. 27. FIG. 28A illustrates the case where voltages of the source electrode and the drain electrode are equal to each other (VD=0 V), and FIG. 28B illustrates the case where a positive potential (VD>0) is applied to the drain electrode with respect to the source electrode.

Figure 29A:
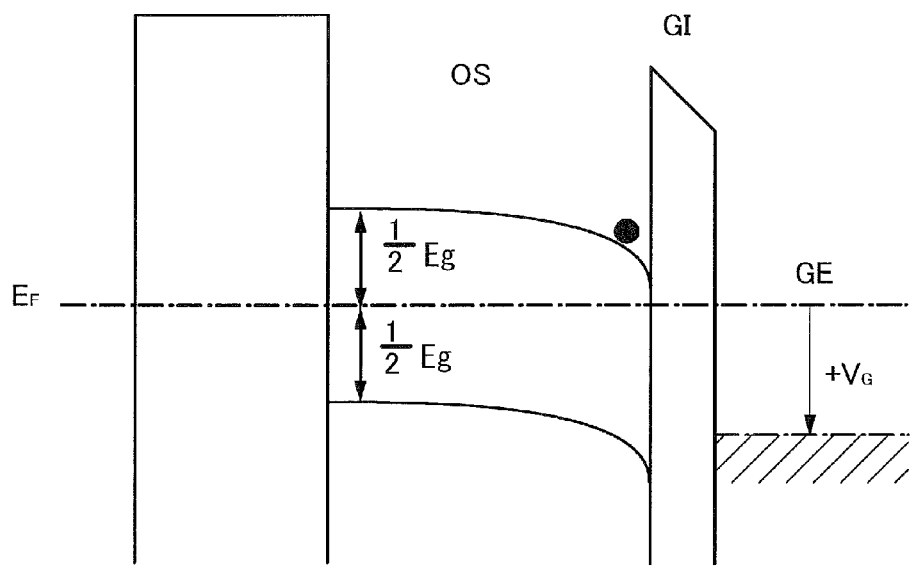
FIG. 29A is a view illustrating a state where a positive potential (+VG) is applied to a gate (GI)
Figure 29B:
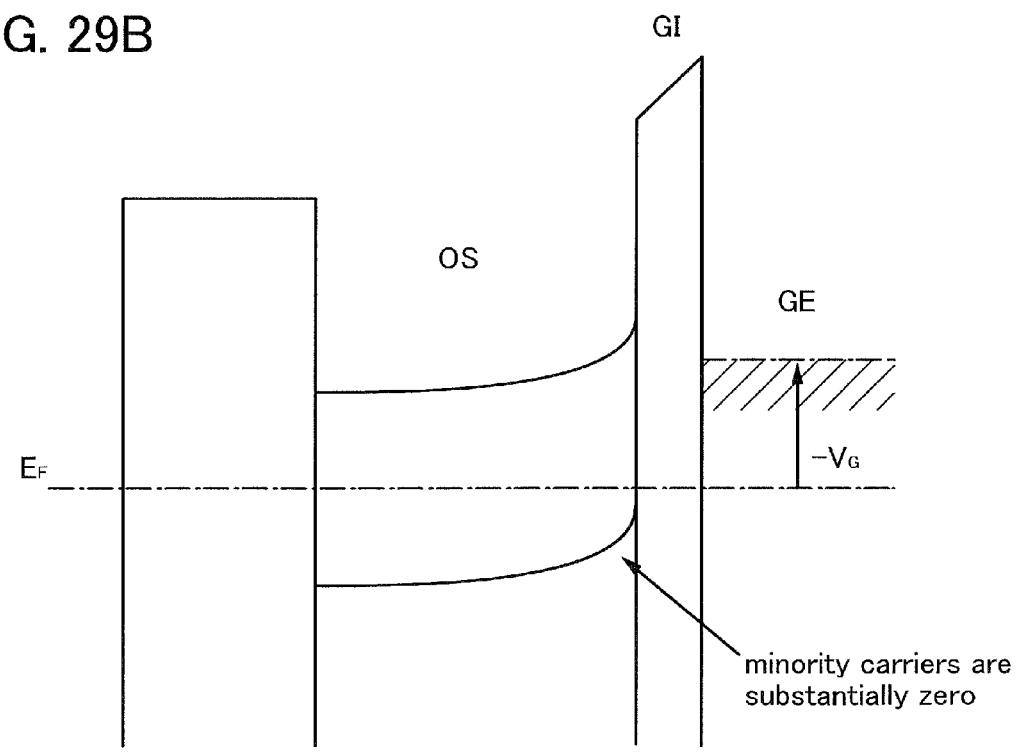
FIG. 29B is a view illustrating a state where a negative potential (−VG) is applied to the gate (GI).

FIGS. 29A and 29B are energy band diagrams (schematic diagrams) of a cross-section taken along line B-B' in FIG. 27. FIG. 29A illustrates a state where a positive potential (+VG) is applied to a gate electrode (GE) and an on state where carriers (electrons) flow between the source electrode and the drain electrode. FIG. 29B illustrates a state where a negative potential (−VG) is applied to the gate electrode (GE) and an off state (a minority carrier does not flow).

Figure 30:
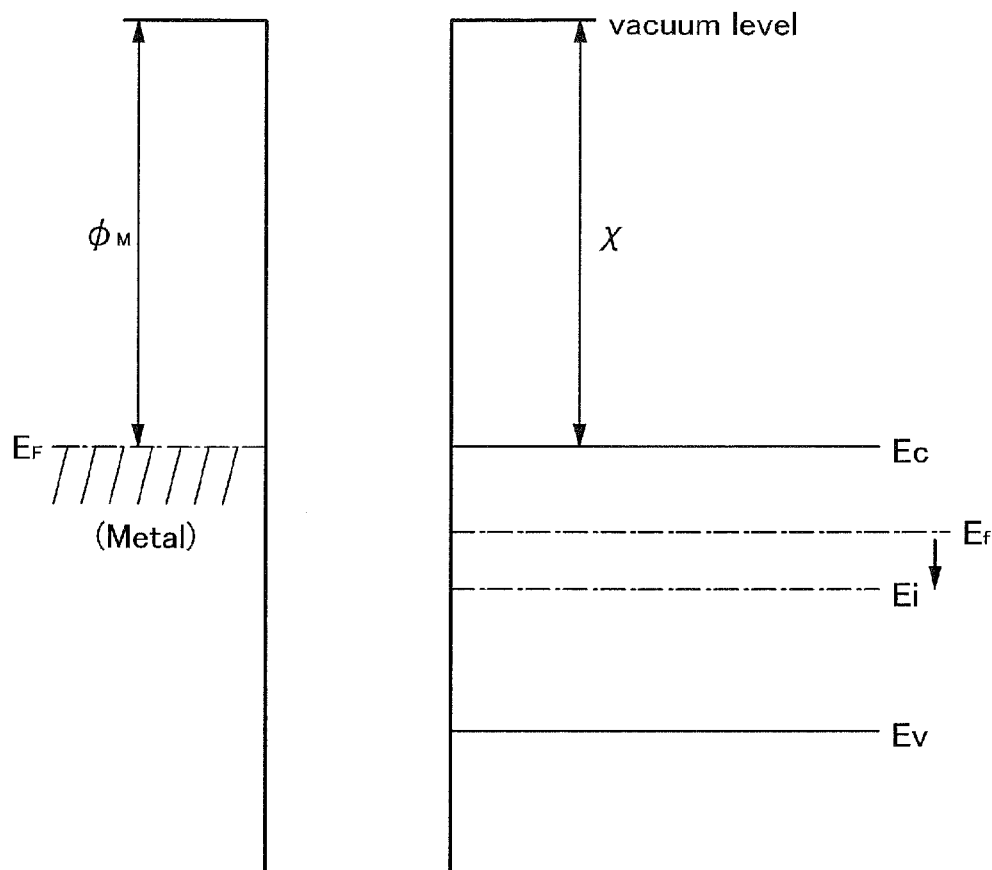
FIG. 30 is a view illustrating a relation among a vacuum level, a work function ($\varphi_M$) of a metal and an electron affinity ($\chi$) of an oxide semiconductor.

FIG. 30 illustrates a relation among a vacuum level, a work function ($\varphi_M$) of a metal and an electron affinity ($\chi$) of an oxide semiconductor.

Since a metal degenerates, a Fermi level ($E_F$) is located in a conduction band. On the other hand, in general, a conventional oxide semiconductor is an n-type semiconductor, and the Fermi level (Ef) thereof is located nearer the conduction band (Ec) away from an intrinsic Fermi level (Ei) which is located in the center of the band gap. Note that it is known that hydrogen in the oxide semiconductor is a donor and one of factors that makes the oxide semiconductor an n-type semiconductor.

On the other hand, according to one embodiment of the present invention, when a metal whose electronegativity is lower than hydrogen is used for the conductive film for the source electrode or the drain electrode, hydrogen which is an n-type impurity is removed from the oxide semiconductor and the oxide semiconductor is highly purified so that impurities except a main component of the oxide semiconductor are included as little as possible in order that the oxide semiconductor may be made to be an intrinsic (i-type) semiconductor. That is, the oxide semiconductor becomes an i-type semiconductor not by addition of impurities but by removal of impurities such as hydrogen or water as much as possible to have high purity, so that an oxide semiconductor which is an intrinsic (i-type) semiconductor or is a substantially intrinsic (i-type) semiconductor is obtained. With the above structure, the Fermi level (Ef) can be substantially close to the same level as the intrinsic Fermi level (Ei), as indicated by arrows.

In general, the band gap (Eg) of the oxide semiconductor is 3.15 eV, electron affinity ($\chi$) is 4.3 eV. The work function of titanium (Ti), by which the source electrode and the drain electrode are formed, is approximately equal to the electron affinity ($\chi$) of the oxide semiconductor. In this case, at the interface between a metal and the oxide semiconductor, a Schottky barrier for electrons is not formed.

That is, in the case where the work function ($\varphi_M$) of a metal is equal to the electron affinity ($\chi$) of the oxide semiconductor, an energy band diagram (schematic diagram) is shown as illustrated in FIG. 28A when the oxide semiconductor and the source electrode or the drain electrode are in contact with each other.

In FIG. 28B, a black dot (•) indicates an electron, and when a positive potential is applied to the drain electrode, the electron which crosses a barrier (h) is injected in the oxide semiconductor, and flows toward the drain electrode. In this case, the height of the barrier (h) is changed depending on gate voltage and drain voltage. When positive drain voltage is applied, the height (h) of the barrier is smaller than the height of the barrier of FIG. 28A without application of voltage, that is ½ of the band gap (Eg).

At this time, the electron moves in the bottom, which is energetically stable, on the oxide semiconductor side at the interface between the gate insulating film and the highly purified oxide semiconductor as illustrated in FIG. 29A.

In FIG. 29B, when a negative potential (reverse bias) is applied to the gate electrode (GE), holes which are minority carriers are substantially zero; therefore, current is substantially close to zero.

For example, even when the channel width W of a thin film transistor is $1\times10^4$ μm and the channel length thereof is 3 μm, an off-state current of less than or equal to $10^{-13}$ A and a subthreshold swing (S value) of 0.1 V/dec. (gate insulating film having a thickness of 100 nm) can be obtained.

In this manner, the oxide semiconductor film is highly purified so that impurities such as water or hydrogen except a main component of the oxide semiconductor are contained as little as possible, whereby the operation of the thin film transistor can be favorable.

Embodiment 2

A method for manufacturing a semiconductor device will be described with reference to FIGS. 4A to 4D using a bottom gate thin film transistor having a channel etched structure as an example.

Figure 4A:
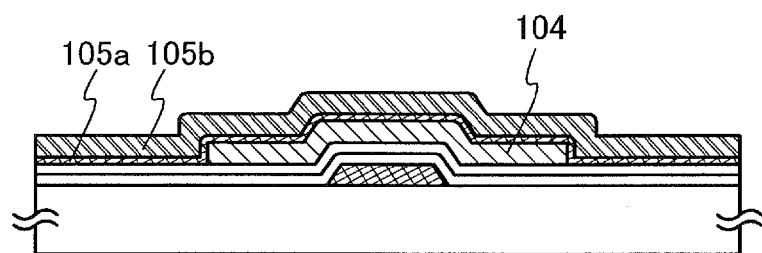
FIGS. 4A to 4D are cross-sectional views illustrating a method for manufacturing a semiconductor device.

First, as illustrated in FIG. 4A, in accordance with the manufacturing method described in Embodiment 1, over the island-shaped oxide semiconductor film 104, the conductive film 105a is formed using a metal material which has low contact resistance to the oxide semiconductor film 104, such as titanium, tungsten, or molybdenum, and thereover, the conductive film 105b is formed using a low electronegativity metal, a low electronegativity metal compound, or a low electronegativity alloy. Since the kind of material, the structure, and the range of the thickness of the conductive film 105a and the conductive film 105b are already described in Embodiment 1, description is omitted here. In this embodiment, a titanium film having a thickness of 100 nm formed with a sputtering method is used as the conductive film 105a, and an aluminum film having a thickness of 200 nm formed with a sputtering method is used as the conductive film 105b.

After the conductive film 105a and the conductive film 105b are formed, the exposed conductive film 105b may be subjected to heat treatment in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1.

Figure 4B:
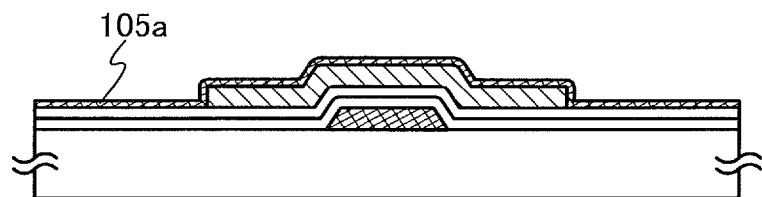

Next, as illustrated in FIG. 4B, the conductive film 105b is removed by etching or the like. The etching is preferably wet etching so as to prevent the conductive film 105a from being etched. Specifically, in this embodiment, since the aluminum film is used for the conductive film 105b, wet etching is performed using the solution containing phosphoric acid, for example, an Al-Etchant (an aqueous solution containing nitric acid of 2.0 wt %, acetic acid of 9.8 wt %, and phosphoric acid of 72.3 wt %) produced by Wako Pure Chemical Industries Co., Ltd, whereby the conductive film 105b is removed. Note that when the conductive film 105b is removed using dry etching, a gas containing chlorine ($Cl_2$), boron chloride ($BCl_3$), or the like may be used. Note that in the case where dry etching is performed, since there is no difference in selectivity between the conductive film 105a which is the titanium film and the conductive film 105b which is the aluminum film, the time of dry etching may be controlled at the time of etching so that the conductive film 105a may remain.

Impurities such as moisture or hydrogen existing in the oxide semiconductor film 104, the gate insulating film 102, or at the interface between the oxide semiconductor film 104 and another insulating film and the vicinity thereof can be occluded or adsorbed by the conductive film 105b. Therefore, the conductive film 105b is removed, so that the impurities such as moisture or hydrogen occluded or adsorbed by the conductive film 105b can also be removed.

Figure 4C:
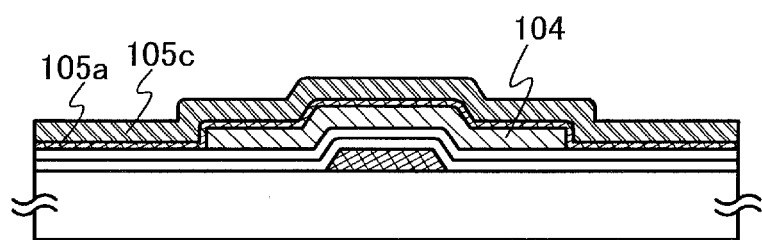

Next, as illustrated in FIG. 4C, a conductive film 105c is formed using a low electronegativity metal, a low electronegativity metal compound, or a low electronegativity alloy over the conductive film 105a. The kind of material and the range of the thickness of the conductive film 105c are the same as those of the conductive film 105b. In this embodiment, an aluminum film having a thickness of 200 nm formed with a sputtering method is used as the conductive film 105c.

In one embodiment of the present invention, after the conductive film 105b is removed, the conductive film 105c is formed using a low electronegativity metal, a low electronegativity metal compound, or a low electronegativity alloy. The conductive film 105c easily occludes or adsorbs impurities such as moisture or hydrogen, as compared to the conductive film 105b which has already occluded or adsorbed impurities. Therefore, the impurities existing in the oxide semiconductor film 104, the gate insulating film 102, or at the interface between the oxide semiconductor film 104 and another insulating film and the vicinity thereof can be further reduced, as compared to the case of Embodiment 1. Therefore, by elimination of impurities such as moisture or hydrogen, the oxide semiconductor film 104 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

After the conductive film 105c is formed, the exposed conductive film 105c may be subjected to heat treatment again in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1. The heat treatment is performed, so that impurities such as moisture or hydrogen existing in the oxide semiconductor film 104, the gate insulating film 102, or at the interface between the oxide semiconductor film 104 and another insulating film and the vicinity thereof can be easily occluded or adsorbed by the conductive film 105c.

Figure 4D:
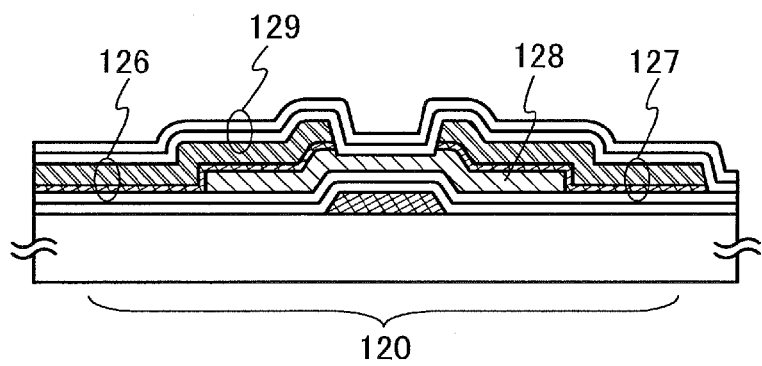

Next, as illustrated in FIG. 4D, the conductive film 105a and the conductive film 105c are processed (patterned) into desired shapes by etching or the like, whereby a source electrode 126 and a drain electrode 127 are formed. For example, when a titanium film is used for the conductive film 105a and an aluminum film is used for the conductive film 105c, after wet etching is performed on the conductive film 105c using a solution containing phosphoric acid, wet etching may be performed on the conductive film 105a using a solution (ammonia peroxide mixture) containing ammonia and oxygenated water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, a solution in which oxygenated water of 31 wt %, ammonia water of 28 wt %, and water are mixed at a volume ratio of 5:2:2 is used. Alternatively, dry etching may be performed on the conductive film 105a and the conductive film 105c using a gas containing chlorine ($Cl_2$), boron chloride ($BCl_3$), or the like.

When the source electrode 126 and the drain electrode 127 are formed by the patterning, part of an exposed portion of the island-shaped oxide semiconductor film 104 is etched, so that a groove (a depressed portion) is formed in some cases. In this embodiment, the case in which an island-shaped oxide semiconductor film 128 having a groove (a depressed portion) is formed by the etching is described. The conductive film 105a serving as part of the source electrode 126 and the drain electrode 127 is in contact with the oxide semiconductor film 128. In addition, since the conductive film 105a is formed using a metal material having low contact resistance to the oxide semiconductor film 128 as described above, contact resistance between the source electrode 126 or the drain electrode 127 and the oxide semiconductor film 128 is reduced. Accordingly, on-state current and field-effect mobility of the TFT can be increased.

Then, after the source electrode 126 and the drain electrode 127 are formed, an insulating film 129 is formed so as to cover the source electrode 126, the drain electrode 127, and the oxide semiconductor film 128. The kind of material, the structure, and the range of the thickness of the insulating film 129 are the same as those of the insulating film 109 described in Embodiment 1. In this embodiment, the insulating film 129 having a structure in which a silicon nitride film having a thickness of 100 nm formed with a sputtering method is stacked over a silicon oxide film having a thickness of 200 nm formed with a sputtering method is formed. The substrate temperature in film formation may be higher than or equal to room temperature and lower than or equal to 300° C. and in this embodiment, is 100° C.

An exposed region of the oxide semiconductor film 128 provided between the source electrode 126 and the drain electrode 127 and the silicon oxide film which forms the insulating film 129 are provided in contact with each other, so that resistance of the region of the oxide semiconductor film 128 which is in contact with the insulating film 129 is increased (carrier concentration is decreased, preferably, less than $1 \times 10^{18}/cm^3$), whereby the oxide semiconductor film 128 having a channel formation region with high resistance can be formed.

Note that after the insulating film 129 is formed, heat treatment may be performed. As for the condition of the heat treatment, the condition of the heat treatment which is performed after the insulating film 109 is formed in Embodiment 1 may be referred to.

A thin film transistor 120 formed in accordance with the manufacturing method has the gate electrode 101; the gate insulating film 102 over the gate electrode 101; the oxide semiconductor film 128 over the gate insulating film 102; the source electrode 126 and the drain electrode 127 over the oxide semiconductor film 128; and the insulating film 129 over the source electrode 126, the drain electrode 127, and the oxide semiconductor film 128.

Next, after a conductive film is formed over the insulating film 129, the conductive film is patterned, so that a back gate electrode may be formed so as to overlap with the oxide semiconductor film 128. Since the kind of material, the structure, and the range of the thickness of the back gate electrode are similar to those of the back gate electrode 111 described in Embodiment 1, description is omitted here.

When the back gate electrode is formed, an insulating film is formed so as to cover the back gate electrode. Since the kind of material, the structure, and the range of the thickness of the insulating film which covers the back gate electrode are similar to those of the insulating film 112 described in Embodiment 1, description is omitted here.

This embodiment can be implemented by being combined as appropriate with any of the above-described embodiments.

Embodiment 3

A method for manufacturing a semiconductor device will be described with reference to FIGS. 5A to 5D using a bottom gate thin film transistor having a channel etched structure as an example.

Figure 5A:
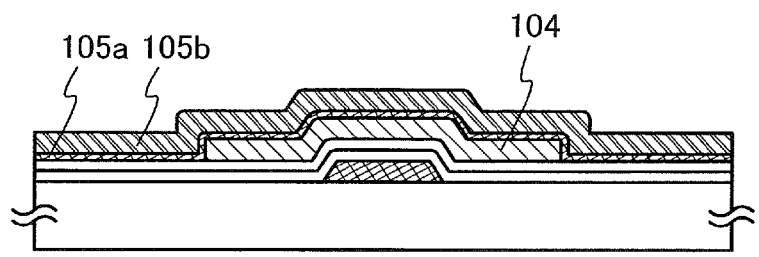
FIGS. 5A to 5D are cross-sectional views illustrating a method for manufacturing a semiconductor device.

First, as illustrated in FIG. 5A, in accordance with the manufacturing method described in Embodiment 1, over the island-shaped oxide semiconductor film 104, the conductive film 105a is formed using a metal material which has low contact resistance to the oxide semiconductor film 104, such as titanium, tungsten, or molybdenum, and thereover, the conductive film 105b is formed using a low electronegativity metal, a low electronegativity metal compound, or a low electronegativity alloy. Since the kind of material, the structure, and the range of the thickness of the conductive film 105a and the conductive film 105b are already described in Embodiment 1, description is omitted here. In this embodiment, a titanium film having a thickness of 100 nm formed with a sputtering method is used as the conductive film 105a, and an aluminum film having a thickness of 200 nm formed with a sputtering method is used as the conductive film 105b.

After the conductive film 105a and the conductive film 105b are formed, the exposed conductive film 105b may be subjected to heat treatment in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1.

Figure 5B:
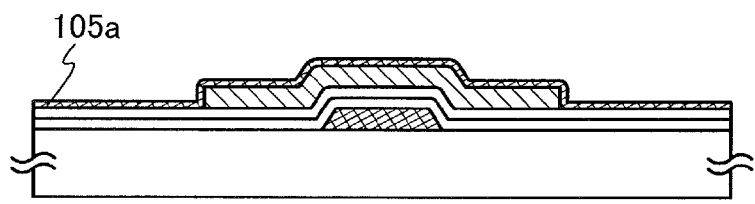

Next, as illustrated in FIG. 5B, the conductive film 105b is removed by etching or the like. The etching is preferably wet etching so as to prevent the conductive film 105a from being etched. Specifically, in this embodiment, since the aluminum film is used for the conductive film 105b, wet etching is performed using the solution containing phosphoric acid, for example, an Al-Etchant (an aqueous solution containing nitric acid of 2.0 wt %, acetic acid of 9.8 wt %, and phosphoric acid of 72.3 wt %) produced by Wako Pure Chemical Industries Co., Ltd, whereby the conductive film 105b is removed. Note that when the conductive film 105b is removed using dry etching, a gas containing chlorine ($Cl_2$), boron chloride ($BCl_3$), or the like may be used. Note that in the case where dry etching is performed, since there is no difference in selectivity between the conductive film 105a which is the titanium film and the conductive film 105b which is the aluminum film, the time of dry etching may be controlled at the time of etching so that the conductive film 105a may remain.

Impurities such as moisture or hydrogen existing in the oxide semiconductor film 104, the gate insulating film 102, or at the interface between the oxide semiconductor film 104 and another insulating film and the vicinity thereof can be occluded or adsorbed by the conductive film 105b. Therefore, the conductive film 105b is removed, so that the impurities such as moisture or hydrogen occluded or adsorbed by the conductive film 105b can also be removed.

Figure 5C:
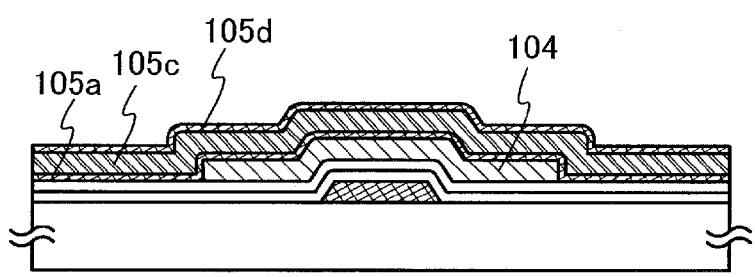

Next, as illustrated in FIG. 5C, the conductive film 105c is formed using a low electronegativity metal, a low electronegativity metal compound, or a low electronegativity alloy over the conductive film 105a and a conductive film 105d is formed using a metal material which can prevent oxidation of the conductive film 105c, such as titanium, tungsten, or molybdenum. The kind of material and the range of the thickness of the conductive film 105c are the same as those of the conductive film 105b. The thickness of the conductive film 105d is preferably 10 nm to 200 nm, more preferably, 50 nm to 150 nm. In this embodiment, an aluminum film having a thickness of 200 nm formed with a sputtering method is used as the conductive film 105c, and a titanium film having a thickness of 100 nm formed with a sputtering method is used as the conductive film 105d.

In one embodiment of the present invention, after the conductive film 105b is removed, the conductive film 105c is additionally formed using a low electronegativity metal, a low electronegativity metal compound, or a low electronegativity alloy. The conductive film 105c easily occludes or adsorbs impurities such as moisture or hydrogen, as compared to the conductive film 105b which has already occluded or adsorbed impurities. Therefore, the impurities existing in the oxide semiconductor film 104, the gate insulating film 102, or at the interface between the oxide semiconductor film 104 and another insulating film and the vicinity thereof can be further reduced, as compared to the case of Embodiment 1. Therefore, by elimination of impurities such as moisture or hydrogen, the oxide semiconductor film 104 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

After the conductive film 105d is formed, the exposed conductive film 105d may be subjected to heat treatment in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1. The heat treatment is performed, so that impurities such as moisture or hydrogen existing in the oxide semiconductor film 104, the gate insulating film 102, or at the interface between the oxide semiconductor film 104 and another insulating film and the vicinity thereof can be easily occluded or adsorbed by the conductive film 105c.

Figure 5D:
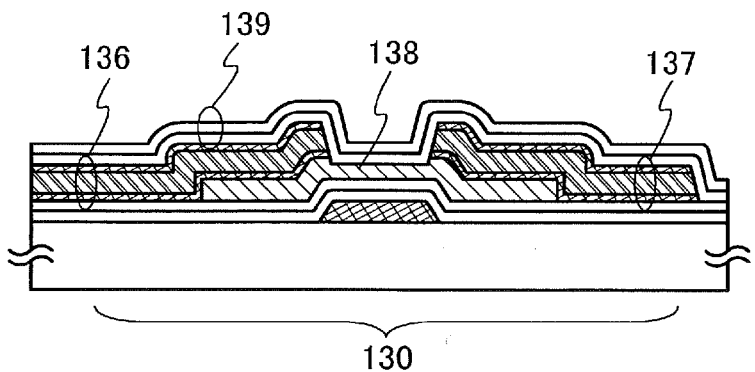

Next, as illustrated in FIG. 5D, the conductive film 105a, the conductive film 105c, and the conductive film 105d are processed (patterned) into desired shapes by etching or the like, whereby a source electrode 136 and a drain electrode 137 are formed. For example, when a titanium film is used for the conductive film 105a, an aluminum film is used for the conductive film 105c, and a titanium film is used for the conductive film 105d, after wet etching is performed on the conductive film 105d using a solution (ammonia peroxide mixture) containing ammonia and oxygenated water, wet etching may be performed on the conductive film 105c using a solution containing phosphoric acid, and then wet etching may be performed on the conductive film 105a using a solution (ammonia peroxide mixture) containing ammonia and oxygenated water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, a solution in which oxygenated water of 31 wt %, ammonia water of 28 wt %, and water are mixed at a volume ratio of 5:2:2 is used. Alternatively, dry etching may be performed on the conductive film 105a, the conductive film 105c, and the conductive film 105d using a gas containing chlorine ($Cl_2$), boron chloride ($BCl_3$), or the like.

When the source electrode 136 and the drain electrode 137 are formed by the patterning, part of an exposed portion of the island-shaped oxide semiconductor film 104 is etched, so that a groove (a depressed portion) is formed in some cases. In this embodiment, the case in which an island-shaped oxide semiconductor film 138 having a groove (a depressed portion) is formed by the etching is described. The conductive film 105a serving as part of the source electrode 136 and the drain electrode 137 is in contact with the oxide semiconductor film 138. In addition, since the conductive film 105a is formed using a metal material having low contact resistance to the oxide semiconductor film as described above, contact resistance between the source electrode 136 or the drain electrode 137 and the oxide semiconductor film 138 is reduced. Accordingly, on-state current and field-effect mobility of the TFT can be increased.

Then, after the source electrode 136 and the drain electrode 137 are formed, an insulating film 139 is formed so as to cover the source electrode 136, the drain electrode 137, and the oxide semiconductor film 138. The kind of material, the structure, and the range of the thickness of the insulating film 139 are the same as those of the insulating film 109 described in Embodiment 1. In this embodiment, the insulating film 139 having a structure in which a silicon nitride film having a thickness of 100 nm formed with a sputtering method is stacked over a silicon oxide film having a thickness of 200 nm formed with a sputtering method is formed. The substrate temperature in film formation may be higher than or equal to room temperature and lower than or equal to 300° C. and in this embodiment, is 100° C.

An exposed region of the oxide semiconductor film 138 provided between the source electrode 136 and the drain electrode 137 and the silicon oxide film which forms the insulating film 139 are provided in contact with each other, so that oxygen is supplied to the region of the oxide semiconductor film 138 which is in contact with the insulating film 139, and the resistance of the region is increased (carrier concentration is decreased, preferably, less than $1\times10^{18}/cm^3$), whereby the oxide semiconductor film 138 having a channel formation region with high resistance can be formed.

Note that after the insulating film 139 is formed, heat treatment may be performed. As for the condition of the heat treatment, the condition of the heat treatment which is performed after the insulating film 109 is formed in Embodiment 1 may be referred to.

A thin film transistor 130 formed in accordance with the manufacturing method has the gate electrode 101; the gate insulating film 102 over the gate electrode 101; the oxide semiconductor film 138 over the gate insulating film 102; the source electrode 136 and the drain electrode 137 over the oxide semiconductor film 138; and the insulating film 139 over the source electrode 136, the drain electrode 137, and the oxide semiconductor film 138.

Next, after a conductive film is formed over the insulating film 139, the conductive film is patterned, so that a back gate electrode may be formed so as to overlap with the oxide semiconductor film 138. Since the kind of material, the structure, and the range of the thickness of the back gate electrode are similar to those of the back gate electrode 111 described in Embodiment 1, description is omitted here.

When the back gate electrode is formed, an insulating film is formed so as to cover the back gate electrode. Since the kind of material, the structure, and the range of the thickness of the insulating film which covers the back gate electrode are similar to those of the insulating film 112 described in Embodiment 1, description is omitted here.

This embodiment can be implemented by being combined as appropriate with any of the above-described embodiments.

Embodiment 4

A method for manufacturing a semiconductor device will be described with reference to FIGS. 6A to 6D using a bottom gate thin film transistor having a channel etched structure as an example.

Figure 6A:
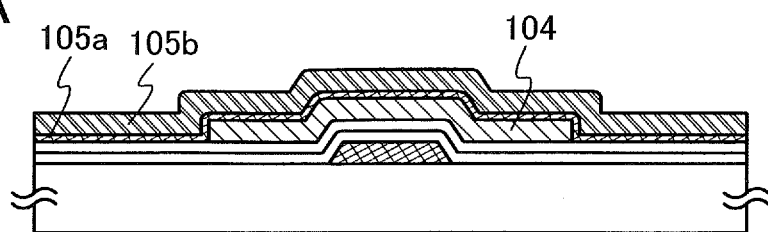
FIGS. 6A to 6D are cross-sectional views illustrating a method for manufacturing a semiconductor device.

First, as illustrated in FIG. 6A, in accordance with the manufacturing method described in Embodiment 1, over the island-shaped oxide semiconductor film 104, the conductive film 105a is formed using a metal material which has low contact resistance to the oxide semiconductor film 104, such as titanium, tungsten, or molybdenum, and thereover, the conductive film 105b is formed using a low electronegativity metal, a low electronegativity metal compound, or a low electronegativity alloy. Since the kind of material, the structure, and the range of the thickness of the conductive film 105a and the conductive film 105b are already described in Embodiment 1, description is omitted here. In this embodiment, a titanium film having a thickness of 100 nm formed with a sputtering method is used as the conductive film 105a, and an aluminum film having a thickness of 200 nm formed with a sputtering method is used as the conductive film 105b.

After the conductive film 105a and the conductive film 105b are formed, the exposed conductive film 105b may be subjected to heat treatment in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1.

Figure 6B:
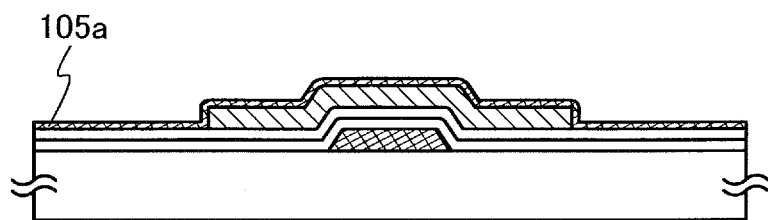

Next, as illustrated in FIG. 6B, the conductive film 105b is removed by etching or the like. The etching is preferably wet etching so as to prevent the conductive film 105a from being etched. Specifically, in this embodiment, since the aluminum film is used for the conductive film 105b, wet etching is performed using the solution containing phosphoric acid, for example, an Al-Etchant (an aqueous solution containing nitric acid of 2.0 wt %, acetic acid of 9.8 wt %, and phosphoric acid of 72.3 wt %) produced by Wako Pure Chemical Industries Co., Ltd, whereby the conductive film 105b is removed. Note that when the conductive film 105b is removed using dry etching, a gas containing chlorine ($Cl_2$), boron chloride ($BCl_3$), or the like may be used. Note that in the case where dry etching is performed, since there is no difference in selectivity between the conductive film 105a which is the titanium film and the conductive film 105b which is the aluminum film, the time of dry etching may be controlled at the time of etching so that the conductive film 105a may remain.

Impurities such as moisture or hydrogen existing in the oxide semiconductor film 104, the gate insulating film 102, or at the interface between the oxide semiconductor film 104 and another insulating film and the vicinity thereof can be occluded or adsorbed by the conductive film 105b. Therefore, the conductive film 105b is removed, so that the impurities such as moisture or hydrogen occluded or adsorbed by the conductive film 105b can also be removed.

Figure 6C:
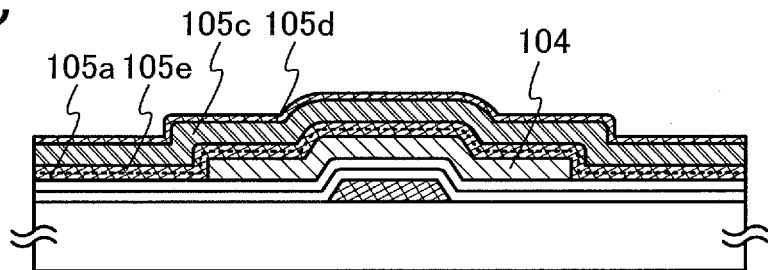

Next, as illustrated in FIG. 6C, a conductive film 105e formed using a metal material which has low contact resistance to the oxide semiconductor film 104, such as titanium, tungsten, or molybdenum, the conductive film 105c formed using a low electronegativity metal, a low electronegativity metal compound, or a low electronegativity alloy, and the conductive film 105d formed using a metal material which can prevent oxidation of the conductive film 105c, such as titanium, tungsten, or molybdenum are additionally formed over the conductive film 105a. The range of the thickness of the conductive film 105e and the conductive film 105d is the same as that of the conductive film 105a. The kind of material and the range of the thickness of the conductive film 105c are the same as those of the conductive film 105b. In this embodiment, an aluminum film having a thickness of 200 nm formed with a sputtering method is used as the conductive film 105c, a titanium film having a thickness of 100 nm formed with a sputtering method is used as the conductive film 105d, and a titanium film having a thickness of 100 nm formed with a sputtering method is used as the conductive film 105e.

In one embodiment of the present invention, after the conductive film 105b is removed, the conductive film 105c is additionally formed using a low electronegativity metal, a low electronegativity metal compound, or a low electronegativity alloy. The conductive film 105c easily occludes or adsorbs impurities such as moisture or hydrogen, as compared to the conductive film 105b which has already occluded or adsorbed impurities. Therefore, the impurities existing in the oxide semiconductor film 104, the gate insulating film 102, or at the interface between the oxide semiconductor film 104 and another insulating film and the vicinity thereof can be further reduced, as compared to the case of Embodiment 1. Therefore, by elimination of impurities such as moisture or hydrogen, the oxide semiconductor film 104 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

After the conductive film 105d is formed, the exposed conductive film 105d may be subjected to heat treatment again in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1. The heat treatment is performed, so that impurities such as moisture or hydrogen existing in the oxide semiconductor film 104, the gate insulating film 102, or at the interface between the oxide semiconductor film 104 and another insulating film and the vicinity thereof can be easily occluded or adsorbed by the conductive film 105c.

Figure 6D:
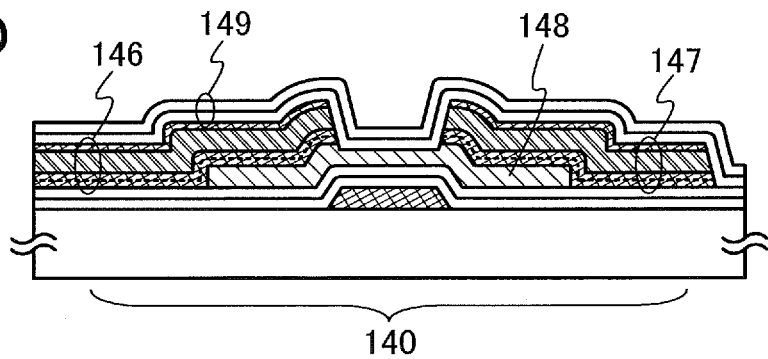

Next, as illustrated in FIG. 6D, the conductive film 105a, the conductive film 105c, the conductive film 105d, and the conductive film 105e are processed (patterned) into desired shapes by etching or the like, whereby a source electrode 146 and a drain electrode 147 are formed. For example, when a titanium film is used for the conductive film 105a, an aluminum film is used for the conductive film 105c, a titanium film is used for the conductive film 105d, and a titanium film is used for the conductive film 105e, after wet etching is performed on the conductive film 105d using a solution (ammonia peroxide mixture) containing ammonia and oxygenated water, wet etching may be performed on the conductive film 105c using a solution containing phosphoric acid, and then wet etching may be performed on the conductive film 105e and the conductive film 105a using a solution (ammonia peroxide mixture) containing ammonia and oxygenated water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, a solution in which oxygenated water of 31 wt %, ammonia water of 28 wt %, and water are mixed at a volume ratio of 5:2:2 is used. Alternatively, dry etching may be performed on the conductive film 105a, the conductive film 105c, the conductive film 105d, and the conductive film 105e using a gas containing chlorine ($Cl_2$), boron chloride ($BCl_3$), or the like.

When the source electrode 146 and the drain electrode 147 are formed by the patterning, part of an exposed portion of the island-shaped oxide semiconductor film 104 is etched, so that a groove (a depressed portion) is formed in some cases. In this embodiment, the case in which an island-shaped oxide semiconductor film 148 having a groove (a depressed portion) is formed by the etching is described. The conductive film 105a serving as part of the source electrode 146 and the drain electrode 147 is in contact with the oxide semiconductor film 148. In addition, since the conductive film 105a is formed using a metal material having low contact resistance to the oxide semiconductor film 148 as described above, contact resistance between the source electrode 146 or the drain electrode 147 and the oxide semiconductor film 148 is reduced. Accordingly, on-state current and field-effect mobility of the TFT can be increased.

Then, after the source electrode 146 and the drain electrode 147 are formed, an insulating film 149 is formed so as to cover the source electrode 146, the drain electrode 147, and the oxide semiconductor film 148. The kind of material, the structure, and the range of the thickness of the insulating film 149 are the same as those of the insulating film 109 described in Embodiment 1. In this embodiment, the insulating film 149 having a structure in which a silicon nitride film having a thickness of 100 nm formed with a sputtering method is stacked over a silicon oxide film having a thickness of 200 nm formed with a sputtering method is formed. The substrate temperature in film formation may be higher than or equal to room temperature and lower than or equal to 300° C. and in this embodiment, is 100° C.

An exposed region of the oxide semiconductor film 148 provided between the source electrode 146 and the drain electrode 147 and the silicon oxide film which forms the insulating film 149 are provided in contact with each other, so that oxygen is supplied to the region of the oxide semiconductor film 148 which is in contact with the insulating film 149, and the resistance of the region is increased (carrier concentration is decreased, preferably, less than $1 \times 10^{18}/cm^3$), whereby the oxide semiconductor film 148 having a channel formation region with high resistance can be formed.

After the insulating film 149 is formed, heat treatment may be performed. As for the condition of the heat treatment, the condition of the heat treatment which is performed after the insulating film 109 is formed in Embodiment 1 may be referred to.

A thin film transistor 140 formed in accordance with the manufacturing method has the gate electrode 101; the gate insulating film 102 over the gate electrode 101; the oxide semiconductor film 148 over the gate insulating film 102; the source electrode 146 and the drain electrode 147 over the oxide semiconductor film 148; and the insulating film 149 over the source electrode 146, the drain electrode 147, and the oxide semiconductor film 148.

Next, after a conductive film is formed over the insulating film 149, the conductive film is patterned, so that a back gate electrode may be formed so as to overlap with the oxide semiconductor film 148. Since the kind of material, the structure, and the range of the thickness of the back gate electrode are similar to those of the back gate electrode 111 described in Embodiment 1, description is omitted here.

When the back gate electrode is formed, an insulating film is formed so as to cover the back gate electrode. Since the kind of material, the structure, and the range of the thickness of the insulating film which covers the back gate electrode are similar to those of the insulating film 112 described in Embodiment 1, description is omitted here.

This embodiment can be implemented by being combined as appropriate with any of the above-described embodiments.

Embodiment 5

In this embodiment, a method for manufacturing a semiconductor device will be described with reference to FIGS. 7A to 7E, FIG. 8, and FIGS. 9A to 9C using a bottom gate thin film transistor having a channel protective structure as an example. Note that the same portions as Embodiment 1 or portions having functions similar to those of Embodiment 1 can be formed as in Embodiment 1, and also the same steps as Embodiment 1 or the steps similar to those of Embodiment 1 can be performed in a manner similar to those of Embodiment 1; therefore, repetitive description thereof is omitted.

Figure 7A:
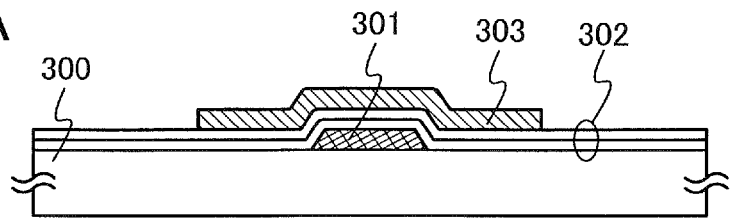
FIGS. 7A to 7E are cross-sectional views of a thin film transistor.

As illustrated in FIG. 7A, a gate electrode 301 is formed over a substrate 300 having an insulating surface. An insulating film serving as a base film may be provided between the substrate 300 and the gate electrode 301. The descriptions of the material, the structure, and the thickness of the gate electrode 101 in Embodiment 1 may be referred to for the material, the structure, and the thickness of the gate electrode 301. The descriptions of the material, the structure, and the thickness of the base film in Embodiment 1 may be referred to for the material, the structure, and the thickness of the base film.

Next, a gate insulating film 302 is formed over the gate electrode 301. The descriptions of the material, the thickness, the structure, and the manufacturing method of the gate insulating film 102 in Embodiment 1 may be referred to for the material, the thickness, the structure, and the manufacturing method of the gate insulating film 302.

Next, an oxide semiconductor film 303 is formed over the gate insulating film 302. The descriptions of the material, the thickness, the structure, and the manufacturing method of the oxide semiconductor film 103 in Embodiment 1 may be referred to for the material, the thickness, the structure, and the manufacturing method of the island-shaped oxide semiconductor film 303.

Figure 7B:
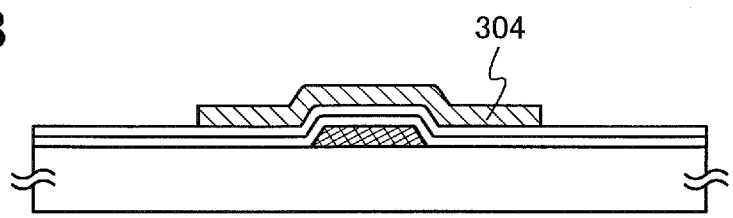

Next, heat treatment is performed on the oxide semiconductor film 303 in a reduced atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb in the case where measurement is performed using a dew-point meter of a cavity ring-down laser spectroscopy (CRDS) system). The descriptions of the heat treatment performed on the oxide semiconductor film 103 in Embodiment 1 may be referred to for the heat treatment performed on the oxide semiconductor film 303. The oxide semiconductor film 303 is subjected to heat treatment in the above atmosphere, so that an island-shaped oxide semiconductor film 304 in which moisture or hydrogen contained in the oxide semiconductor film 303 is eliminated is formed as illustrated in FIG. 7B. Impurities such as moisture or hydrogen are eliminated by the heat treatment, and the island-shaped oxide semiconductor film 304 is an intrinsic (i-type) semiconductor or a substantially i-type semiconductor; therefore, deterioration of characteristics of the transistor due to the impurities, such as shifts in threshold voltage, can be prevented from being promoted and off-state current can be reduced.

Figure 7C:
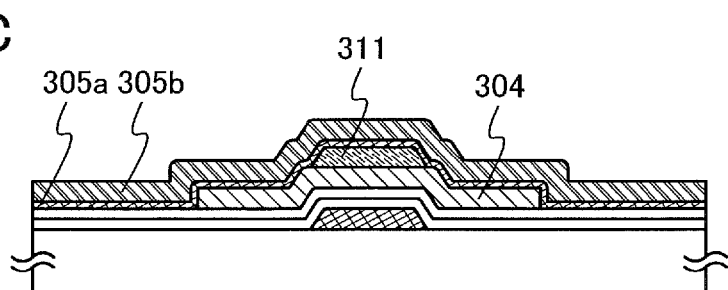

Next, as illustrated in FIG. 7C, a channel protective film 311 is formed over the oxide semiconductor film 304 so as to overlap with a portion of the oxide semiconductor film 304, which serves as a channel formation region. The channel protective film 311 can prevent the portion of the oxide semiconductor film 304, which serves as a channel formation region, from being damaged in a later step (for example, reduction in thickness due to plasma or an etchant in etching). Therefore, reliability of the thin film transistor can be improved.

The channel protective film 311 can be formed using an inorganic material including oxygen (such as silicon oxide, silicon oxynitride, or silicon nitride oxide). The channel protective film 311 can be formed by a vapor deposition method such as a plasma enhanced CVD method or a thermal CVD method, or a sputtering method. After the formation of the channel protective film 311, the shape thereof is processed by etching. Here, the channel protective film 311 is formed in such a manner that a silicon oxide film is formed with a sputtering method and processed by etching using a mask formed by photolithography.

When the channel protective film 311 which is an insulating film such as a silicon oxide film or a silicon oxynitride film is formed with a sputtering method, a PCVD method, or the like so as to be in contact with the island-shaped oxide semiconductor film 304, oxygen is supplied to at least a region of the island-shaped oxide semiconductor film 304, which is in contact with the channel protective film 311, and the resistance of the region is increased because carrier concentration is preferably decreased to less than $1\times10^{18}/cm^3$, more preferably, less than or equal to $1\times10^{14}/cm^3$, whereby a high-resistance oxide semiconductor region is formed. By the formation of the channel protective film 311, the oxide semiconductor film 304 can have the high-resistance oxide semiconductor region in the vicinity of the interface between the channel protective film 311 and the oxide semiconductor film 304.

Next, over the island-shaped oxide semiconductor film 304, a conductive film 305a formed using a metal material which has low contact resistance to the oxide semiconductor film 304, such as titanium, tungsten, or molybdenum, and a conductive film 305b formed using a low electronegativity metal, a low electronegativity metal compound, or a low electronegativity alloy are sequentially formed. The descriptions of the kind of the material, the structure, and the thickness of the conductive film 105a and the conductive film 105b in Embodiment 1 may be referred to for the kind of the material, the structure, and the thickness of the conductive film 305a and the conductive film 305b. In this embodiment, a titanium film having a thickness of 100 nm formed with a sputtering method is used as the conductive film 305a, and an aluminum film having a thickness of 200 nm formed with a sputtering method is used as the conductive film 305b.

In one embodiment of the present invention, the conductive film 305b is formed using a low electronegativity metal, a low electronegativity metal compound, or a low electronegativity alloy, so that impurities such as moisture or hydrogen existing in the oxide semiconductor film 304, the gate insulating film 302, or at an interface between the oxide semiconductor film 304 and another insulating film and the vicinity thereof are occluded or adsorbed by the conductive film 305b. Therefore, by elimination of impurities such as moisture or hydrogen, the oxide semiconductor film 304 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

After the conductive film 305a and the conductive film 305b are formed, the exposed conductive film 305b may be subjected to heat treatment in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1.

Figure 7D:
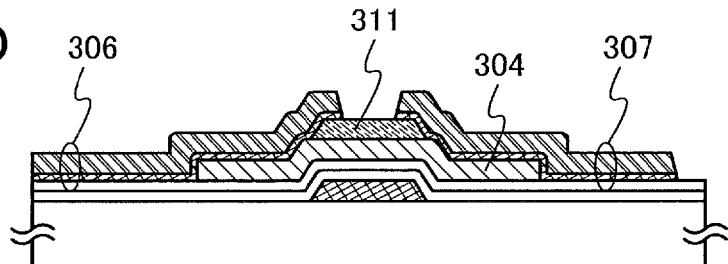

Next, as illustrated in FIG. 7D, the conductive film 305a and the conductive film 305b are processed (patterned) into desired shapes by etching or the like, whereby a source electrode 306 and a drain electrode 307 are formed. For example, when a titanium film is used for the conductive film 305a and an aluminum film is used for the conductive film 305b, after wet etching is performed on the conductive film 305b using a solution containing phosphoric acid, wet etching may be performed on the conductive film 305a using a solution (ammonia peroxide mixture) containing ammonia and oxygenated water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, a solution in which oxygenated water of 31 wt %, ammonia water of 28 wt %, and water are mixed at a volume ratio of 5:2:2 is used. Alternatively, dry etching may be performed on the conductive film 305a and the conductive film 305b using a gas containing chlorine ($Cl_2$), boron chloride ($BCl_3$), or the like.

The conductive film 305a serving as part of the source electrode 306 and the drain electrode 307 is in contact with the oxide semiconductor film 304. In addition, since the conductive film 305a is formed using a metal material having low contact resistance to the oxide semiconductor film as described above, contact resistance between the source electrode 306 or the drain electrode 307 and the oxide semiconductor film 304 is reduced. Accordingly, on-state current and field-effect mobility of the TFT can be increased.

Figure 7E:
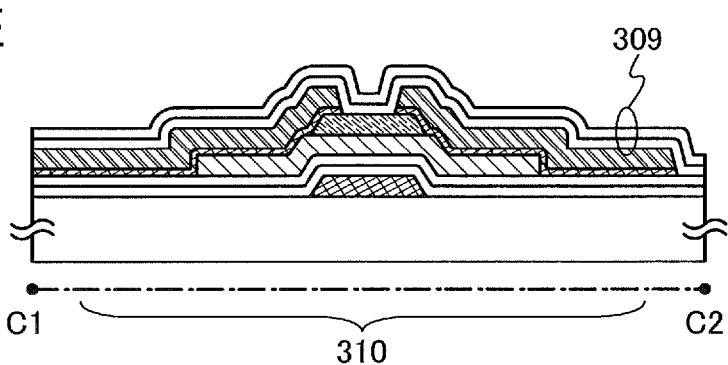

Then, as illustrated in FIG. 7E, after the source electrode 306 and the drain electrode 307 are formed, an insulating film 309 is formed so as to cover the oxide semiconductor film 304, the source electrode 306, the drain electrode 307, and the channel protective film 311. The kind of material, the structure, and the range of the thickness of the insulating film 309 are the same as those of the insulating film 109 described in Embodiment 1. In this embodiment, the insulating film 309 having a structure in which a silicon nitride film having a thickness of 100 nm formed with a sputtering method is stacked over a silicon oxide film having a thickness of 200 nm formed with a sputtering method is formed. The substrate temperature in film formation may be higher than or equal to room temperature and lower than or equal to 300° C. and in this embodiment, is 100° C.

Note that after the insulating film 309 is formed, heat treatment may be performed. As for the condition of the heat treatment, the condition of the heat treatment which is performed after the insulating film 109 is formed in Embodiment 1 may be referred to.

Figure 8:
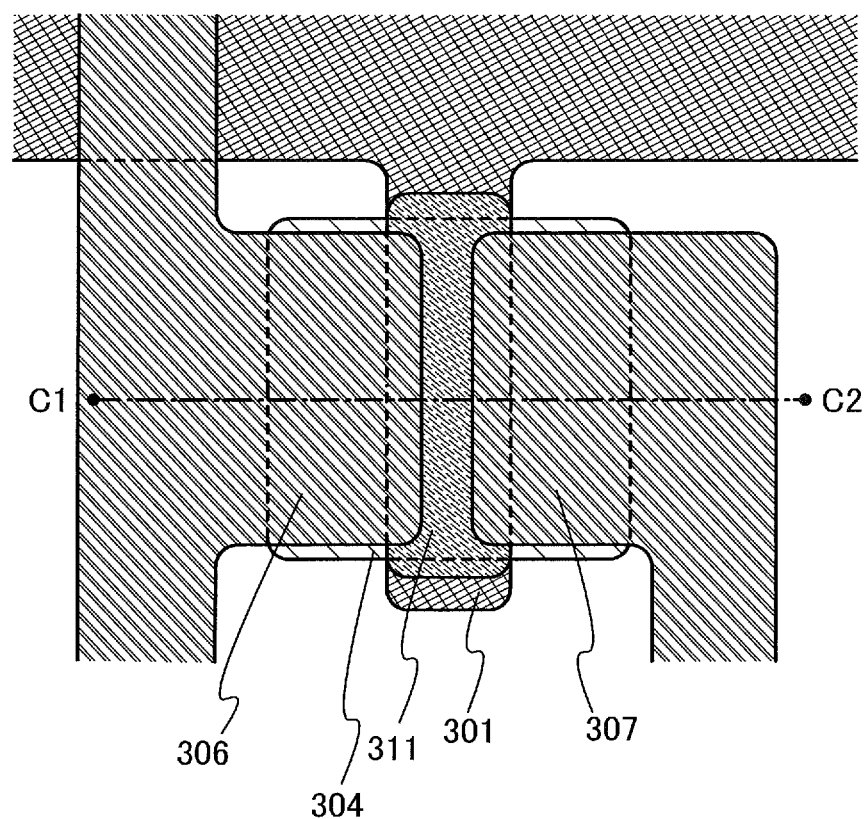
FIG. 8 is a top view of a thin film transistor.

A top view of the semiconductor device illustrated in FIG. 7E is illustrated in FIG. 8. FIG. 7E is a cross-sectional view taken along dashed line C1-C2 in FIG. 8.

A thin film transistor 310 formed in accordance with the manufacturing method has the gate electrode 301; the gate insulating film 302 over the gate electrode 301; the oxide semiconductor film 304 over the gate insulating film 302; the channel protective film 311 over the oxide semiconductor film 304; the source electrode 306 and the drain electrode 307 over the oxide semiconductor film 304; and the insulating film 309 over the oxide semiconductor film 304, the source electrode 306, the drain electrode 307, and the channel protective film 311.

Figure 9A:
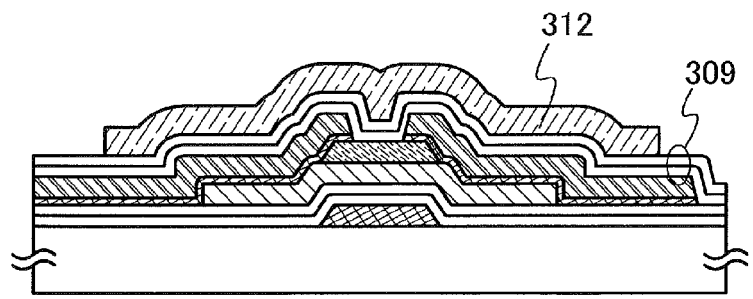
FIGS. 9A and 9B are cross-sectional views of a thin film transistor and FIG. 9C is a top view of a thin film transistor.

Next, as illustrated in FIG. 9A, after a conductive film is formed over the insulating film 309, the conductive film is patterned, so that a back gate electrode 312 may be formed so as to overlap with the oxide semiconductor film 304. Since the kind of material, the structure, and the range of the thickness of the back gate electrode 312 are similar to those of the back gate electrode 111 described in Embodiment 1, description is omitted here.

Figure 9B:
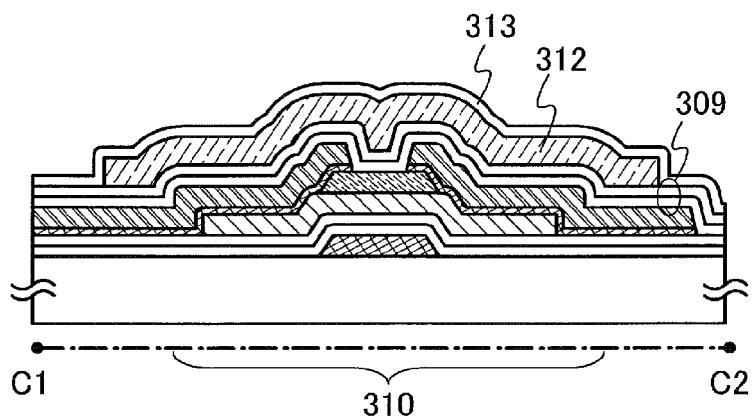

When the back gate electrode 312 is formed, an insulating film 313 is formed so as to cover the back gate electrode 312 as illustrated in FIG. 9B. Since the kind of material, the structure, and the range of the thickness of the insulating film 313 are similar to those of the insulating film 112 described in Embodiment 1, description is omitted here.

Figure 9C:
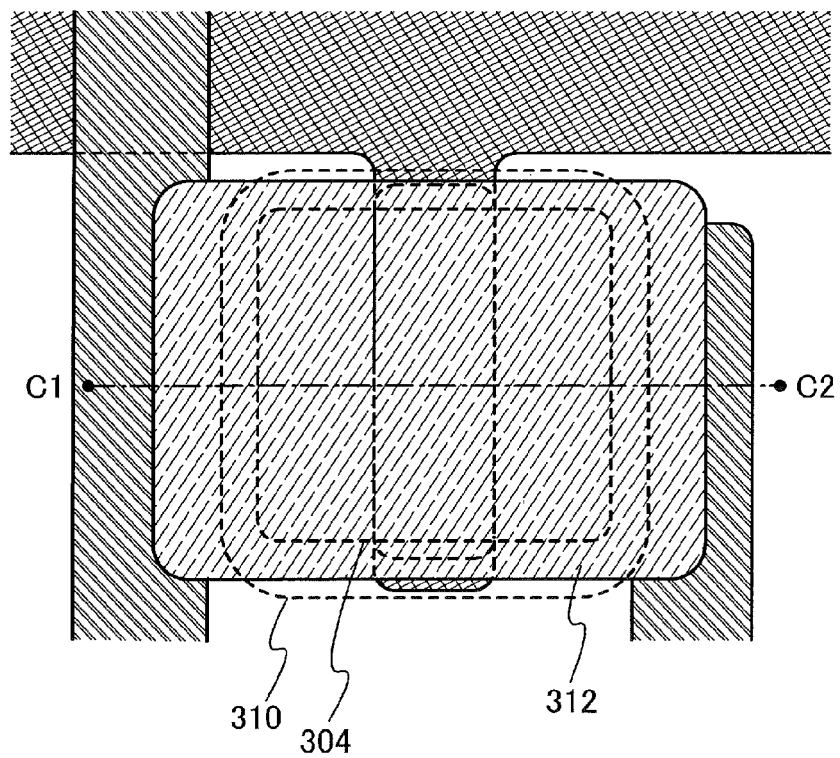

A top view of the semiconductor device illustrated in FIG. 9B is illustrated in FIG. 9C. FIG. 9B is a cross-sectional view taken along dashed line C1-C2 in FIG. 9C.

Note that in this embodiment, an example is described in which the source electrode and the drain electrode are formed in accordance with the manufacturing method described in Embodiment 1; however, one embodiment of the present invention is not limited to this structure. The source electrode and the drain electrode may be formed in accordance with any of the manufacturing methods described in Embodiments 2 to 4.

This embodiment can be implemented by being combined as appropriate with any of the above-described embodiments.

Embodiment 6

In this embodiment, a method for manufacturing a semiconductor device will be described with reference to FIGS. 10A to 10E and FIG. 11 using a bottom-contact thin film transistor as an example. Note that the same portions as Embodiment 1 or portions having functions similar to those of Embodiment 1 can be formed as in Embodiment 1, and also the same steps as Embodiment 1 or the steps similar to those of Embodiment 1 can be performed in a manner similar to those of Embodiment 1; therefore, repetitive description thereof is omitted.

Figure 10A:
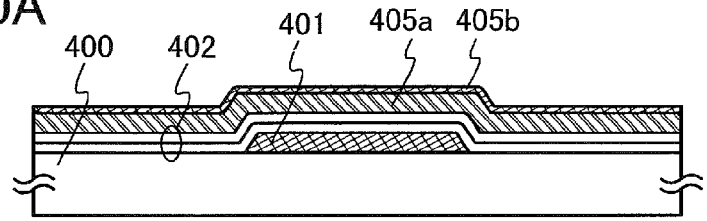
FIGS. 10A to 10E are cross-sectional views of a thin film transistor.

As illustrated in FIG. 10A, a gate electrode 401 is formed over a substrate 400 having an insulating surface. An insulating film serving as a base film may be provided between the substrate 400 and the gate electrode 401. The descriptions of the material, the structure, and the thickness of the gate electrode 101 in Embodiment 1 may be referred to for the material, the structure, and the thickness of the gate electrode 401. The descriptions of the material, the structure, and the thickness of the base film in Embodiment 1 may be referred to for the material, the structure, and the thickness of the base film.

Next, a gate insulating film 402 is formed over the gate electrode 401. The descriptions of the material, the thickness, the structure, and the manufacturing method of the gate insulating film 102 in Embodiment 1 may be referred to for the material, the thickness, and the structure, and the manufacturing method of the gate insulating film 402.

Next, over the gate insulating film 402, a conductive film 405a formed using a low electronegativity metal, a low electronegativity metal compound, or a low electronegativity alloy, and a conductive film 405b formed using a metal material which has low contact resistance to an oxide semiconductor film 404, such as titanium, tungsten, or molybdenum are sequentially formed. The descriptions of the kind of the material, the structure, and the thickness of the conductive film 105a and the conductive film 105b in Embodiment 1 may be referred to for the kind of the material, the structure, and the thickness of the conductive film 405b and the conductive film 405a. In this embodiment, an aluminum film having a thickness of 200 nm formed with a sputtering method is used as the conductive film 405a, and a titanium film having a thickness of 100 nm formed with a sputtering method is used as the conductive film 405b.

After the conductive film 405a and the conductive film 405b are formed, the exposed conductive film 405b may be subjected to heat treatment in a reduced atmosphere or an inert gas atmosphere such as a nitrogen atmosphere or a rare gas (argon, helium, or the like) atmosphere. The temperature range of the heat treatment is 200° C. to 450° C. as in Embodiment 1. For example, when an aluminum film is used for the conductive film 405a and a titanium film is used for the conductive film 405b, after wet etching is performed on the conductive film 405b using a solution (ammonia peroxide mixture) containing ammonia and oxygenated water, wet etching may be performed on the conductive film 405a using a solution containing phosphoric acid. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, a solution in which oxygenated water of 31 wt %, ammonia water of 28 wt %, and water are mixed at a volume ratio of 5:2:2 is used. Alternatively, dry etching may be performed on the conductive film 405a and the conductive film 405b using a gas containing chlorine ($Cl_2$), boron chloride ($BCl_3$), or the like.

Figure 10B:
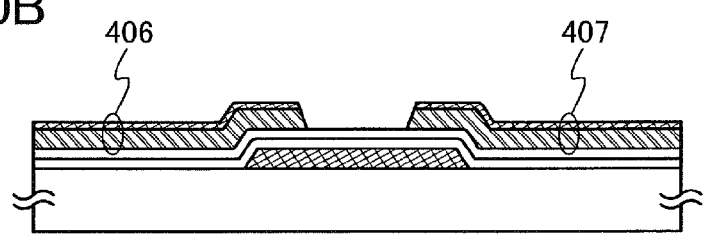

Next, as illustrated in FIG. 10B, the conductive film 405a and the conductive film 405b are processed (patterned) into desired shapes by etching or the like, whereby a source electrode 406 and a drain electrode 407 are formed.

Figure 10C:
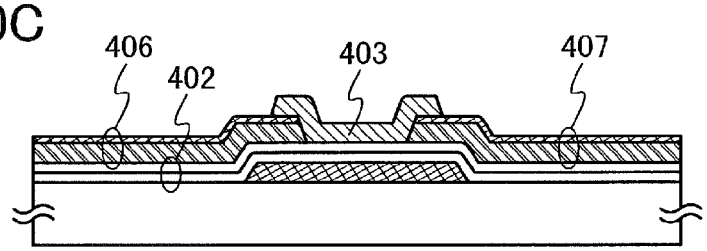

Next, as illustrated in FIG. 10C, an island-shaped oxide semiconductor film 403 is formed over the gate insulating film 402, the source electrode 406, and the drain electrode 407. The descriptions of the material, the thickness, the structure, and the manufacturing method of the oxide semiconductor film 103 in Embodiment 1 may be referred to for the material, the thickness, the structure, and the manufacturing method of the island-shaped oxide semiconductor film 403.

Figure 10D:
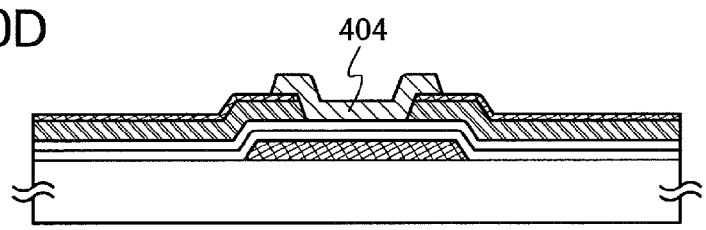

Next, heat treatment is performed on the island-shaped oxide semiconductor film 403 in a reduced atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb in the case where measurement is performed using a dew-point meter of a cavity ring-down laser spectroscopy (CRDS) system). The descriptions of the heat treatment performed on the oxide semiconductor film 103 in Embodiment 1 may be referred to for the heat treatment performed on the oxide semiconductor film 403. The oxide semiconductor film 403 is subjected to heat treatment in the above atmosphere, so that the island-shaped oxide semiconductor film 404 in which moisture or hydrogen contained in the oxide semiconductor film 403 is eliminated is formed as illustrated in FIG. 10D. Impurities such as moisture or hydrogen are eliminated by the heat treatment, and the island-shaped oxide semiconductor film 404 becomes an intrinsic (i-type) semiconductor or a substantially i-type semiconductor; therefore, deterioration of characteristics of the transistor due to the impurities, such as shifts in threshold voltage, can be prevented from being promoted and off-state current can be reduced.

In one embodiment of the present invention, the conductive film 405a is formed using a low electronegativity metal, a low electronegativity metal compound, or a low electronegativity alloy, so that impurities such as moisture or hydrogen existing in the oxide semiconductor film 404, the gate insulating film 402, or at an interface between the oxide semiconductor film 404 and another insulating film and the vicinity thereof are occluded or adsorbed by the conductive film 405a. Therefore, by elimination of impurities such as moisture or hydrogen, the oxide semiconductor film 404 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

The conductive film 405b serving as part of the source electrode 406 and the drain electrode 407 is in contact with the oxide semiconductor film 404. In addition, since the conductive film 405b is formed using a metal material having low contact resistance to the oxide semiconductor film as described above, contact resistance between the source electrode 406 or the drain electrode 407 and the oxide semiconductor film 404 is reduced. Accordingly, on-state current and field-effect mobility of the TFT can be increased.

Figure 10E:
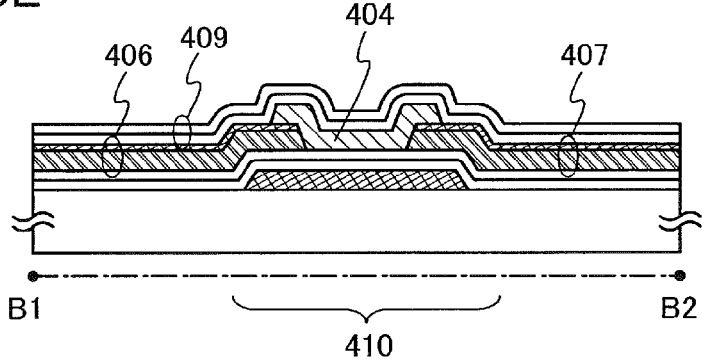

Then, as illustrated in FIG. 10E, after the source electrode 406 and the drain electrode 407 are formed, an insulating film 409 is formed so as to cover the oxide semiconductor film 404, the source electrode 406, and the drain electrode 407. The kind of material, the structure, and the range of the thickness of the insulating film 409 are the same as those of the insulating film 109 described in Embodiment 1. In this embodiment, the insulating film 409 having a structure in which a silicon nitride film having a thickness of 100 nm formed with a sputtering method is stacked over a silicon oxide film having a thickness of 200 nm formed with a sputtering method is formed. The substrate temperature in film formation may be higher than or equal to room temperature and lower than or equal to 300° C. and in this embodiment, is 100° C.

Note that after the insulating film 409 is formed, heat treatment may be performed. As for the condition of the heat treatment, the condition of the heat treatment which is performed after the insulating film 109 is formed in Embodiment 1 may be referred to.

Figure 11:
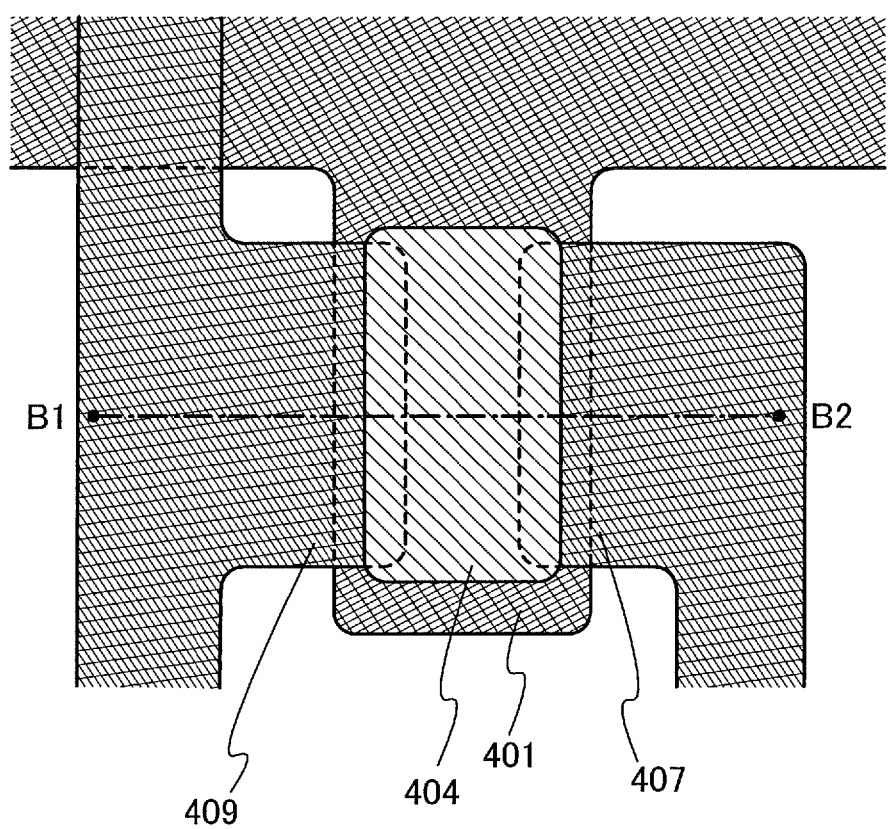
FIG. 11 is a top view of a thin film transistor.

A top view of the semiconductor device illustrated in FIG. 10E is illustrated in FIG. 11. FIG. 10E is a cross-sectional view taken along dashed line B1-B2 in FIG. 11.

A thin film transistor 410 formed in accordance with the manufacturing method has the gate electrode 401; the gate insulating film 402 over the gate electrode 401; the source electrode 406 and the drain electrode 407 over the gate insulating film 402; the oxide semiconductor film 404 over the gate insulating film 402, the source electrode 406, and the drain electrode 407; and the insulating film 409 over the oxide semiconductor film 404, the source electrode 406, and the drain electrode 407.

Next, after a conductive film is formed over the insulating film 409, the conductive film is patterned, so that a back gate electrode may be formed so as to overlap with the oxide semiconductor film 404. Since the kind of material, the structure, and the range of the thickness of the back gate electrode are similar to those of the back gate electrode 111 described in Embodiment 1, description is omitted here.

When the back gate electrode is formed, an insulating film is formed so as to cover the back gate electrode. Since the kind of material, the structure, and the range of the thickness of the insulating film are similar to those of the insulating film 112 described in Embodiment 1, description is omitted here.

This embodiment can be implemented by being combined as appropriate with any of the above-described embodiments.

Embodiment 7

In this embodiment, a manufacturing method of a semiconductor display device according to one embodiment of the present invention will be described with reference to FIGS. 12A to 12C, FIGS. 13A and 13B, FIGS. 14A and 14B, FIG. 15, FIG. 16, and FIG. 17.

In this specification, in successive film formation, a substrate to be processed is placed in an atmosphere which is controlled to be vacuum or an inert gas atmosphere (a nitrogen atmosphere or a rare gas atmosphere) at all times without being exposed to a contaminant atmosphere such as air during a process from a first film formation step using a sputtering method to a second film formation step using a sputtering method. By the successive formation, a film can be formed while preventing moisture or the like from being attached again to the substrate to be processed which is cleaned.

Performing the process from the first film formation step to the second film formation step in the same chamber is within the scope of the successive formation in this specification.

In addition, the following is also within the scope of the successive formation in this specification: in the case of performing the process from the first film formation step to the second film formation step in plural chambers, the substrate is transferred after the first film formation step to another chamber without being exposed to air and subjected to the second film formation.

Note that between the first film formation step and the second film formation step, a substrate transfer step, an alignment step, a slow-cooling step, a step of heating or cooling the substrate to a temperature which is necessary for the second film formation step, or the like may be provided. Such a process is also within the scope of the successive formation in this specification.

A step in which liquid is used, such as a cleaning step, wet etching, or resist formation, may be provided between the first film formation step and the second film formation step. This case is not within the scope of the successive formation in this specification.

Figure 12A:
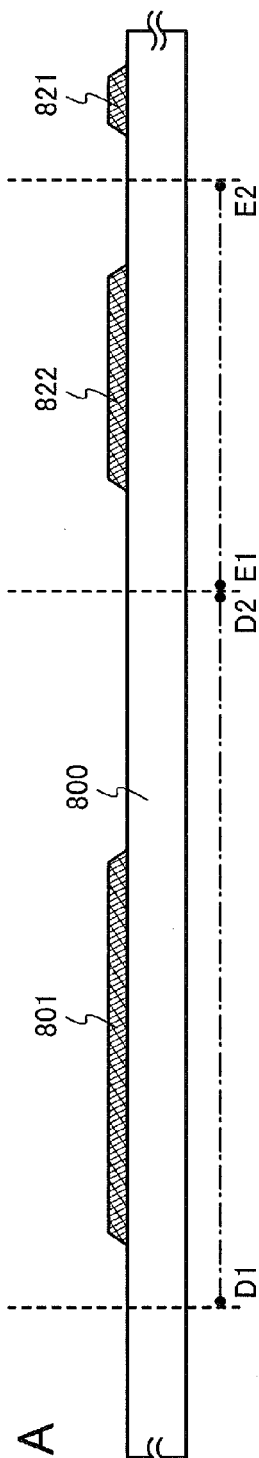
FIGS. 12A to 12C are cross-sectional views illustrating a method for manufacturing a semiconductor device.

In FIG. 12A, as a light-transmitting substrate 800, a glass substrate made by a fusion method or a float method; or a metal substrate such as a stainless steel alloy substrate, provided with an insulating film over its surface may be used. A substrate formed from a flexible synthetic resin, such as plastic, generally tends to have a low upper temperature limit, but can be used as the substrate 800 as long as the substrate can withstand processing temperatures in the later manufacturing process. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, and the like.

As the glass substrate, the one whose strain point is higher than or equal to 730° C. may be used in the case where the temperature of the heat treatment to be performed later is high. As the glass substrate, a glass material such as aluminosilicate glass, aluminoborosilicate glass, or barium borosilicate glass is used, for example. Note that by containing a larger amount of barium oxide (BaO) than boron oxide, a glass substrate is heat-resistant and of more practical use.

Note that as the above glass substrate, a substrate formed using an insulator such as a ceramic substrate, a quartz substrate, or a sapphire substrate may be used. Alternatively, crystallized glass or the like may be used.

Next, after a conductive film is formed over an entire surface of the substrate 800, a first photolithography step is performed to form a resist mask, and unnecessary portions of the conductive film are removed by etching to form wirings and an electrode (a gate wiring including a gate electrode 801, a capacitor wiring 822, and a first terminal 821). At this time, etching is performed so that at least end portions of the gate electrode 801 may be tapered.

The conductive film can be formed with a single layer or a stacked layer using one or more of metal materials such as molybdenum, titanium, chromium, tantalum, tungsten, neodymium, or scandium; an alloy material which includes any of these metal materials as a main component; or a nitride of any of these metals. Note that aluminum or copper can be used as the metal material as long as aluminum or copper can withstand temperature of heat treatment to be performed in a later process.

For example, as the conductive film having a two-layer structure, the following structures are preferable: a two-layer structure in which a molybdenum layer is stacked over an aluminum layer, a two-layer structure in which a molybdenum layer is stacked over a copper layer, a two-layer structure in which a titanium nitride layer or a tantalum nitride layer is stacked over a copper layer, and a two-layer structure of a titanium nitride layer and a molybdenum layer. As a three-layer structure, the following structure is preferable: a stacked structure containing aluminum, an alloy of aluminum and silicon, an alloy of aluminum and titanium, or an alloy of aluminum and neodymium in a middle layer and any of tungsten, tungsten nitride, titanium nitride, and titanium in a top layer and a bottom layer.

In addition, a light-transmitting oxide conductive film is used for part of the electrode and the wiring to increase the aperture ratio. For example, indium oxide, an alloy of indium oxide and tin oxide, an alloy of indium oxide and zinc oxide, zinc oxide, aluminum zinc oxide, aluminum zinc oxynitride, gallium zinc oxide, or the like can be used as the oxide conductive film.

The thickness of each of the gate electrode 801, the capacitor wiring 822, and the first terminal 821 is 10 nm to 400 nm, preferably 100 nm to 200 nm. In this embodiment, a conductive film for a gate electrode is formed to have a thickness of 100 nm with a sputtering method using a tungsten target. Then, the conductive film is processed (patterned) into a desired shape by etching, whereby the gate electrode 801, the capacitor wiring 822, and the first terminal 821 are formed.

Note that an insulating film to serve as a base film may be formed between the substrate 800 and the gate electrode 801, the capacitor wiring 822, and the first terminal 821. As the base film, for example, a single layer or a stacked layer using one or more films selected from a silicon oxide film, a silicon oxynitride film, a silicon nitride film, a silicon nitride oxide film, an aluminum nitride film, and an aluminum nitride oxide film can be used. In particular, an insulating film having a high barrier property, for example, a silicon nitride film, a silicon nitride oxide film, an aluminum nitride film, or an aluminum nitride oxide film is used for the base film, so that impurities in an atmosphere, such as moisture or hydrogen, or impurities included in the substrate 800, such as an alkali metal or a heavy metal, can be prevented from entering the oxide semiconductor film, the gate insulating film or at the interface between the oxide semiconductor film and another insulating film and the vicinity thereof.

Figure 12B:
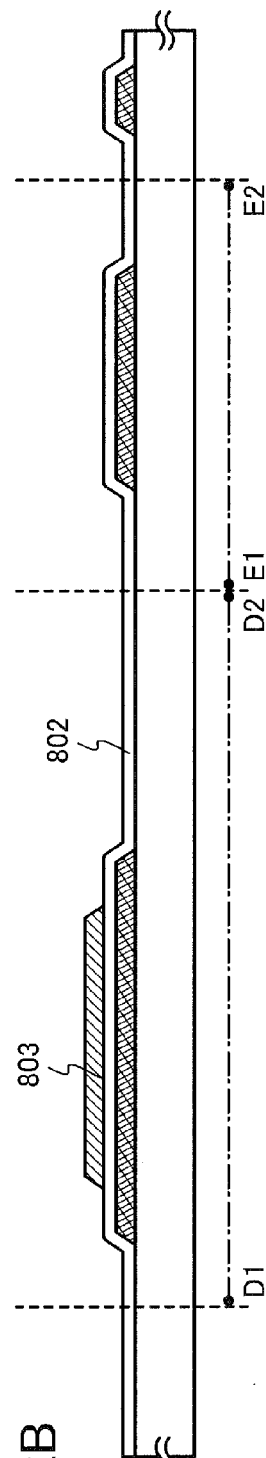

Next, a gate insulating film 802 is formed over the gate electrode 801, the capacitor wiring 822, and the first terminal 821 as illustrated in FIG. 12B. The gate insulating film 802 can be formed to have a single layer of a silicon oxide film, a silicon nitride film, a silicon oxynitride film, a silicon nitride oxide film, an aluminum oxide film, or a tantalum oxide film or a stacked layer thereof with a plasma enhanced CVD method, a sputtering method, or the like. It is preferable that the gate insulating film 802 include impurities such as moisture or hydrogen as little as possible. The gate insulating film 802 may have a structure in which an insulating film formed using a material having a high barrier property and an insulating film having lower proportion of nitrogen such as a silicon oxide film or a silicon oxynitride film are stacked. In this case, the insulating film such as a silicon oxide film or a silicon oxynitride film is formed between the insulating film having a barrier property and the oxide semiconductor film. As the insulating film having a high barrier property, for example, a silicon nitride film, a silicon nitride oxide film, an aluminum nitride film, an aluminum nitride oxide film, or the like can be given. The insulating film having a barrier property is used, so that impurities in an atmosphere, such as moisture or hydrogen, or impurities included in the substrate, such as an alkali metal or a heavy metal, can be prevented from entering the oxide semiconductor film, the gate insulating film 802, or at the interface between the oxide semiconductor film and another insulating film and the vicinity thereof. In addition, the insulating film having lower proportion of nitrogen such as a silicon oxide film or a silicon oxynitride film is formed so as to be in contact with the oxide semiconductor film, so that the insulating film formed using a material having a high barrier property can be prevented from being in contact with the oxide semiconductor film directly.

In this embodiment, the gate insulating film 802 having a structure in which a silicon oxide film having a thickness of 100 nm formed with a sputtering method is stacked over a silicon nitride film having a thickness of 50 nm formed with a sputtering method is formed.

Next, after an oxide semiconductor film is formed over the gate insulating film 802, the oxide semiconductor film is processed into a desired shape by etching or the like, whereby an island-shaped oxide semiconductor film 803 is formed. The oxide semiconductor film is formed with a sputtering method using an oxide semiconductor as a target. Moreover, the oxide semiconductor film can be formed with a sputtering method in a rare gas (for example, argon) atmosphere, an oxygen atmosphere, or an atmosphere including a rare gas (for example, argon) and oxygen.

Note that before the oxide semiconductor film is formed with a sputtering method, dust attached to a surface of the gate insulating film 802 is preferably removed by reverse sputtering in which an argon gas is introduced and plasma is generated. The reverse sputtering refers to a method in which, without application of voltage to a target side, an RF power supply is used for application of voltage to a substrate side in an argon atmosphere and plasma is generated in the vicinity of the surface to modify a surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

For the oxide semiconductor film used for forming a channel formation region, an oxide material having semiconductor characteristics described above may be used.

The thickness of the oxide semiconductor film is set to 10 nm to 300 nm, preferably, 20 nm to 100 nm. Here in this embodiment, the oxide semiconductor film is formed using an oxide semiconductor target, which contains In, Ga, and Zn (the ratio of $In_2O_3$ to $Ga_2O_3$ to ZnO is 1:1:1 or 1:1:2 in molar ratio) under conditions where the distance between the substrate and the target is 100 mm, the pressure is 0.6 Pa, and the direct current (DC) power is 0.5 kW, and the atmosphere is an oxygen atmosphere (the proportion of the oxygen flow is 100%). Note that a pulsed direct current (DC) power supply is preferable because dust can be reduced and the film thickness can be uniform. In this embodiment, as the oxide semiconductor film, an In—Ga—Zn—O-based non-single-crystal film having a thickness of 30 nm is formed with the use of an In—Ga—Zn—O-based oxide semiconductor target with a sputtering apparatus.

Note that after the plasma treatment, the oxide semiconductor film is formed without exposure to air, whereby adhesion of dust and moisture to an interface between the gate insulating film 802 and the oxide semiconductor film can be prevented. Further, a pulsed direct current (DC) power supply is preferable because dust can be reduced and a thickness distribution is uniform.

It is preferable that the relative density of the oxide semiconductor target is greater than or equal to 80%, more preferably, greater than or equal to 95%, further preferably, greater than or equal to 99.9%. When a target having high relative density is used, the impurity concentration of the formed oxide semiconductor film can be reduced, and a thin film transistor having high electric characteristics or reliability can be obtained.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering method, and a sputtering apparatus used for an ECR sputtering in which plasma generated with the use of microwaves is used without using glow discharge.

Furthermore, as a film formation method with a sputtering method, there are also a reactive sputtering method in which a target substance and a sputtering gas component are chemically reacted with each other during film formation to form a thin compound film thereof, and a bias sputtering method in which voltage is also applied to the substrate during film formation.

The substrate may be heated at higher than or equal to 400° C. and lower than or equal to 700° C. with light or a heater in film formation with a sputtering method. The substrate is heated in film formation, whereby the damage due to sputtering is repaired at the same time as film formation.

Preheat treatment is preferably performed so as to remove moisture or hydrogen remaining on an inner wall of the sputtering apparatus, on a surface of the target, or in a target material, before the oxide semiconductor film is formed. As the preheat treatment, a method in which the inside of the film deposition chamber is heated to from 200° C. to 600° C. under reduced pressure, a method in which introduction and exhaust of nitrogen or an inert gas are repeated while the inside of a film deposition chamber is heated, and the like can be given. After the preheat treatment, the substrate or the sputtering apparatus is cooled, and then the oxide semiconductor film is formed without exposure to air. In this case, not water but oil or the like is preferably used as a coolant for the target. Although a certain level of effect can be obtained when introduction and exhaust of nitrogen are repeated without heating, it is more preferable to perform the treatment with the inside of the film formation chamber heated.

It is preferable to remove moisture or the like remaining in the sputtering apparatus with the use of a cryopump before, during, or after the oxide semiconductor film is formed.

In a second photolithography step, the oxide semiconductor film is processed into a desired shape by wet etching using a solution of a mixture of phosphoric acid, acetic acid, and nitric acid for example, whereby the island-shaped oxide semiconductor film 803 can be formed. The island-shaped oxide semiconductor film 803 is formed so as to overlap with the gate electrode 801. In etching of the oxide semiconductor film, organic acid such as citric acid or oxalic acid can be used for an etchant. In this embodiment, the unnecessary portions are removed by wet etching using ITO07N (product of Kanto Chemical Co., Inc.), whereby the island-shaped oxide semiconductor film 803 is formed. The etching here is not limited to wet etching and may be dry etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

The etchant after the wet etching is removed together with the etched material by cleaning. The waste liquid including the etchant and the etched material may be purified and the material may be reused. When a material such as indium included in the oxide semiconductor film is collected from the waste liquid after the etching and reused, the resources can be efficiently used and the cost can be reduced.

In order to obtain a desired shape by etching, the etching conditions (such as an etchant, etching time, and temperature) are adjusted as appropriate depending on the material.

Figure 12C:
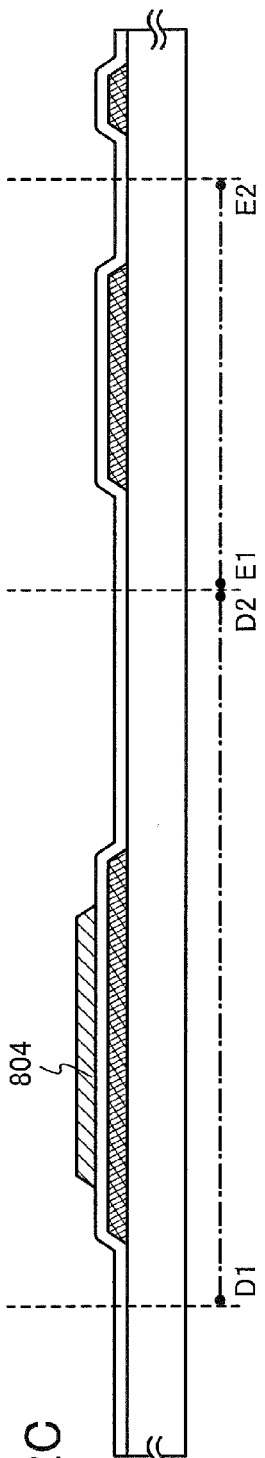

Next, as illustrated in FIG. 12C, heat treatment may be performed on the oxide semiconductor film 803 in a reduced atmosphere, an inert gas atmosphere such as a nitrogen atmosphere or a rare gas atmosphere, an oxygen gas atmosphere, or an ultra dry air atmosphere (in air whose moisture content is less than or equal to 20 ppm (dew point conversion, −55° C.), preferably, less than or equal to 1 ppm, more preferably, less than or equal to 10 ppb in the case where measurement is performed using a dew-point meter of a cavity ring-down laser spectroscopy (CRDS) system). When the heat treatment is performed on the oxide semiconductor film 803, an oxide semiconductor film 804 is formed. Specifically, rapid thermal annealing (RTA) treatment can be performed in an inert gas atmosphere (nitrogen, helium, neon, argon, or the like) at a temperature of higher than or equal to 500° C. and lower than or equal to 750° C. (or lower than or equal to a strain point of a glass substrate) for approximately greater than or equal to one minute and less than or equal to ten minutes, preferably, at 650° C. for approximately greater than or equal to three minutes and less than or equal to six minutes. With an RTA method, dehydration or dehydrogenation can be performed in a short time; therefore, treatment can be performed even at a temperature higher than the strain point of the glass substrate. Note that the heat treatment is not necessarily performed after the island-shaped oxide semiconductor film 803 is formed, and the heat treatment may be performed on the oxide semiconductor film before etching treatment is performed. The heat treatment may be performed more than once after the island-shaped oxide semiconductor film 803 is formed.

In this embodiment, heat treatment is performed in a nitrogen atmosphere at 600° C. for six minutes in a state where the substrate temperature reaches the set temperature. A heating method using an electric furnace, a rapid heating method such as a gas rapid thermal annealing (GRTA) method using a heated gas or a lamp rapid thermal annealing (LRTA) method using lamp light, or the like can be used for the heat treatment. For example, in the case of performing heat treatment using an electric furnace, the temperature rise characteristics are preferably set at higher than or equal to 0.1° C./min and lower than or equal to 20° C./min and the temperature drop characteristics are preferably set at higher than or equal to 0.1° C./min and lower than or equal to 15° C./min.

Note that it is preferable that in the heat treatment, moisture, hydrogen, or the like be not contained in nitrogen or a rare gas such as helium, neon, or argon. Alternatively, it is preferable that the purity of nitrogen or the rare gas such as helium, neon, or argon which is introduced into a heat treatment apparatus be set to be higher than or equal to 6N (99.9999%), preferably higher than or equal to 7N (99.99999%) (that is, the impurity concentration is lower than or equal to 1 ppm, preferably lower than or equal to 0.1 ppm).

Note that a cross-sectional view taken along dashed line D1-D2 and a cross-sectional view taken along dashed line E1-E2 of FIG. 12C correspond to a cross-sectional view taken along dashed line D1-D2 and a cross-sectional view taken along dashed line E1-E2 in a top view illustrated in FIG. 15, respectively.

Next, as illustrated in FIG. 13A, a conductive film 806 used for a source electrode and a drain electrode is formed over the oxide semiconductor film 804 with a sputtering method or a vacuum evaporation method. In this embodiment, the conductive film 806 in which a conductive film 806*b* formed using a low electronegativity metal, a low electronegativity metal compound, or a low electronegativity alloy is formed over a conductive film 806*a* formed using a metal material which has low contact resistance to the oxide semiconductor film 804, such as titanium, tungsten, or molybdenum is used.

As the low electronegativity metal, aluminum or magnesium can also be used. A mixture, a metal compound, or an alloy each including one or more of the above metals can be used for the conductive film 806*b*. When a low heat-resistance material such as aluminum is used, aluminum may be combined with a heat-resistant conductive material such as an element selected from titanium, tantalum, tungsten, molybdenum, chromium, neodymium, or scandium; an alloy containing one or more of these elements as its component; or nitride containing the element as its component, so that heat resistance of the conductive film 806*b* may be increased.

The thickness of the conductive film 806*a* is preferably 10 nm to 200 nm, more preferably, 50 nm to 150 nm. The thickness of the conductive film 806*b* is preferably 100 nm to 300 nm, more preferably, 150 nm to 250 nm. In this embodiment, a titanium film having a thickness of 100 nm formed with a sputtering method is used as the conductive film 806*a*, and an aluminum film having a thickness of 200 nm formed with a sputtering method is used as the conductive film 806*b*.

In one embodiment of the present invention, the conductive film 806*b* is formed using a low electronegativity metal, a low electronegativity metal compound, or a low electronegativity alloy, so that impurities such as moisture or hydrogen existing in the oxide semiconductor film 804, the gate insulating film 802, or at an interface between the oxide semiconductor film 804 and another insulating film and the vicinity thereof are occluded or adsorbed by the conductive film 806*b*. Therefore, by elimination of impurities such as moisture or hydrogen, the oxide semiconductor film 804 which is an intrinsic (i-type) semiconductor or a substantially i-type semiconductor can be obtained, and deterioration of characteristics of the transistor due to the impurities, such as shifts in threshold voltage, can be prevented from being promoted and off-state current can be reduced.

In addition to the above structure, the exposed conductive film 806*b* is subjected to heat treatment in a reduced atmosphere, or an inert gas atmosphere such as a nitrogen atmosphere or a rare gas (argon, helium, or the like) atmosphere, so that moisture, oxygen, or the like adsorbed on the surface of or inside the conductive film 806*b* may be removed. The temperature range of the heat treatment is 200° C. to 450° C. The heat treatment is performed, so that impurities such as moisture or hydrogen existing in the oxide semiconductor film 804, the gate insulating film 802 or at the interface between the oxide semiconductor film 804 and another insulating film and the vicinity thereof can be easily occluded or adsorbed by the conductive film 806*b*.

Next, as illustrated in FIG. 13B, a third photolithography step is performed, and the conductive film 806*a* and the conductive film 806*b* are processed (patterned) into desired shapes by etching or the like, whereby a source electrode 807 and a drain electrode 808 are formed. For example, when a titanium film is used for the conductive film 806*a* and an aluminum film is used for the conductive film 806*b*, after wet etching is performed on the conductive film 806*b* using a solution containing phosphoric acid, wet etching may be performed on the conductive film 806*a* using a solution (ammonia peroxide mixture) containing ammonia and oxygenated water. Specifically, in this embodiment, an Al-Etchant (an aqueous solution containing nitric acid of 2.0 wt %, acetic acid of 9.8 wt %, and phosphoric acid of 72.3 wt %) produced by Wako Pure Chemical Industries, Ltd. is used as the solution containing phosphoric acid. In addition, as the ammonia peroxide mixture, specifically, a solution in which oxygenated water of 31 wt %, ammonia water of 28 wt %, and water are mixed at a volume ratio of 5:2:2 is used. Alternatively, dry etching may be performed on the conductive film 806*a* and the conductive film 806*b* using a gas containing chlorine ($Cl_2$), boron chloride ($BCl_3$), or the like.

When the source electrode 807 and the drain electrode 808 are formed by the patterning, part of an exposed portion of the island-shaped oxide semiconductor film 804 is etched, so that a groove (a depressed portion) is formed in some cases. In this embodiment, the case in which an island-shaped oxide semiconductor film 805 having a groove (a depressed portion) is formed by the etching is described. The conductive film 806*a* serving as part of the source electrode 807 and the drain electrode 808 is in contact with the oxide semiconductor film 805. In addition, since the conductive film 806*a* is formed using a metal material having low contact resistance to the oxide semiconductor film as described above, contact resistance between the source electrode 807 or the drain electrode 808 and the oxide semiconductor film 805 is reduced. Accordingly, on-state current and field-effect mobility of the TFT can be increased.

In the third photolithography step, a second terminal 820 which is formed from the same material as the source electrode 807 and the drain electrode 808 is left in a terminal portion. Note that the second terminal 820 is electrically connected to a source wiring (a source wiring including the source electrode 807 and the drain electrode 808).

Further, by use of a resist mask which is formed using a multi-tone mask and has regions with plural thicknesses (for example, two different thicknesses), the number of resist masks can be reduced, resulting in simplified process and lower costs.

Figure 16:
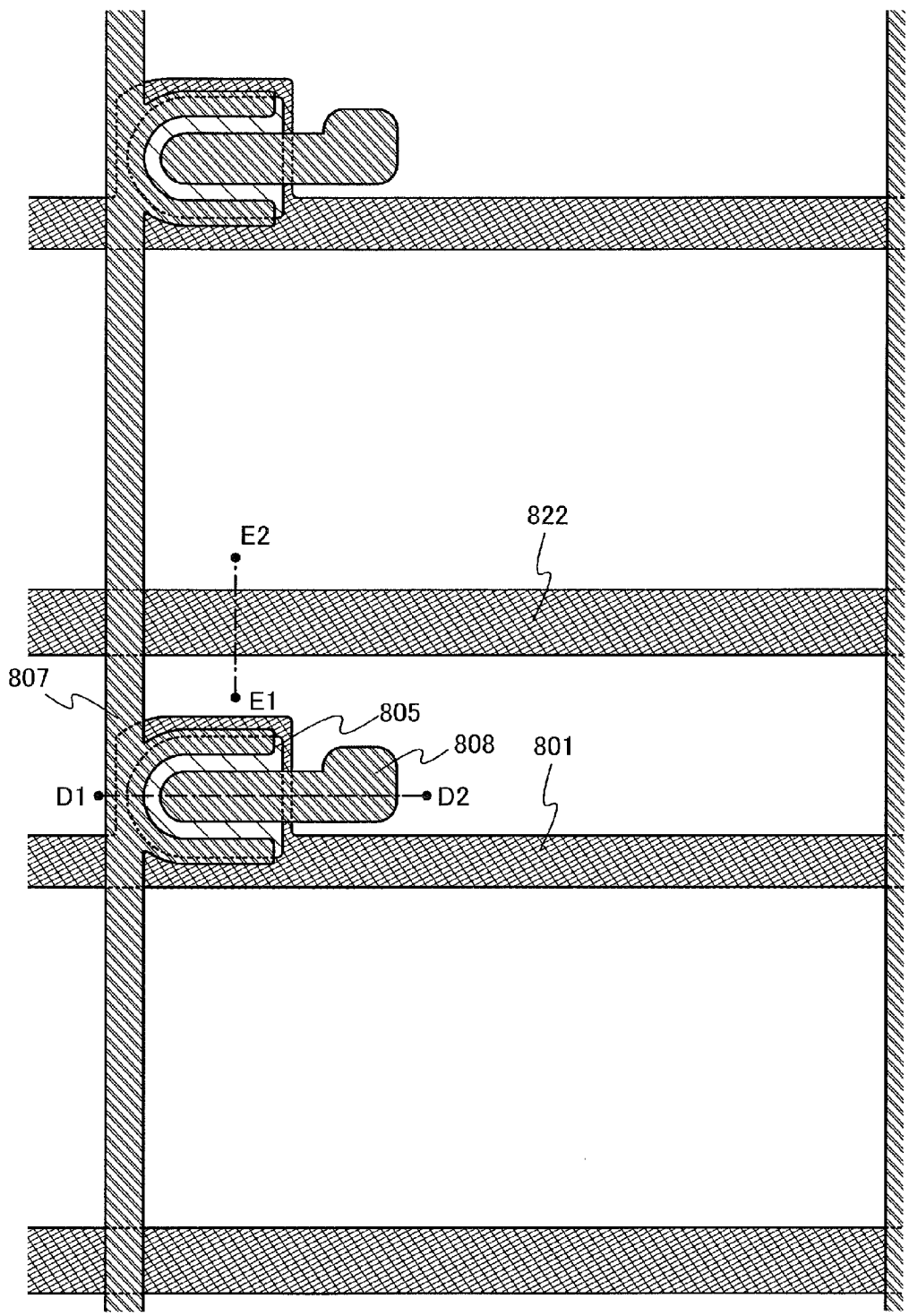
FIG. 16 is a top view illustrating a method for manufacturing a semiconductor device.
Figure 17:
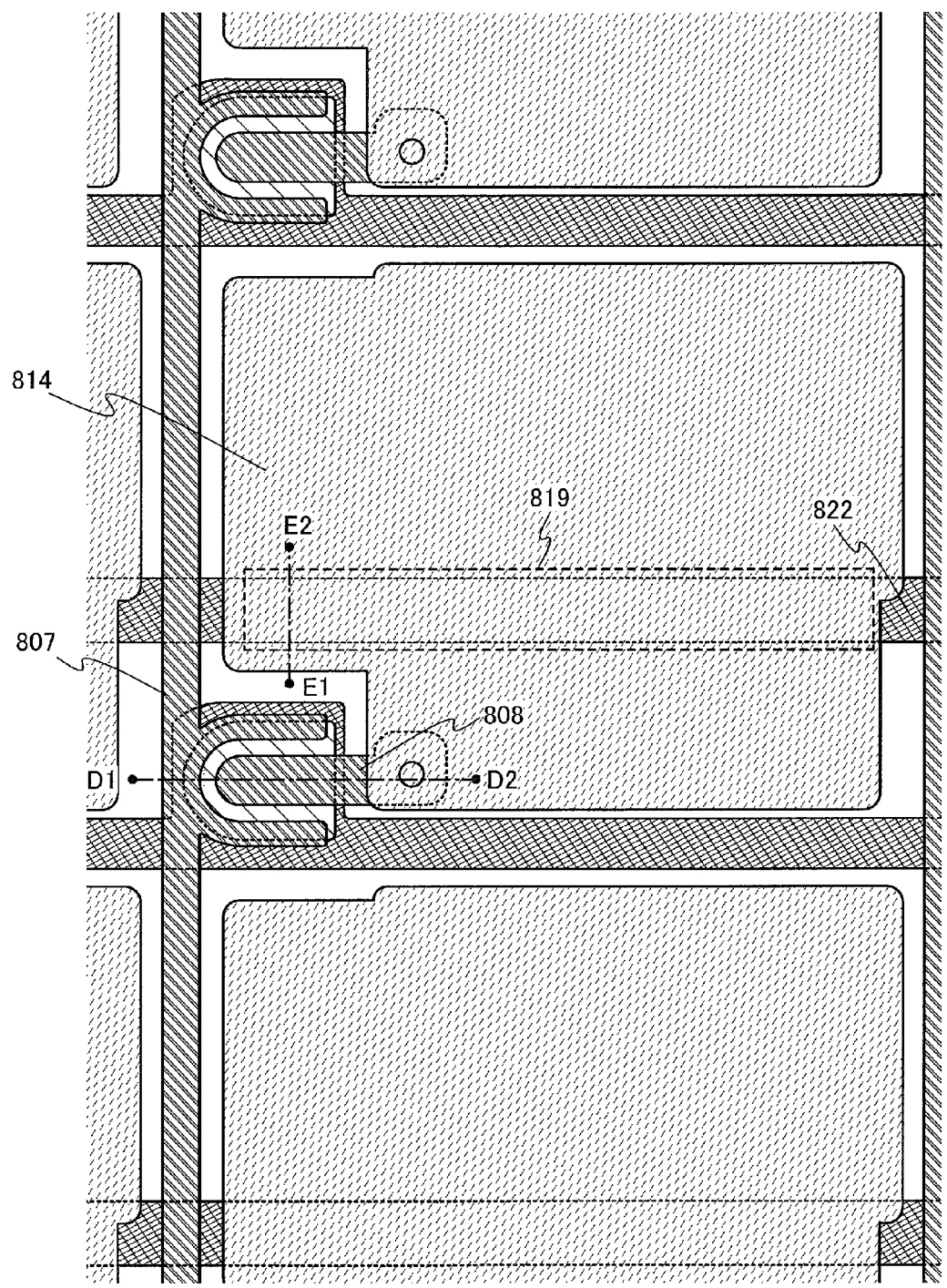
FIG. 17 is a top view illustrating a method for manufacturing a semiconductor device.

Note that a cross-sectional view taken along dashed line D1-D2 and a cross-sectional view taken along dashed line E1-E2 of FIG. 13B correspond to a cross-sectional view taken along dashed line D1-D2 and a cross-sectional view taken along dashed line E1-E2 in a top view illustrated in FIG. 16, respectively.

Note that in this embodiment, an example is described in which the source electrode and the drain electrode are formed in accordance with the manufacturing method described in Embodiment 1; however, the source electrode and the drain electrode may be formed in accordance with any of the manufacturing methods described in Embodiments 2 to 4.

Figures 14A, 14B:
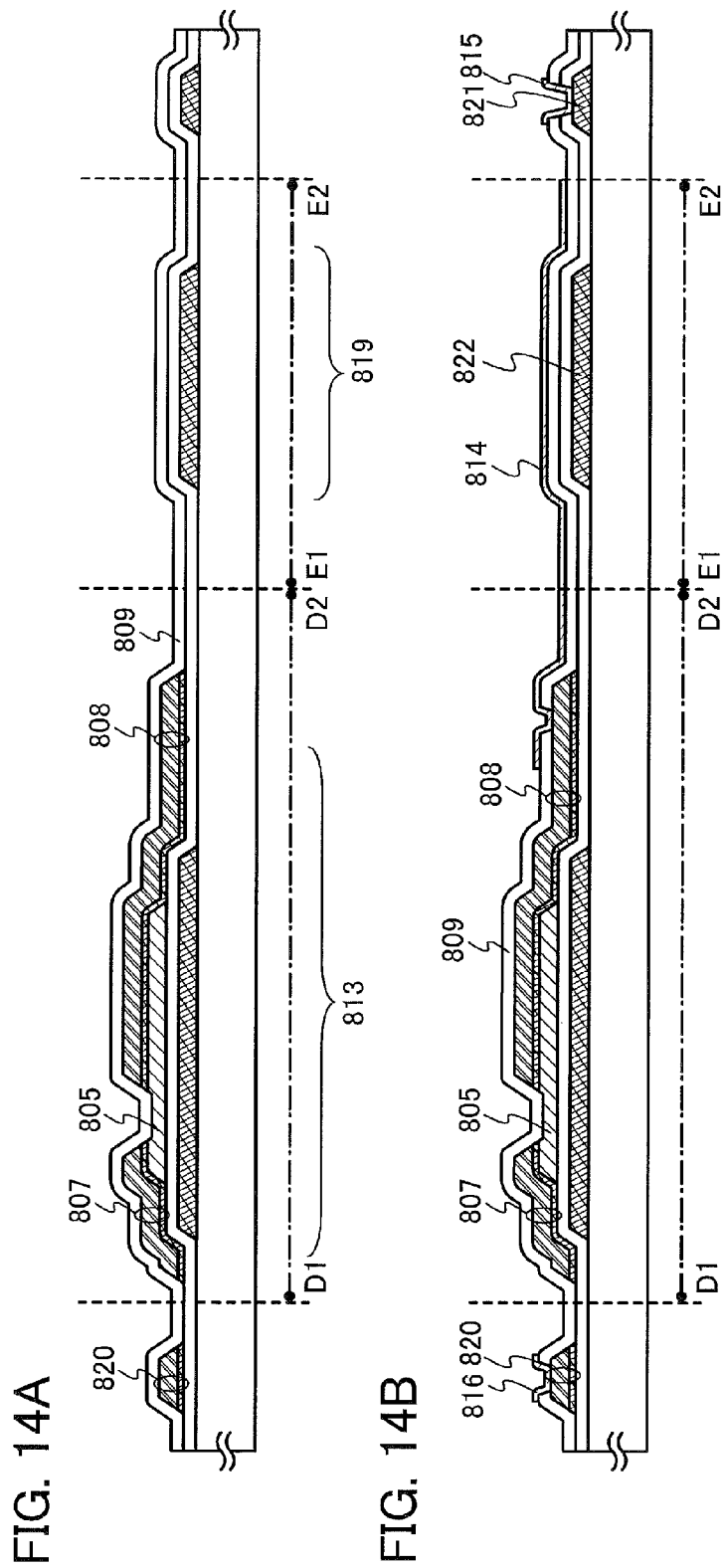
FIGS. 14A and 14B are cross-sectional views illustrating a method for manufacturing a semiconductor device.

As illustrated in FIG. 14A, after the source electrode 807 and the drain electrode 808 are formed, an insulating film 809 is formed so as to cover the source electrode 807, the drain electrode 808, and the oxide semiconductor film 805. The insulating film 809 preferably includes impurities such as moisture or hydrogen as little as possible, and the insulating film 809 may be formed using a single-layer insulating film or a plurality of insulating films stacked. A material having a high barrier property is preferably used for the insulating film 809. For example, as the insulating film having a high barrier property, a silicon nitride film, a silicon nitride oxide film, an aluminum nitride film, an aluminum nitride oxide film, or the like can be used. When a plurality of insulating films stacked is used, an insulating film having lower proportion of nitrogen than the insulating film having a barrier property, such as a silicon oxide film or a silicon oxynitride film, is formed on the side close to the oxide semiconductor film 805. Then, the insulating film having a barrier property is formed so as to overlap with the source electrode 807, the drain electrode 808, and the oxide semiconductor film 805 with the insulating film having lower proportion of nitrogen between the insulating film having a barrier property and the source electrode 807, the drain electrode 808, and the oxide semiconductor film 805. When the insulating film having a barrier property is used, moisture or oxygen can be prevented from being adsorbed on the surfaces of or inside the source electrode 807 and the drain electrode 808. In addition, the impurities such as moisture or hydrogen can be prevented from entering the oxide semiconductor film 805, the gate insulating film 802, or at the interface between the oxide semiconductor film 805 and another insulating film and the vicinity thereof. In addition, the insulating film having lower proportion of nitrogen such as a silicon oxide film or a silicon oxynitride film is formed so as to be in contact with the oxide semiconductor film 805, so that the insulating film formed using a material having a high barrier property can be prevented from being in contact with the oxide semiconductor film 805 directly.

In this embodiment, the insulating film 809 having a structure in which a silicon nitride film having a thickness of 100 nm formed with a sputtering method is stacked over a silicon oxide film having a thickness of 200 nm formed with a sputtering method is formed. The substrate temperature in film formation may be higher than or equal to room temperature and lower than or equal to 300° C. and in this embodiment, is 100° C.

An exposed region of the oxide semiconductor film 805 provided between the source electrode 807 and the drain electrode 808 and the silicon oxide film which forms the insulating film 809 are provided in contact with each other, so that oxygen is supplied to the region of the oxide semiconductor film 805 which is in contact with the insulating film 809, and the resistance of the region is increased (carrier concentration is decreased, preferably, less than $1 \times 10^{18}/cm^3$), whereby the oxide semiconductor film 805 having a channel formation region with high resistance can be formed.

Next, after the insulating film 809 is formed, heat treatment may be performed. The heat treatment is performed at a temperature of higher than or equal to 200° C. and lower than or equal to 400° C. (for example, higher than or equal to 250° C. and lower than or equal to 350° C.) in a reduced atmosphere, an air atmosphere, an inert gas atmosphere (nitrogen, helium, neon, argon, or the like). For example, the second heat treatment is performed in a nitrogen atmosphere at 250° C. for one hour. Alternatively, RTA treatment may be performed at high temperature for a short time as in the previous heat treatment. By the heat treatment, the oxide semiconductor film 805 is heated while being in contact with silicon oxide which forms the insulating film 809. In addition, the resistance of the oxide semiconductor film 805 is increased. Accordingly, electric characteristics of the transistor can be improved and variation in the electric characteristics thereof can be reduced. There is no particular limitation on when to perform this heat treatment as long as it is performed after the formation of the insulating film 809. When this heat treatment also serves as heat treatment in another step, for example, heat treatment in formation of a resin film or heat treatment for reducing resistance of a transparent conductive film, the number of steps can be prevented from increasing.

Through the above steps, a thin film transistor 813 can be manufactured.

Next, a fourth photolithography step is performed in such a manner that a resist mask is formed and the insulating film 809 and the gate insulating film 802 are etched, so that a contact hole is formed to expose parts of the drain electrode 808, the first terminal 821, and the second terminal 820. Next, the resist mask is removed, and then a transparent conductive film is formed. The transparent conductive film is formed of indium oxide ($In_2O_3$), an indium oxide-tin oxide alloy ($In_2O_3$—$SnO_2$, abbreviated to ITO), or the like with a sputtering method, a vacuum evaporation method, or the like. Such a material is etched with a hydrochloric acid-based solution. However, since a residue is easily generated particularly in etching ITO, an indium oxide-zinc oxide alloy ($In_2O_3$—$ZnO$) may be used to improve etching processability. Moreover, in the case where heat treatment for reducing resistance of the transparent conductive film, the heat treatment can also serve as the heat treatment which increases the resistance of the oxide semiconductor film 805 so that improvement and less variation in electric characteristics of the transistor may be achieved.

Next, a fifth photolithography step is performed in such a manner that a resist mask is formed and unnecessary portions are removed by etching, so that a pixel electrode 814 which is connected to the drain electrode 808, a transparent conductive film 815 which is connected to the first terminal 821, and a transparent conductive film 816 which is connected to the second terminal 820 are formed.

The transparent conductive films 815 and 816 function as electrodes or wirings connected to an FPC. The transparent conductive film 815 formed over the first terminal 821 is a connection terminal electrode which functions as an input terminal of the gate wiring. The transparent conductive film 816 formed over the second terminal 820 is a connection terminal electrode which functions as an input terminal of the source wiring.

In this sixth photolithography step, the capacitor wiring 822 and the pixel electrode 814 together form a storage capacitor 819 with the use of the gate insulating film 802 and the insulating film 809 as dielectrics.

A cross-sectional view after the resist mask is removed is illustrated in FIG. 14B. Note that a cross-sectional view taken along dashed line D1-D2 and a cross-sectional view taken along dashed line E1-E2 of FIG. 14B correspond to a cross-sectional view taken along dashed line D1-D2 and a cross-sectional view taken along dashed line E1-E2 in a top view illustrated in FIG. 17, respectively.

Through these six photolithography steps, the storage capacitor 819 and a pixel thin film transistor portion including the thin film transistor 813 which is a bottom-gate thin film transistor having an inverted staggered structure can be completed using the six photomasks. By disposing the thin film transistor and the storage capacitor in each pixel of a pixel portion in which pixels are arranged in a matrix form, one of substrates for manufacturing an active matrix display device can be obtained. In this specification, such a substrate is referred to as an active matrix substrate for convenience.

In the case of manufacturing an active matrix liquid crystal display device, an active matrix substrate and a counter substrate provided with a counter electrode are bonded to each other with a liquid crystal layer interposed therebetween.

Alternatively, a storage capacitor may be formed with a pixel electrode which overlaps with a gate wiring of an adjacent pixel, with an insulating film and a gate insulating film interposed therebetween, without provision of the capacitor wiring.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In the case of manufacturing a light-emitting display device, a bank including an organic resin film is provided between organic light-emitting elements in some cases. In that case, heat treatment performed on the organic resin film can also serve as the heat treatment which increases the resistance of the oxide semiconductor film 805 so that improvement and less variation in electric characteristics of the transistor may be achieved.

The use of an oxide semiconductor for a thin film transistor leads to reduction in manufacturing cost. In particular, impurities such as moisture, hydrogen, or OH are reduced by heat treatment and the purity of the oxide semiconductor film is increased. Therefore, a semiconductor display device including a highly reliable thin film transistor having favorable electric characteristics can be manufactured without using an ultrapure oxide semiconductor target or a special sputtering apparatus in which dew point in the film deposition chamber is reduced.

Since the semiconductor film in the channel formation region is a region whose resistance is increased, electric characteristics of the thin film transistor are stabilized, and increase in off current or the like can be prevented. Therefore, a semiconductor display device including highly reliable thin film transistors having favorable electric characteristics can be provided.

This embodiment can be implemented in combination with embodiments above mentioned.

Embodiment 8

In this embodiment, a structure of a semiconductor display device which is referred to as electronic paper or digital paper and which is one of the semiconductor display devices formed using a manufacturing method of the present invention will be described.

A display element which can control grayscale by voltage application and has memory characteristics is used for electronic paper. Specifically, in the display element used for the electronic paper, a display element such as a non-aqueous electrophoretic display element; a display element which uses a PDLC (polymer dispersed liquid crystal) method, in which liquid crystal droplets are dispersed in a high polymer material which is between two electrodes; a display element which includes chiral nematic liquid crystal or cholesteric liquid crystal between two electrodes; a display element which includes charged fine particles between two electrodes and employs a particle-moving method in which the charged fine particles are moved through fine particles by using an electric field; or the like can be used. Further, a non-aqueous electrophoretic display element may be a display element in which a dispersion liquid, in which charged fine particles are dispersed, is sandwiched between two electrodes; a display element in which a dispersion liquid in which charged fine particles are dispersed is included over two electrodes between which an insulating film is interposed; a display element in which twisting balls having hemispheres which are different colors which charge differently are dispersed in a solvent between two electrodes; a display element which includes microcapsules, in which a plurality of charged fine particles is dispersed in a solution, between two electrodes; or the like.

Figure 18A:
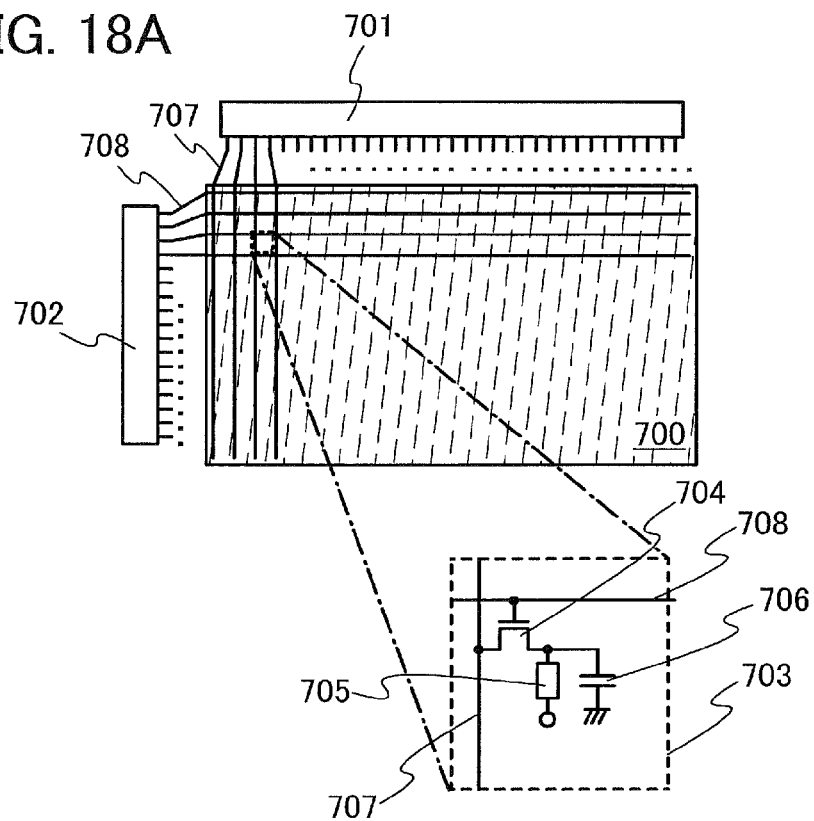
FIG. 18A is a top view of electronic paper and FIG. 18B is a cross-sectional view of electronic paper.

A top view of a pixel portion 700, a signal line driver circuit 701, and a scan line driver circuit 702 of electronic paper is illustrated in FIG. 18A.

The pixel portion 700 includes a plurality of pixels 703. A plurality of signal lines 707 extended from the signal line driver circuit 701 is led in the pixel portion 700. A plurality of scan lines 708 from the scan line driver circuit 702 is led in the pixel portion 700.

Each pixel 703 includes a transistor 704, a display element 705, and a storage capacitor 706. A gate electrode of the transistor 704 is connected to one of the scan lines 708. One of a source electrode and a drain electrode of the transistor 704 is connected to one of the signal lines 707, and the other of the source electrode and the drain electrode of the transistor 704 is connected to a pixel electrode of the display element 705.

Note that in FIG. 18A, the storage capacitor 706 is connected in parallel to the display element 705 so that voltage applied between the pixel electrode and a counter electrode of the display element 705 may be stored; however, in the case where the memory property of the display element 705 is sufficiently high that display can be maintained, the storage capacitor 706 is not necessarily provided.

Although an active matrix pixel portion structure in which one transistor which serves as a switching element is provided in each pixel is illustrated in FIG. 18A, the electronic paper of one embodiment of the present invention is not limited to this structure. A plurality of transistors may be provided in each pixel. Further, besides transistors, elements such as capacitors, resistors, coils, or the like may also be connected to the pixels.

Figure 18B:
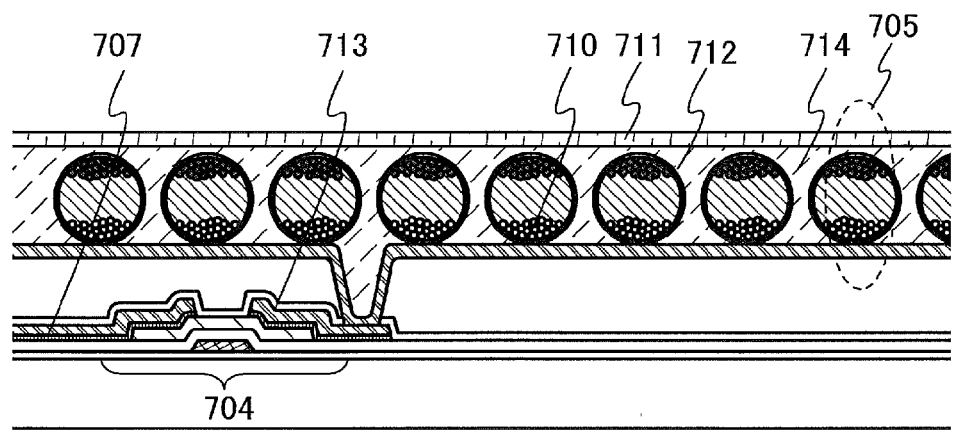

A cross-sectional view of the display element 705 provided in each pixel 703 is illustrated in FIG. 18B taking an electrophoretic electronic paper having microcapsules as an example.

The display element 705 has a pixel electrode 710, a counter electrode 711, and a microcapsule 712 to which voltage is applied by the pixel electrode 710 and the counter electrode 711. One of a source electrode and a drain electrode 713 of the transistor 704 is connected to the pixel electrode 710.

In the microcapsule 712, positively charged white pigment such as titanium oxide and negatively charged black pigment such as carbon black are encapsulated together with a dispersion medium such as oil. In accordance with the voltage of a video signal applied to the pixel electrode 710, voltage is applied between the pixel electrode and the counter electrode, and the negatively charged black pigment is attracted to a positive electrode side and the positively charged white pigment is attracted to a negative electrode side, whereby gray scales can be displayed.

In FIG. 18B, the microcapsule 712 is fixed between the pixel electrode 710 and the counter electrode 711 using a light-transmitting resin 714. However, one embodiment of the present invention is not limited to this structure, and a space formed by the microcapsule 712, the pixel electrode 710, and the counter electrode 711 may be filled with a gas such as air, an inert gas, or the like. Note that in this case, the microcapsule 712 is preferably fixed to one of or both the pixel electrode 710 and the counter electrode 711 using an adhesive agent or the like.

The number of the microcapsules 712 included in the display element 705 is not always more than one as illustrated in FIG. 18B. One display element 705 may have a plurality of the microcapsules 712, or a plurality of the display elements 705 may have one microcapsule 712. For example, when two display elements 705 share one microcapsule 712, positive voltage is applied to the pixel electrode 710 included in one of the display elements 705 and negative voltage is applied to the pixel electrode 710 included in the other display element 705. In this case, in a region of the microcapsule 712 which overlaps with the pixel electrode 710 to which positive voltage is applied, the black pigment is attracted to the pixel electrode 710 side and the white pigment is attracted to the counter electrode 711 side. On the other hand, in a region of the microcapsule 712 which overlaps with the pixel electrode 710 to which negative voltage is applied, the white pigment is attracted to the pixel electrode 710 side and the black pigment is attracted to the counter electrode 711 side.

Next, a specific driving method of the electronic paper will be described taking the electrophoretic electronic paper as an example.

The operation of the electronic paper can be described using three periods: an initialization period, a write period, and a retention period.

Before a displayed image is switched, first, a display element is initialized by unifying gray scale levels of each pixel in a pixel portion in the initialization period. The display element is initialized, whereby an afterimage can be prevented from remaining. Specifically, in the electrophoretic electronic paper, a gray scale displayed by the microcapsule 712 included in the display element 705 is adjusted so that each pixel may display white or black.

In this embodiment, the operation of initialization in which after a video signal for initialization such that black is displayed is input to the pixel, a video signal for initialization such that white is displayed is input to the pixel will be described. For example, in the case of electrophoretic electronic paper in which display of an image is performed towards the counter electrode 711 side, first, voltage is applied to the display element 705 so that the black pigment may be attracted to the counter electrode 711 side and the white pigment may be attracted to the pixel electrode 710 side in the microcapsule 712. Next, voltage is applied to the display element 705 so that the white pigment is attracted to the counter electrode 711 side and the black pigment is attracted to the pixel electrode 710 side in the microcapsule 712.

If a video signal for initialization is input to the pixel only once, depending on a gray scale which has been displayed before the initialization period, transfer of the white pigment and the black pigment in the microcapsule 712 ends in mid-stream, and there might be a difference in a gray scale to be displayed among the pixels when the initialization period is terminated. Therefore, it is preferable that voltage −Vp which is negative with respect to common voltage Vcom be applied to the pixel electrode 710 more than once, so that black may be displayed, whereas voltage Vp which is positive with respect to the common voltage Vcom be applied to the pixel electrode 710 more than once, so that white may be displayed.

Note that when gray scales displayed by display elements of each pixel differ before the initialization period, the minimum number of times of inputting video signals for initialization varies. Accordingly, the number of times of inputting video signals for initialization may be changed among the pixels in accordance with the gray scales which have been displayed before the initialization period. In this case, the common voltage Vcom may be input to the pixel which does not need to input a video signal for initialization.

Note that in order to apply voltage Vp or voltage −Vp of the video signal for initialization to the pixel electrode 710 more than once, in a period where a pulse of a selection signal is provided to each scan line, a series of operations are performed more than once in which the video signal for initialization is input to the pixels in a line having the scan line. When voltage Vp or voltage −Vp of the video signal for initialization is applied to the pixel electrode 710 more than once, transfer of the white pigment and the black pigment in the microcapsule 712 converges and a difference in a gray scale level among the pixels is prevented, whereby the pixel in the pixel portion can be initialized.

Note that in the initialization period, black may be displayed after white is displayed instead of displaying white after black is displayed in each pixel. Alternatively, in the initialization period, black may be displayed after white is displayed in each pixel, and then white may be displayed.

Further, as for all of the pixels in the pixel portion, the timing of starting the initialization period is not necessarily the same. For example, the timing of starting the initialization period may be different among every pixel, or every pixel belonging to the same line, or the like.

Next, in the write period, a video signal having image information is input to the pixel.

When an image is displayed on the whole pixel portion, the selection signal in which pulses of voltage sequentially shift through all the scan lines is input in one frame period. Then, in one line period when the pulse appears in the selection signal, a video signal having image information is input to all the signal lines.

In accordance with the voltage of a video signal applied to the pixel electrode 710, the white pigment and the black pigment in the microcapsule 712 transfer to the pixel electrode 710 side or the counter electrode 711 side, so that the display element 705 displays a gray scale.

Note that also in the write period, it is preferable that the voltage of a video signal be applied to the pixel electrode 710 more than once in a manner similar to that in the initialization period. Accordingly, in the period when a pulse of a selection signal is supplied to each scan line, a series of operations are performed more than once in which a video signal is input to the pixels in a line having the scan line.

Next, in the retention period, after the common voltage Vcom is input to all the pixels through the signal line, a selection signal is not input to the scan line or a video signal is not input to the signal line. Accordingly, since the arrangement of the white pigment and the black pigment in the microcapsule 712 included in the display element 705 is kept at the same position unless positive or negative voltage is applied between the pixel electrode 710 and the counter electrode 711, a gray scale which is displayed by the display element 705 is kept. Therefore, an image written in the write period is held also in the retention period.

Note that voltage required to change the gray scale levels of the display element used for electronic paper tends to be higher than those of a liquid crystal element used for a liquid crystal display device or a light-emitting element such as an organic light-emitting element used for a light-emitting device. Therefore, in the write period, a potential difference between a source electrode and a drain electrode of the transistor 704 used as a switching element in the pixel increases, so that the off-state current of the transistor 704 increases; therefore a potential of the pixel electrode 710 fluctuates and distorted images easily occur. It is effective to increase the capacity of the storage capacitor 706 in order to prevent the potential of the pixel electrode 710 from fluctuating due to the off-state current of the transistor 704. In addition, not only voltage generated between the pixel electrode 710 and the counter electrode 711 but also voltage generated between the signal line 707 and the counter electrode 711 is applied to the microcapsule 712, so that distorted images are displayed by the display element 705 in some cases. In order to prevent generation of this distorted image, it is effective to have a large area of the pixel electrode 710 and to prevent application of voltage which is generated between the signal line 707 and the counter electrode 711 to the microcapsule 712. However, as described above, when the capacity of the storage capacitor 706 increases in order to prevent fluctuation of the potential of the pixel electrode 710 or the area of the pixel electrode 710 increases in order to prevent generation of distorted images on the display, a current value which should be supplied to the pixel in the write period increases, so that it takes time to input a video signal. In the electronic paper of one embodiment of the present invention, the transistor 704 used as a switching element in the pixel has high field effect mobility, so that high on-state current can be obtained. Accordingly, even when the capacity of the storage capacitor 706 increases or even when the area of the pixel electrode 710 increases, a video signal can be input to the pixel quickly. Therefore, the length of the write period can be suppressed, and displayed images can be switched smoothly. In addition, the potential difference between the source electrode and the drain electrode of the transistor 704 used as a switching element in the pixel increases in the write period, so that the transistor 704 easily deteriorates. However, in one embodiment of the present invention, variation in threshold voltage of the transistor 704 due to degradation over time can be reduced, so that reliability of the electronic paper can be enhanced.

This embodiment can be implemented in combination with embodiments above mentioned.

Embodiment 9

Figure 19A:
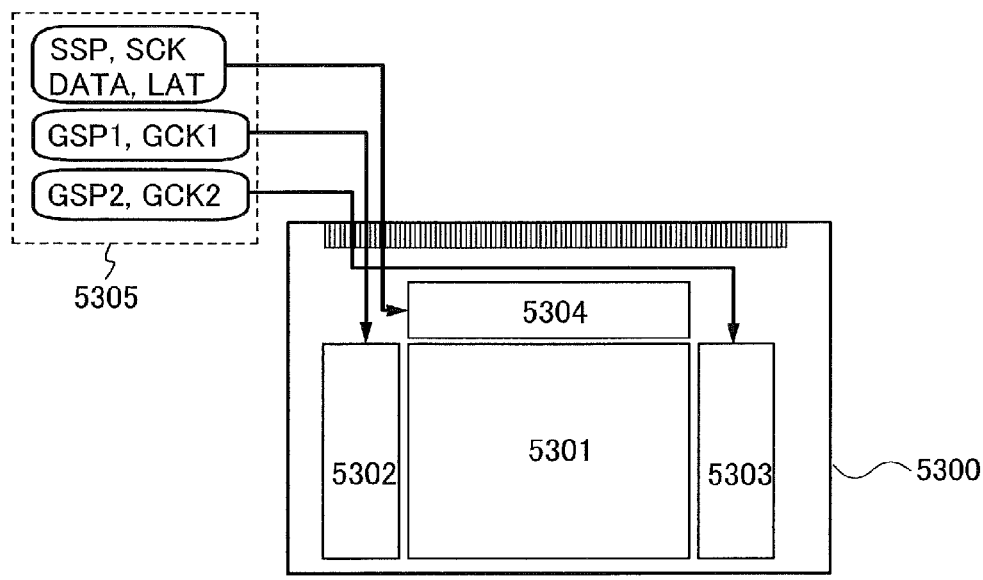
FIGS. 19A and 19B are bloc diagrams of semiconductor display devices.

FIG. 19A is an example of a block diagram of an active matrix semiconductor display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines which is extended from the signal line driver circuit 5304 is provided and a plurality of scan lines which is extended from the first scan line driver circuit 5302 and the second scan line driver circuit 5303 is provided. Note that pixels which include display elements are provided in a matrix form in respective regions where the scan lines and the signal lines intersect with each other. Further, the substrate 5300 in the display device is connected to a timing control circuit 5305 (also referred to as a controller or a controller IC) through a connection point such as a flexible printed circuit (FPC).

In FIG. 19A, the first scan line driver circuit 5302, the second scan line driver circuit 5303, and the signal line driver circuit 5304 are formed over one substrate 5300 where the pixel portion 5301 is formed. Therefore, a decrease in the number of parts provided outside, such as a driver circuit, enables not only downsizing of a display device but also reduction in cost due to the decrease in the number of assembly steps and inspection steps. In addition, in the case where a driver circuit is provided outside the substrate 5300, wirings would need to be extended and the number of the connections of wirings would be increased, but by providing the driver circuit over the substrate 5300, the number of connections of the wirings can be reduced. Accordingly, the decrease in yield due to poor connection between the driver circuit and the pixel portion can be prevented, and the decrease in reliability due to low mechanical strength of a connection point can be prevented.

Note that for example, the timing control circuit 5305 supplies a first scan line driver circuit start signal (GSP1) (a start signal is also referred to as a start pulse) and a scan line driver circuit clock signal (GCK1) to the first scan line driver circuit 5302. The timing control circuit 5305 supplies, for example, a second scan line driver circuit start signal (GSP2) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. One of the first scan line driver circuit 5302 and the second scan line driver circuit 5303 can be omitted.

Figure 19B:
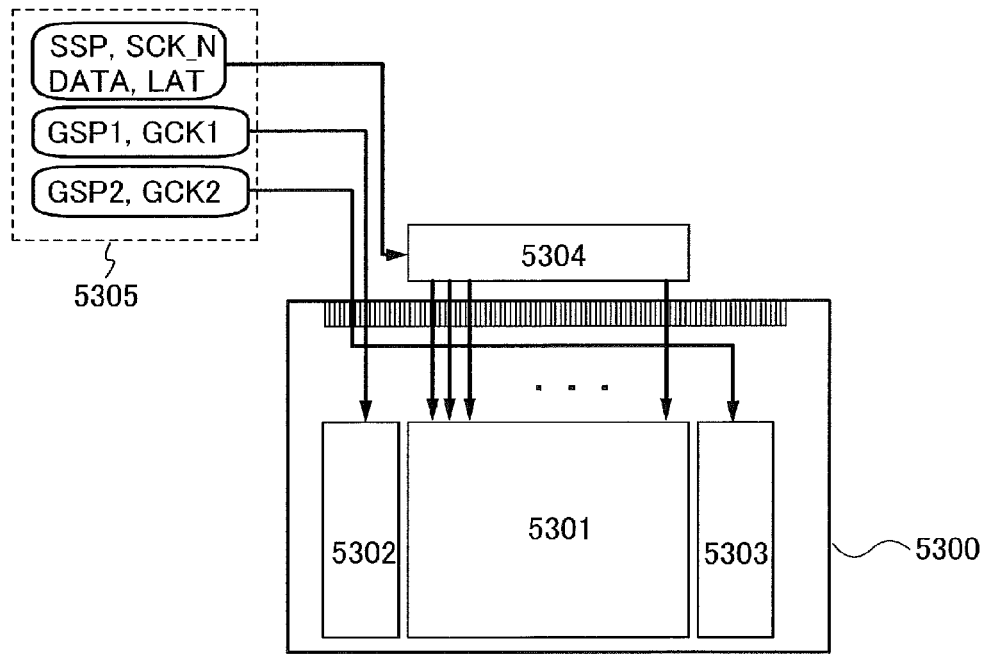

FIG. 19B illustrates a structure in which circuits with low driving frequency (for example, the first scan line driver circuit 5302 and the second scan line driver circuit 5303) are formed over one substrate 5300 where the pixel portion 5301 is formed and the signal line driver circuit 5304 is formed over a different substrate from the pixel portion 5301. In the signal line driver circuit 5304, a circuit with low driving frequency such as an analog switch used for a sampling circuit can be partly formed over one substrate 5300 where the pixel portion 5301 is formed. In this manner, a system on panel is partly adopted, so that advantages of the system on panel can be given to some extent; for example, a decrease in yield due to the above-described poor connection, a decrease in the mechanical strength of a connection portion, and the like are prevented, and cost is reduced because of the decrease in the number of assembly steps and inspection steps. Further, performance of a circuit with high driving frequency can be enhanced by comparison with the case where all of the pixel portion 5301, the scan line driver circuit 5302, the scan line driver circuit 5303, and the signal line driver circuit 5304 are formed over one substrate as a system-on-panel, and a pixel portion with a wide area, which is difficult to be realized in the case of using a single crystal semiconductor, can be formed.

Next, a structure of a signal line driver circuit formed using an n-channel transistor will be described.

Figure 20A:
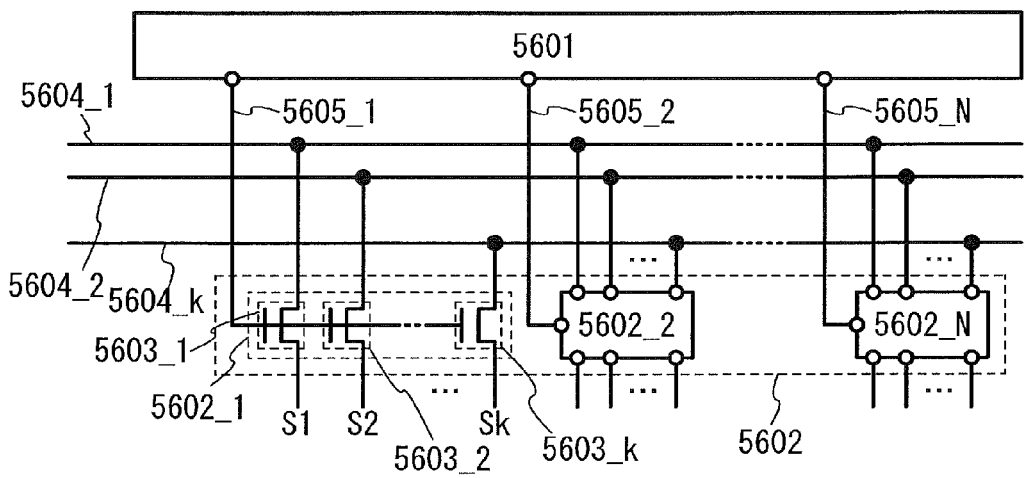
FIG. 20A is a diagram of a structure of a signal line driver circuit and FIG. 20B is a timing chart.

The signal line driver circuit illustrated in FIG. 20A includes a shift register 5601 and a sampling circuit 5602. The sampling circuit 5602 includes a plurality of switching circuits 5602_1 to 5602_N (N is a natural number). The switching circuits 5602_1 to 5602_N are each constituted by a plurality of n-channel transistors 5603_1 to 5603_$k$ ($k$ is a natural number).

A connection relation of the signal line driver circuit will be described using the switching circuit 5602_1 as an example. Note that one of a source electrode and a drain electrode of a transistor is denoted as a first terminal, and the other is denoted to as a second terminal below.

First terminals of the transistors 5603_1 to 5603_$k$ are connected to wirings 5604_1 to 5604_$k$, respectively. Note that a video signal is input to each of the wirings 5604_1 to 5604_$k$. Second terminals of the transistors 5603_1 to 5603_$k$ are connected to signal lines S1 to S$k$, respectively. Gate electrodes of the transistors 5603_1 to 5603_$k$ are connected to the shift register 5601.

The shift register 5601 has a function of sequentially selecting the switching circuits 5602_1 to 5602_N by sequentially outputting a timing signal having high level (H-level) voltage to wirings 5605_1 to 5605_N.

The switching circuit 5602_1 has a function of controlling electrical continuity between the wirings 5604_1 to 5604_$k$ and the signal lines S1 to S$k$ (conduction between the first terminal and the second terminal) due to the switching of the transistors 5603_1 to 5603_$k$, namely a function of controlling whether or not to supply potentials of the wirings 5604_1 to 5604_$k$ to the signal lines S1 to S$k$.

Figure 20B:
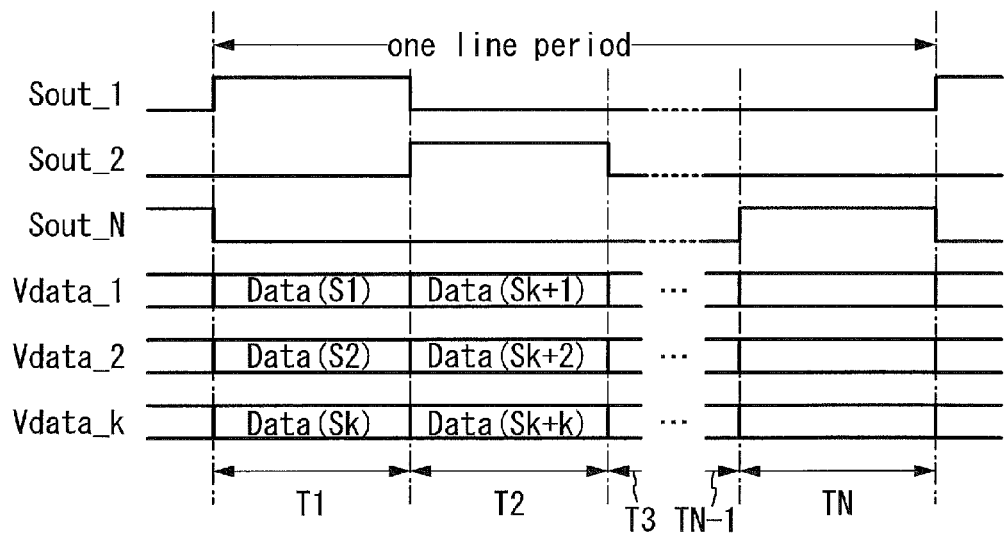

Next, the operation of the signal line driver circuit in FIG. 20A is described with reference to a timing chart in FIG. 20B. In FIG. 20B, the timing chart of the timing signals Sout_1 to Sout_N which are input from the shift register 5601 to the wirings 5605_1 to 5605_N and video signals Vdata_1 to Vdata_k which are input to the wirings 5604_1 to 5604_k is illustrated as an example.

Note that one operation period of the signal line driver circuit corresponds to one line period in a display device. In FIG. 20B, the case is illustrated in which one line period is divided into periods T1 to TN. Each of the periods T1 to TN is a period for writing the video signal into one pixel in a selected line.

In the periods T1 to TN, the shift register 5601 sequentially outputs H-level timing signals to the wirings 5605_1 to 5605_N. For example, in the period T1, the shift register 5601 outputs an H level signal to the wiring 5605_1. Then, the transistors 5603_1 to 5603_k included in the switching circuit 5602_1 are turned on, so that the wirings 5604_1 to 5604_k and the signal lines S1 to Sk are brought into conduction. In this case, Data (S1) to Data (Sk) are input to the wirings 5604_1 to 5604_k, respectively. The Data (S1) to Data (Sk) are input to pixels in the first to kth columns in the selected row through the transistors 5603_1 to 5603_k. Thus, in the periods T1 to TN, video signals are sequentially written to the pixels in the selected row by k columns.

By writing video signals to pixels by a plurality of columns, the number of video signals or the number of wirings can be reduced. Thus, the number of connections to an external circuit such as a controller can be reduced. By writing video signals to pixels of every plurality of columns, write time can be extended and insufficient writing of video signals can be prevented.

Next, one embodiment of a shift register which is used for a signal line driver circuit or a scan line driver circuit is described with reference to FIGS. 21A and 21B and FIGS. 22A and 22B.

Figure 21A:
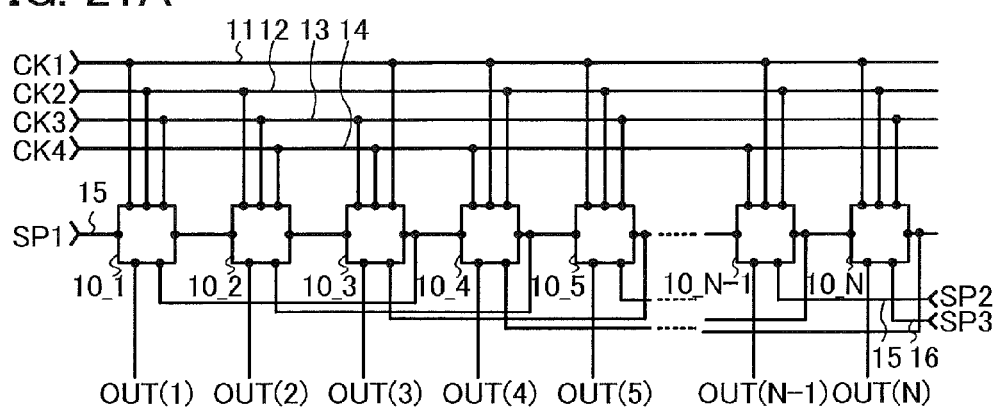
FIGS. 21A and 21B are circuit diagrams illustrating a structure of a shift register.

The shift register includes first to Nth pulse output circuits 10_1 to 10_N (N is a natural number of 3 or more) (see FIG. 21A). A first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) from a fifth wiring 15 is input to the first pulse output circuit 10_1. Further, a signal from the pulse output circuit 10_(n-1) of the previous stage (referred to as a previous stage signal OUT (n-1)) is input to the nth pulse output circuit 10_n (n is a natural number of 2 or more and N or less) in a second or subsequent stage. A signal from the third pulse output circuit 10_3 which is two stages after the first pulse output circuit 10_1 is input to the first pulse output circuit 10_1. In a similar way, a signal from the (n+2)th pulse output circuit 10_(n+2) which is two stages after the nth pulse output circuit 10_n (referred to as the subsequent stage signal OUT(n+2)) is input to the nth pulse output circuit 10_n in the second stage or subsequent stage. Thus, the pulse output circuits of the respective stages output first output signals (OUT(1)(SR) to OUT(N)(SR)) to be input to the pulse output circuit of the subsequent stage and/or to the pulse output circuit of the stage before the previous stage, and second output signals (OUT(1) to OUT(N)) to be input to another circuit or the like. Note that as illustrated in FIG. 21A, a subsequent stage signal OUT(n+2) is not input to the last two stages of the shift register; therefore, as an example, a second start pulse SP2 and a third start pulse SP3 may be input thereto, respectively.

Note that the clock signal (CK) is a signal which alternates between an H level and an L level (low level voltage) at a regular interval. The first to fourth clock signals (CK1) to (CK4) are delayed by ¼ period sequentially. In this embodiment, by using the first to fourth clock signals (CK1) to (CK4), control or the like of driving of a pulse output circuit is performed. Note that the clock signal is also called GCK or SCK in accordance with a driver circuit to which the clock signal is input; however, description is made using CK as the clock signal.

A first input terminal 21, a second input terminal 22, and a third input terminal 23 are electrically connected to any of the first to fourth wirings 11 to 14. For example, in FIG. 21A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 21B:
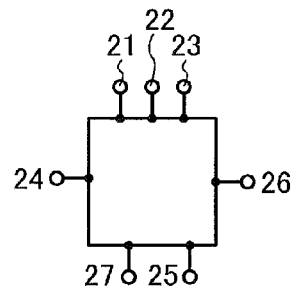

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 21B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent stage signal OUT(3) is input to the fifth input terminal 25; the first output signal OUT(1)(SR) is output from the first output terminal 26; and the second output signal OUT(1) is output from the second output terminal 27.

Next, an example of a specific circuit structure of a pulse output circuit will be described with reference to FIG. 22A.

Figure 22A:
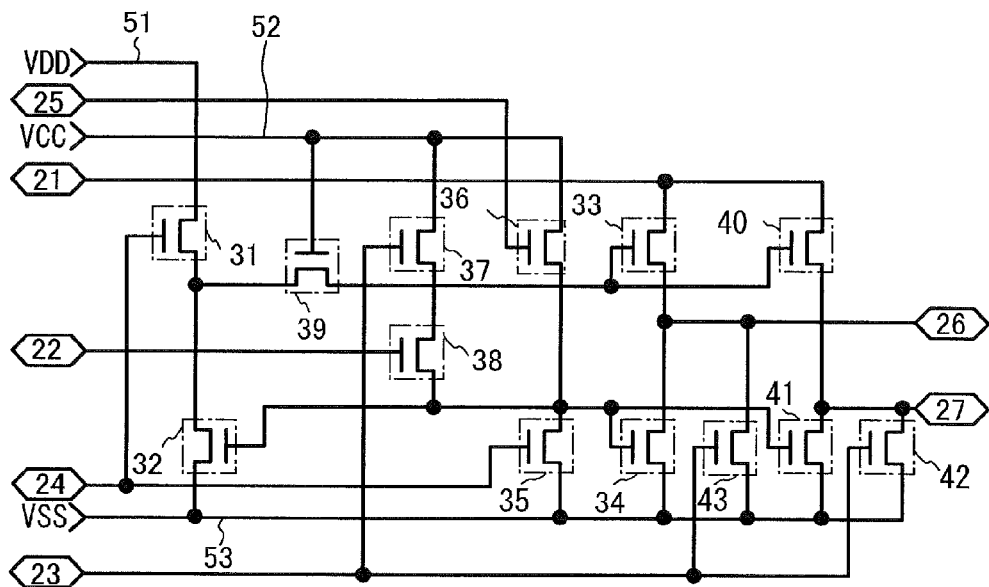
FIG. 22A is a circuit diagram and FIG. 22B is a timing chart illustrating operations of a shift register.

Each pulse output circuit includes first to thirteenth transistors 31 to 43 (see FIG. 22A). Signals or power supply potentials are supplied to the first to thirteenth transistors 31 to 43 from a power supply line 51 which supplies a first high power supply potential VDD, a power supply line 52 which supplies a second high power supply potential VCC, and a power supply line 53 which supplies a low power supply potential VSS, in addition to the above-described first to fifth input terminals 21 to 25, the first output terminal 26, and the second output terminal 27. The relation of the power supply potentials of the power supply lines in FIG. 22A is as follows: the first power supply potential VDD is higher than or equal to the second power supply potential VCC, and the second power supply potential VCC is higher than the third power supply potential VSS. The first to fourth clock signals (CK1) to (CK4) are signals which become H-level signals and L-level signals repeatedly at a regular interval. The potential is VDD when the clock signal is at the H level, and the potential is VSS when the clock signal is at the L level. By making the first power supply potential VDD of the power supply line 51 higher than the second power supply potential VCC of the power supply line 52, a potential applied to a gate electrode of a transistor can be lowered, shift in threshold voltage of the transistor can be reduced, and deterioration of the transistor can be suppressed without an adverse effect on the operation of the transistor.

In FIG. 22A, a first terminal of the first transistor 31 is electrically connected to the power supply line 51, a second terminal of the first transistor 31 is electrically connected to a first terminal of the ninth transistor 39, and a gate electrode of the first transistor 31 is electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and a gate electrode of the sixth transistor 36 is electrically connected to the fifth input terminal 25. A first terminal of the seventh transistor 37 is electrically connected to the power supply line 52, a second terminal of the seventh transistor 37 is electrically connected to a second terminal of the eighth transistor 38, and a gate electrode of the seventh transistor 37 is electrically connected to the third input terminal 23. A first terminal of the eighth transistor 38 is electrically connected to the gate electrode of the second transistor 32 and the gate electrode of the fourth transistor 34, and a gate electrode of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and a gate electrode of the ninth transistor 39 is electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrode of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrode of the seventh transistor 37.

In FIG. 22A, a connection point of the gate electrode of the third transistor 33, the gate electrode of the tenth transistor 40, and the second terminal of the ninth transistor 39 is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 22A).

Figure 22B:
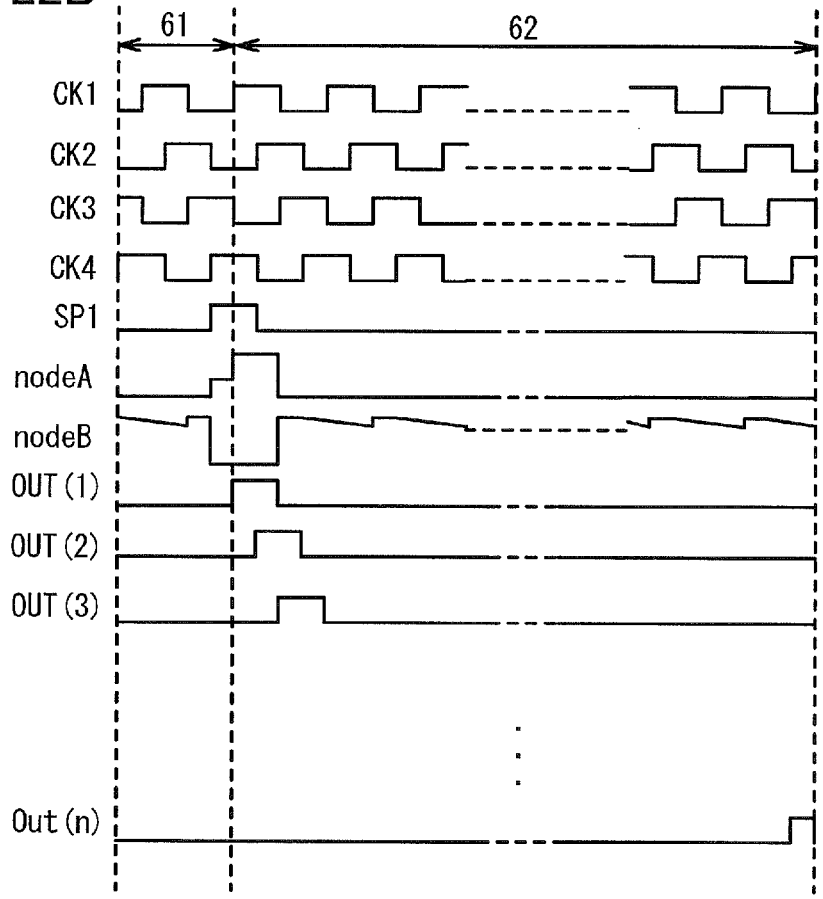

FIG. 22B illustrates a timing chart of a shift register including a plurality of the pulse output circuits illustrated in FIG. 22A.

Note that as illustrated in FIG. 22A, by providing of the ninth transistor 39 whose gate electrode is supplied with the second power supply potential VCC, advantages described below are obtained before and after bootstrap operation.

Without the ninth transistor 39 in which the second power supply potential VCC is applied to the gate electrode, if a potential of the node A is raised by the bootstrap operation, a potential of the source electrode which is the second terminal of the first transistor 31 rises to a value higher than the first power supply potential VDD. Then, the first terminal of the first transistor 31, namely the power supply line 51, becomes to serve as the source electrode thereof. Consequently, in the first transistor 31, high bias voltage is applied and thus significant stress is applied between the gate electrode and the source electrode and between the gate electrode and the drain electrode, which might cause deterioration of the transistor. By providing of the ninth transistor 39 whose gate electrode is supplied with the second power supply potential VCC, the potential of the node A is raised by the bootstrap operation, but at the same time, an increase in the potential of the second terminal of the first transistor 31 can be prevented. In other words, the placement of the ninth transistor 39 can lower the level of negative bias voltage applied between the gate electrode and the source electrode of the first transistor 31. Accordingly, with a circuit structure in this embodiment, negative bias voltage applied between the gate electrode and the source electrode of the first transistor 31 can be lowered, so that deterioration of the first transistor 31, which is due to stress, can be further restrained.

Note that the ninth transistor 39 is provided so as to be connected between the second terminal of the first transistor 31 and the gate electrode of the third transistor 33 through the first terminal and the second terminal thereof. Note that when the shift register including a plurality of pulse output circuits in this embodiment is included in a signal line driver circuit having a larger number of stages than a scan line driver circuit, the ninth transistor 39 may be omitted, which is advantageous in that the number of transistors is reduced.

Note that an oxide semiconductor is used for active layers of the first to thirteenth transistors 31 to 43; thus, the off-state current of the transistors can be reduced, the on-state current and field effect mobility can be increased, and the degree of deterioration of the transistors can be reduced; thus a malfunction in a circuit can be reduced. Further, the degree of deterioration of the transistor formed using oxide semiconductor caused by applying high potential to the gate electrode is small as compared to the transistor formed using amorphous silicon. Therefore, even when the first power supply potential VDD is supplied to a power supply line to which the second power supply potential VCC is supplied, similar operation can be performed, and the number of power supply lines which are provided in a circuit can be reduced, so that the circuit can be miniaturized.

Note that a similar effect is obtained even when the connection relation is changed so that a clock signal that is supplied to the gate electrode of the seventh transistor 37 from the third input terminal 23 and a clock signal that is supplied to the gate electrode of the eighth transistor 38 from the second input terminal 22 may be supplied from the second input terminal 22 and the third input terminal 23, respectively. In this case, in the shift register illustrated in FIG. 22A, the state is changed from the state where both the seventh transistor 37 and the eighth transistor 38 are turned on, to the state where the seventh transistor 37 is turned off and the eighth transistor 38 is turned on, and then to the state where both the seventh transistor 37 and the eighth transistor 38 are turned off; thus, the fall in a potential of the node B due to a fall in the potentials of the second input terminal 22 and the third input terminal 23 is caused twice by a fall in the potential of the gate electrode of the seventh transistor 37 and a fall in the potential of the gate electrode of the eighth transistor 38. On the other hand, in the case where a state of the seventh transistor 37 and the eighth transistor 38 in the shift register illustrated in FIG. 22A is changed in such a manner that both the seventh transistor 37 and the eighth transistor 38 are turned on, then the seventh transistor 37 is turned on and the eighth transistor 38 is turned off, and then the seventh transistor 37 and the eighth transistor 38 are turned off, the fall in potential of the node B, which is caused by a fall in potentials of the second input terminal 22 and the third input terminal 23, is caused only once by a fall in the potential of the gate electrode of the eighth transistor 38. Accordingly, the connection relation, that is, the clock signal CK3 is supplied to the gate electrodes (the lower electrode and the upper electrode) of the seventh transistor 37 through the third input terminal 23 and the clock signal CK2 is supplied to the gate electrodes (the lower gate electrode and the upper gate electrode) of the eighth transistor 38 through the second input terminal 22, is preferable. That is because the number of times of the change in the potential of the node B can be reduced, whereby the noise can be reduced.

In this way, in a period during which the potentials of the first output terminal 26 and the second output terminal 27 are held at the L level, the H level signal is regularly supplied to the node B; therefore, malfunction of a pulse output circuit can be suppressed.

This embodiment can be implemented in combination with embodiments above mentioned.

Embodiment 10

In a liquid crystal display device according to one embodiment of the present invention, a highly reliable thin film transistor with high mobility and on-state current is used; therefore, the liquid crystal display device according to one embodiment of the present invention has high contrast and high visibility. In this embodiment, a structure of the liquid crystal display device according to one embodiment of the present invention will be described.

Figure 23:
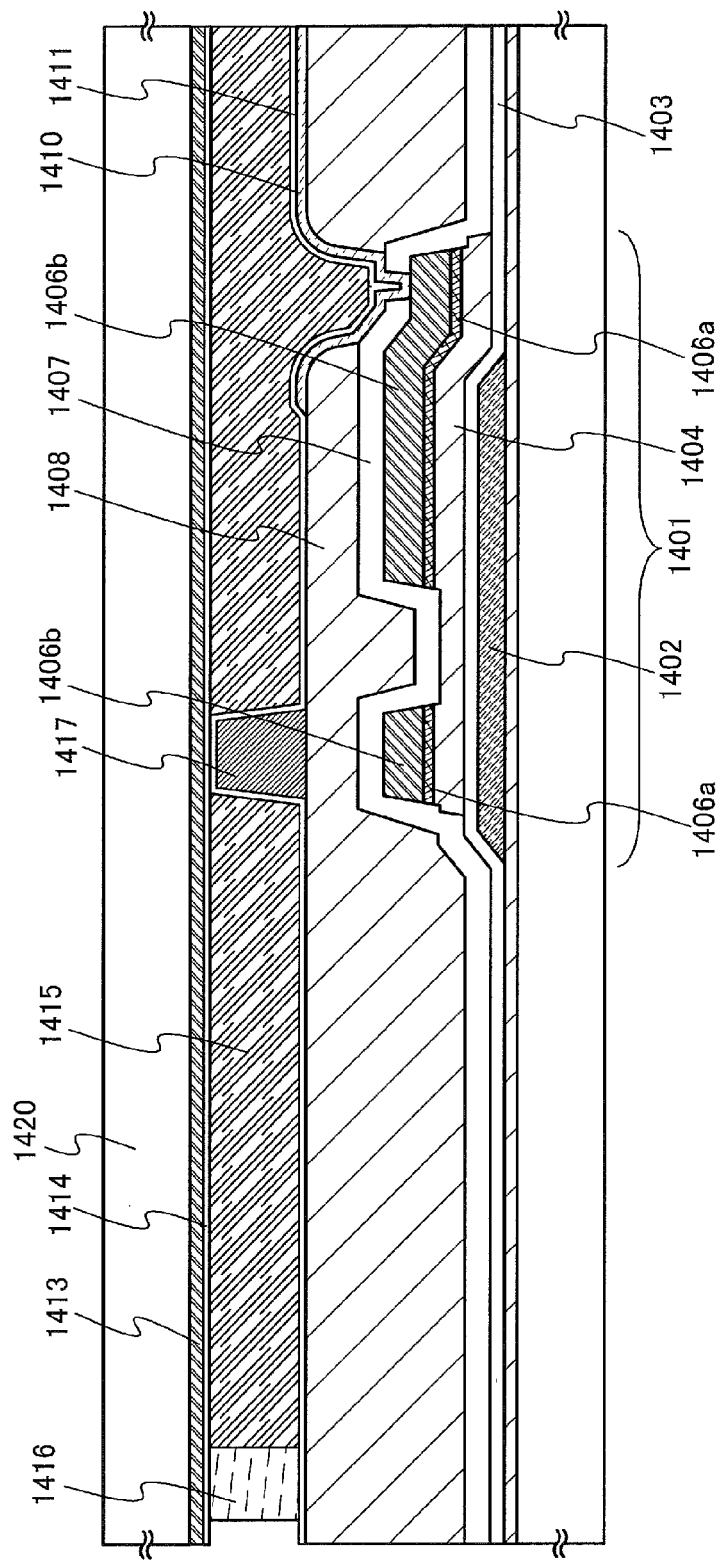
FIG. 23 is a cross-sectional view of a liquid crystal display device.

FIG. 23 is a cross-sectional view of a pixel of a liquid crystal display device according to one embodiment of the present invention, as an example. A thin film transistor 1401 illustrated in FIG. 23 has a gate electrode 1402 formed over an insulating surface, a gate insulating film 1403 over the gate electrode, an oxide semiconductor film 1404 which is over the gate insulating film 1403 and which overlaps with the gate electrode 1402, and a pair of a conductive film 1406a and a conductive film 1406b which function as a source electrode and a drain electrode and which are sequentially stacked over the oxide semiconductor film 1404.

Further, the thin film transistor 1401 may include an insulating film 1407 formed over the oxide semiconductor film 1404 as its component. The insulating film 1407 is formed so as to cover the gate electrode 1402, the gate insulating film 1403, the oxide semiconductor film 1404, the conductive film 1406a, and the conductive film 1406b.

Note that in this embodiment, the source electrode and the drain electrode which are formed in accordance with the manufacturing method described in Embodiment 1 are given as an example; however, the source electrode and the drain electrode which are formed in accordance with the manufacturing method described in any of Embodiments 2 to 4 may be used.

An insulating film 1408 is formed over the insulating film 1407. Part of the insulating film 1407 and the insulating film 1408 is provided with an opening, and a pixel electrode 1410 is formed so as to be in contact with one of the conductive films 1406b in the opening.

Further, a spacer 1417 for controlling a cell gap of a liquid crystal element is formed over the insulating film 1408. An insulating film is etched to have a desired shape, so that the spacer 1417 can be formed. A cell gap may also be controlled by dispersing a filler over the insulating film 1408.

An alignment film 1411 is formed over the pixel electrode 1410. Further, a counter electrode 1413 is provided in a position opposed to the pixel electrode 1410, and an alignment film 1414 is formed on the side of the counter electrode 1413 which is close to the pixel electrode 1410. The alignment film 1411 and the alignment film 1414 can be formed using an organic resin such as polyimide or polyvinyl alcohol. Alignment treatment such as rubbing is performed on their surfaces in order to align liquid crystal molecules in certain direction. Rubbing can be performed by rolling a roller wrapped with cloth of nylon or the like while applying pressure on the alignment films so that the surfaces of the alignment films are rubbed in certain direction. Note that it is also possible to form the alignment films 1411 and 1414 that have alignment characteristics by using an inorganic material such as silicon oxide with an evaporation method, without alignment process.

Furthermore, a liquid crystal 1415 is provided in a region which is surrounded by a sealant 1416 between the pixel electrode 1410 and the counter electrode 1413. Injection of the liquid crystal 1415 may be performed with a dispenser method (dripping method) or a dipping method (pumping method). Note that a filler may be mixed in the sealant 1416.

The liquid crystal element formed using the pixel electrode 1410, the counter electrode 1413, and the liquid crystal 1415 may overlap with a color filter through which light in a particular wavelength region can pass. The color filter may be formed on a substrate (counter substrate) 1420 provided with the counter electrode 1413. The color filter can be selectively formed by photolithography after application of an organic resin such as an acrylic-based resin in which pigment is dispersed on the substrate 1420. Alternatively, the color filter can be selectively formed by etching after application of a polyimide-based resin in which pigment is dispersed on the substrate 1420. Alternatively, the color filter can be selectively formed with a droplet discharge method such as an ink jet method.

A light-blocking film which can block light may be formed in the pixels so that disclination due to variations between the pixels in the alignment of the liquid crystal 1415 is prevented from seeing. The light-blocking film can be formed using an organic resin containing a black pigment such as a carbon black or titanium lower oxide. Alternatively, a film of chromium can be used for the light-blocking film.

The pixel electrode 1410 and the counter electrode 1413 can be formed using a transparent conductive material such as indium tin oxide including silicon oxide (ITSO), indium tin oxide (ITO), zinc oxide (ZnO), indium zinc oxide (IZO), or gallium-doped zinc oxide (GZO), for example. Note that this embodiment describes an example of manufacturing a transmissive type liquid crystal element by using a light-transmitting conductive film for the pixel electrode 1410 and the counter electrode 1413; however, one embodiment of the present invention is not limited to this structure. The liquid crystal display device according to one embodiment of the present invention may be a transreflective liquid crystal display device or a reflective liquid crystal display device.

Although a liquid crystal display device of a TN (twisted nematic) mode is described in this embodiment, the thin film transistor of the present invention can be used for other liquid crystal display devices of a VA (vertical alignment) mode, an OCB (optically compensated birefringence) mode, an IPS (in-plane-switching) mode, and the like.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal 1415. The liquid crystal composition including liquid crystal exhibiting a blue phase and a chiral agent has a short response time of greater than or equal to 10 μsec and less than or equal to 100 usec and is optically isotropic; therefore, alignment treatment is not necessary and viewing angle dependence is small.

FIG. 24 illustrates an example of a perspective view showing a structure of a liquid crystal display device of the present invention. The liquid crystal display device illustrated in FIG. 24 is provided with a liquid crystal panel 1601 in which a liquid crystal element is formed between a pair of substrates; a first diffusion plate 1602; a prism sheet 1603; a second diffusion plate 1604; a light guide plate 1605; a reflection plate 1606; a light source 1607; and a circuit substrate 1608.

The liquid crystal panel 1601, the first diffusion plate 1602, the prism sheet 1603, the second diffusion plate 1604, the light guide plate 1605, and the reflection plate 1606 are sequentially stacked. The light source 1607 is provided at an end portion of the light guide plate 1605. The liquid crystal panel 1601 is uniformly irradiated with light from the light source 1607 which is diffused inside the light guide plate 1605, due to the first diffusion plate 1602, the prism sheet 1603, and the second diffusion plate 1604.

Although the first diffusion plate 1602 and the second diffusion plate 1604 are used in this embodiment, the number of diffusion plates is not limited thereto. The number of diffusion plates may be one, or may be three or more. It is acceptable as long as the diffusion plate is provided between the light guide plate 1605 and the liquid crystal panel 1601. Therefore, a diffusion plate may be provided only on the side closer to the liquid crystal panel 1601 than the prism sheet 1603, or may be provided only on the side closer to the light guide plate 1605 than the prism sheet 1603.

Further, the cross section of the prism sheet 1603 is not limited to a sawtooth-shape illustrated in FIG. 24. The prism sheet 1603 may have a shape with which light from the light guide plate 1605 can be concentrated on the liquid crystal panel 1601 side.

The circuit substrate 1608 is provided with a circuit which generates various kinds of signals input to the liquid crystal panel 1601, a circuit which processes the signals, or the like. In FIG. 24, the circuit substrate 1608 and the liquid crystal panel 1601 are connected to each other via a flexible printed circuit (FPC) 1609. Note that the circuit may be connected to the liquid crystal panel 1601 by using a chip on glass (COG) method, or part of the circuit may be connected to the FPC 1609 by using a chip on film (COF) method.

FIG. 24 illustrates an example in which the circuit substrate 1608 is provided with a control circuit which controls driving of the light source 1607 and the control circuit and the light source 1607 are connected to each other via the FPC 1610. Note that the above-described control circuit may be formed over the liquid crystal panel 1601. In that case, the liquid crystal panel 1601 and the light source 1607 are connected to each other via an FPC or the like.

Although FIG. 24 illustrates as an example of an edge-light type light source in which the light source 1607 is disposed at an end portion of the liquid crystal panel 1601, a liquid crystal display device of the present invention may be a direct-below type which includes the light source 1607 disposed directly below the liquid crystal panel 1601.

This embodiment can be implemented by being combined as appropriate with any of the above-described embodiments.

Embodiment 11

In this embodiment, a structure of a light-emitting device including the thin film transistor according to one embodiment of the present invention for a pixel will be described. In this embodiment, a cross-sectional structure of a pixel in the case where a transistor for driving a light-emitting element is an n-channel transistor is described with reference to FIGS. 25A to 25C. Although the case where a first electrode is a cathode and a second electrode is an anode is described in FIGS. 25A to 25C, the first electrode may be an anode and the second electrode may be a cathode as well.

Figure 25A:
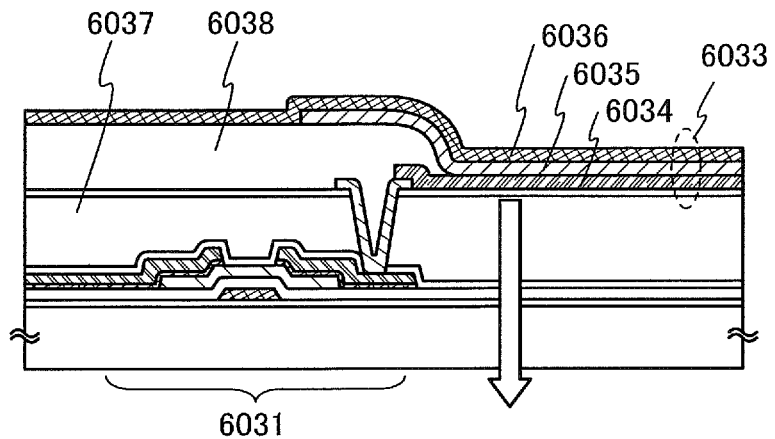
FIGS. 25A to 25C are cross-sectional views of light-emitting devices.

FIG. 25A is the cross-sectional view of a pixel in the case where an n-channel transistor is employed as a transistor 6031, and light emitted from a light-emitting element 6033 is extracted from a first electrode 6034. The transistor 6031 is covered with an insulating film 6037, and over the insulating film 6037, a bank 6038 having an opening is formed. In the opening of the bank 6038, the first electrode 6034 is partly exposed, and the first electrode 6034, an electroluminescent layer 6035, and a second electrode 6036 are sequentially stacked in the opening.

The first electrode 6034 is formed using a material or to a thickness such that light transmits therethrough, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive layer such as an aluminum layer may be used as well. Then, the first electrode 6034 is formed to a thickness such that light transmits therethrough (preferably, approximately 5 nm to 30 nm). Furthermore, the sheet resistance of the first electrode 6034 may be suppressed by formation of a light-transmitting conductive layer of a light-transmitting oxide conductive material so as to be in contact with and over or under the above-described conductive layer with a thickness such that light transmits therethrough. Alternatively, the first electrode 6034 may be formed using only a conductive layer of another light-transmitting oxide conductive material such as indium tin oxide (ITO), zinc oxide (ZnO), indium zinc oxide (IZO), or gallium-doped zinc oxide (GZO). Furthermore, a mixture in which zinc oxide (ZnO) is mixed at 2% to 20% in indium tin oxide including ITO and silicon oxide (hereinafter referred to as ITSO) or in indium oxide including silicon oxide may be used as well. In the case of using the light-transmitting oxide conductive material, it is preferable to provide an electron injection layer in the electroluminescent layer 6035.

The second electrode 6036 is formed using a material and to a thickness such that light is reflected or blocked, and can be formed using a material suitable for being used as an anode. For example, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6036.

The electroluminescent layer 6035 is formed using a single layer or a plurality of layers. When the electroluminescent layer 6035 is formed with a plurality of layers, these layers can be classified into a hole injection layer, a hole transport layer, a light-emitting layer, an electron transport layer, an electron injection layer, and the like in view of the carrier transporting property. In the case where the electroluminescent layer 6035 includes at least one of a hole injection layer, a hole transport layer, an electron transport layer, and an electron injection layer in addition to a light-emitting layer, the electron injection layer, the electron transport layer, the light-emitting layer, the hole transport layer, and the hole injection layer are sequentially stacked over the first electrode 6034. Note that the boundary between each layer is not necessarily clear, and there may be the case where the boundary is unclear since a material for forming each layer is mixed with each other. Each layer may be formed with an organic material or an inorganic material. As the organic material, any of a high molecular weight material, a medium molecular weight material, and a low molecular weight material may be used. Note that the medium molecular weight material corresponds to a low polymer in which the number of repetitions of a structural unit (the degree of polymerization) is approximately 2 to 20. A distinction between a hole injection layer and a hole transport layer is not always distinct, which is the same as in the sense that a hole transport property (hole mobility) is an especially important characteristic. A layer being in contact with the anode is referred to as a hole injection layer and a layer being in contact with the hole injection layer is referred to as a hole transport layer for convenience. The same is also true for the electron transport layer and the electron injection layer; a layer being in contact with the cathode is referred to as an electron injection layer and a layer being in contact with the electron injection layer is referred to as an electron transport layer. In some cases, the light-emitting layer also functions as the electron transport layer, and it is therefore referred to as a light-emitting electron transport layer, too.

In the case of the pixel illustrated in FIG. 25A, light emitted from the light-emitting element 6033 can be extracted from the first electrode 6034 as shown by a hollow arrow.

Figure 25B:
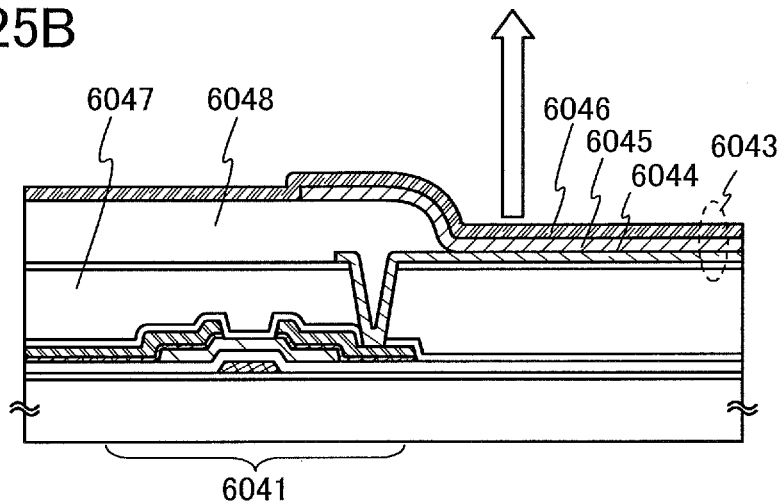

Next, a cross-sectional diagram of a pixel in the case where a transistor 6041 is an n-channel transistor, and light emitted from a light-emitting element 6043 is extracted from a second electrode 6046 side is illustrated in FIG. 25B. The transistor 6041 is covered with an insulating film 6047, and over the insulating film 6047, a bank 6048 having an opening is formed. In the opening of the bank 6048, a first electrode 6044 is partly exposed, and the first electrode 6044, an electroluminescent layer 6045, and the second electrode 6046 are sequentially stacked in the opening.

The first electrode 6044 is formed using a material and to a thickness such that light is reflected or blocked, and can be formed using a material having a low work function of a metal, an alloy, an electrically conductive compound, a mixture thereof, or the like. Specifically, an alkaline metal such as Li or Cs, an alkaline earth metal such as Mg, Ca, or Sr, an alloy containing such metals (e.g., Mg:Ag, Al:Li, or Mg:In), a compound of such materials (e.g., calcium fluoride or calcium nitride), or a rare-earth metal such as Yb or Er can be used. Further, in the case where an electron injection layer is provided, another conductive layer such as an aluminum layer may be used as well.

The second electrode 6046 is formed using a material or to a thickness such that light transmits therethrough, and formed using a material suitable for being used as an anode. For example, another light-transmitting oxide conductive material such as indium tin oxide (ITO), zinc oxide (ZnO), indium zinc oxide (IZO), or gallium-doped zinc oxide (GZO) can be used for the second electrode 6046. Further, a mixture in which zinc oxide (ZnO) is mixed at 2% to 20% in indium tin oxide including ITO and silicon oxide (hereinafter referred to as ITSO) or in indium oxide including silicon oxide may be used as well for the second electrode 6046. Furthermore, other than the above-described light-transmitting oxide conductive material, a single-layer film including one or more of titanium nitride, zirconium nitride, titanium, tungsten, nickel, platinum, chromium, silver, aluminum, and the like, a stacked layer of a titanium nitride film and a film including aluminum as a main component, a three-layer structure of a titanium nitride film, a film including aluminum as a main component, and a titanium nitride film, or the like can be used for the second electrode 6046. However, in the case of using a material other than the light-transmitting oxide conductive material, the second electrode 6046 is formed to a thickness such that light transmits therethrough (preferably, approximately 5 nm to 30 nm).

The electroluminescent layer 6045 can be formed in a manner similar to that of the electroluminescent layer 6035 of FIG. 25A.

In the case of the pixel illustrated in FIG. 25B, light emitted from the light-emitting element 6043 can be extracted from the second electrode 6046 side as shown by a hollow arrow.

Figure 25C:
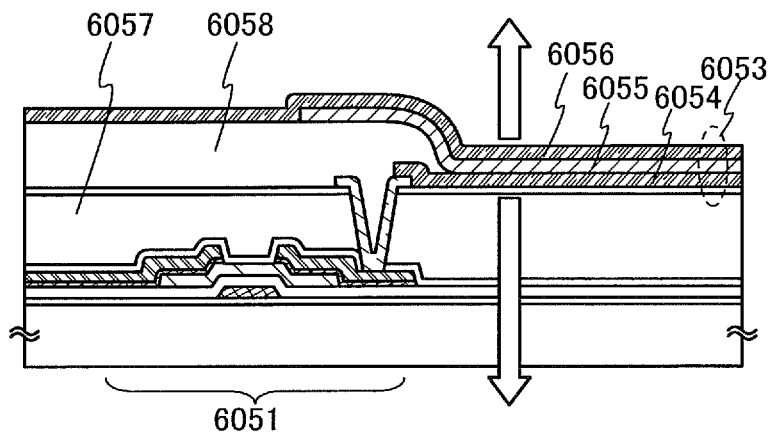

Next, a cross-sectional view of a pixel in the case where a transistor 6051 is an n-channel transistor, and light emitted from a light-emitting element 6053 is extracted from a first electrode 6054 side and a second electrode 6056 side is illustrated in FIG. 25C. The transistor 6051 is covered with an insulating film 6057, and over the insulating film 6057, a bank 6058 having an opening is formed. In the opening of the bank 6058, the first electrode 6054 is partly exposed, and the first electrode 6054, an electroluminescent layer 6055, and the second electrode 6056 are sequentially stacked in the opening.

The first electrode 6054 can be formed in a manner similar to that of the first electrode 6034 in FIG. 25A. The second electrode 6056 can be formed in a manner similar to that of the second electrode 6046 of FIG. 25B. The electroluminescent layer 6055 can be formed in a manner similar to that of the electroluminescent layer 6035 of FIG. 25A.

In the case of the pixel illustrated in FIG. 25C, light emitted from the light-emitting element 6053 can be extracted from both sides of the first electrode 6054 and the second electrode 6056 as shown by hollow arrows.

This embodiment can be implemented in combination with any of the other embodiments as appropriate.

Example 1

A semiconductor device according to one embodiment of the present invention is used, so that a highly reliable electronic device which operates at high speed can be provided. In addition, a semiconductor display device according to one embodiment of the present invention is used, so that a highly reliable electronic device capable of displaying an image with high contrast and high visibility can be provided.

Moreover, in the semiconductor device of the present invention, the heat treatment temperature in a manufacturing process can be suppressed; therefore, a highly reliable thin film transistor with excellent characteristics can be formed even when the thin film transistor is formed over a substrate formed using a flexible synthetic resin of which heat resistance is lower than that of glass, such as plastic. Accordingly, with the use of the manufacturing method according to one embodiment of the present invention, a highly reliable, lightweight, and flexible semiconductor device can be provided. Examples of a plastic substrate include polyester typified by polyethylene terephthalate (PET), polyethersulfone (PES), polyethylene naphthalate (PEN), polycarbonate (PC), polyetheretherketone (PEEK), polysulfone (PSF), polyetherimide (PEI), polyarylate (PAR), polybutylene terephthalate (PBT), polyimide, an acrylonitrile-butadiene-styrene resin, polyvinyl chloride, polypropylene, polyvinyl acetate, an acrylic resin, and the like.

The semiconductor device according to one embodiment of the present invention can be used for display devices, laptops, or image reproducing devices provided with recording media (typically, devices which reproduce the content of recording media such as digital versatile discs (DVDs) and have displays for displaying the reproduced images). Other than the above, as an electronic device which can use the semiconductor device according to one embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 26A to 26E illustrate specific examples of these electronic devices.

Figure 26A:
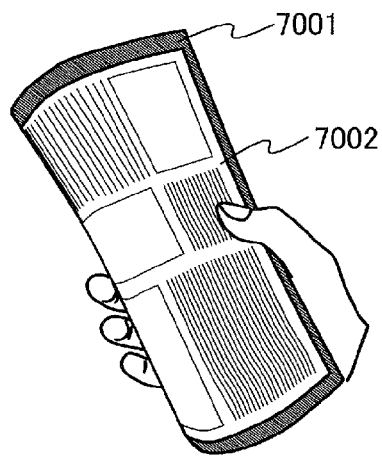
FIGS. 26A to 26E are diagrams each illustrating an electronic device including a semiconductor device.

FIG. 26A illustrates an e-book reader including a housing 7001, a display portion 7002, and the like. The semiconductor display device according to one embodiment of the present invention can be used for the display portion 7002. The semiconductor display device according to one embodiment of the present invention is used for the display portion 7002, so that a highly reliable e-book reader capable of displaying an image with high contrast and high visibility can be provided. The semiconductor device according to one embodiment of the present invention can be used for an integrated circuit used for controlling driving of the e-book reader, so that a highly reliable e-book reader which can operate at high speed can be provided. When a flexible substrate is used, a semiconductor device and a semiconductor display device can have flexibility, whereby a user-friendly e-book reader which is flexible and lightweight can be provided.

Figure 26B:
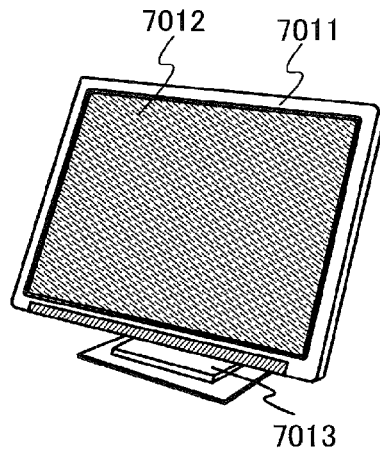

FIG. 26B illustrates a display device including a housing 7011, a display portion 7012, a supporting base 7013, and the like. The semiconductor display device according to one embodiment of the present invention can be used for the display portion 7012. The semiconductor display device according to one embodiment of the present invention is used for the display portion 7012, so that a highly reliable display device capable of displaying an image with high contrast and high visibility can be provided. The semiconductor device according to one embodiment of the present invention can be used for an integrated circuit used for controlling driving of the display device, so that a highly reliable display device which can operate at high speed can be provided. Note that a display device includes all display devices for displaying information, such as display devices for personal computers, for receiving television broadcast, and for displaying advertisement, in its category.

Figure 26C:
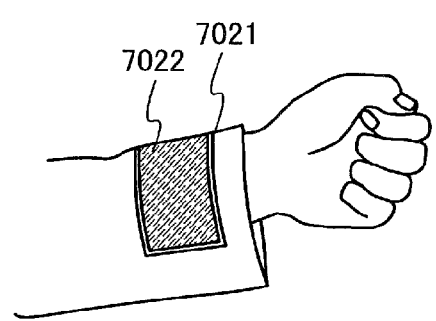

FIG. 26C illustrates a display device including a housing 7021, a display portion 7022, and the like. The semiconductor display device according to one embodiment of the present invention can be used for the display portion 7022. The semiconductor display device according to one embodiment of the present invention is used for the display portion 7022, so that a highly reliable display device capable of displaying an image with high contrast and high visibility can be provided. The semiconductor device according to one embodiment of the present invention can be used for an integrated circuit used for controlling driving of the display device, so that a highly reliable display device which can operate at high speed can be provided. When a flexible substrate is used, a semiconductor device and a semiconductor display device can have flexibility, whereby a user-friendly display device which is flexible and lightweight can be provided. Accordingly, as illustrated in FIG. 26C, a display device can be used while being fixed to fabric or the like, and an application range of the display device is dramatically widened.

Figure 26D:
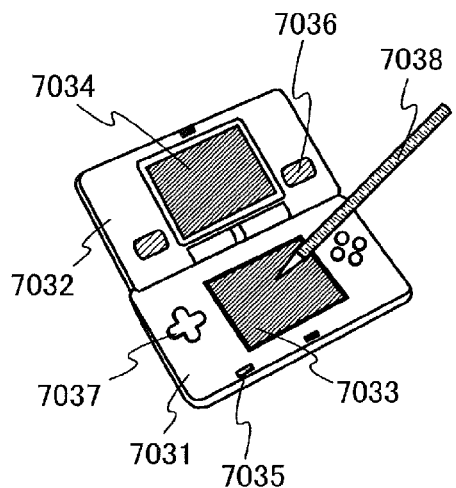

FIG. 26D illustrates a portable game machine including a housing 7031, a housing 7032, a display portion 7033, a display portion 7034, a microphone 7035, speakers 7036, an operation key 7037, a stylus 7038, and the like. The semiconductor display device according to one embodiment of the present invention is used for the display portion 7033 and the display portion 7034, so that a highly reliable portable game machine capable of displaying an image with high contrast and high visibility can be provided. The semiconductor device according to one embodiment of the present invention can be used for an integrated circuit used for controlling driving of the portable game machine, so that a highly reliable portable game machine which can operate at high speed can be provided. Although the portable game machine illustrated in FIG. 26D includes two display portions 7033 and 7034, the number of display portions included in the portable game machine is not limited to two.

Figure 26E:
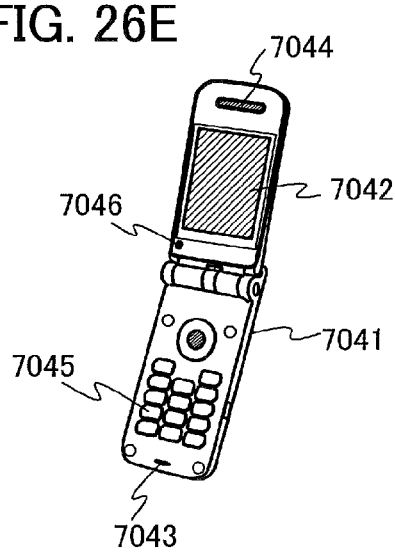

FIG. 26E illustrates a mobile phone which includes a housing 7041, a display portion 7042, an audio input portion 7043, an audio output portion 7044, operation keys 7045, a light-receiving portion 7046, and the like. Light received in the light-receiving portion 7046 is converted into electrical signals, whereby an outside image can be downloaded. The semiconductor display device according to one embodiment of the present invention can be used for the display portion 7042. The semiconductor display device according to one embodiment of the present invention is used for the display portion 7042, so that a highly reliable mobile phone capable of displaying an image with high contrast and high visibility can be provided. The semiconductor device according to one embodiment of the present invention can be used for an integrated circuit used for controlling driving of the mobile phone, so that a highly reliable mobile phone which can operate at high speed can be provided.

This example can be implemented by being combined as appropriate with any of the above-described embodiments.

This application is based on Japanese Patent Application serial no. 2009-242256 filed with Japan Patent Office on Oct. 21, 2009, the entire contents of which are hereby incorporated by reference.

EXPLANATION OF REFERENCE

10: pulse output circuit, 11: wiring, 12: wiring, 13: wiring, 14: wiring, 15: wiring, 21: input terminal, 22: input terminal, 23: input terminal, 24, input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 100 substrate, 101: gate electrode, 102: gate insulating film, 103: oxide semiconductor film, 104: oxide semiconductor film, 105a: conductive film, 105b: conductive film, 105c: conductive film, 105d: conductive film, 105e: conductive film, 106: source electrode, 107: drain electrode, 108: oxide semiconductor film, 109: insulating film, 110: transistor, 111: back gate electrode, 112: insulating film, 120: thin film transistor, 126: source electrode, 127: drain electrode, 128: oxide semiconductor film, 129: insulating film, 130: thin film transistor, 136: source electrode, 137: drain electrode, 138: oxide semiconductor film, 139: insulating film, 140: thin film transistor, 146: source electrode, 147: drain electrode, 148: oxide semiconductor film, 149: insulating film, 300: substrate, 301: gate electrode, 302: gate insulating film, 303: oxide semiconductor film, 304: oxide semiconductor film, 305a: conductive film, 305b: conductive film, 306: source electrode, 307: drain electrode, 309: insulating film, 310: thin film transistor, 311: channel protective film, 312: back gate electrode, 313: insulating film, 400: substrate, 401: gate electrode, 402: gate insulating film, 403: oxide semiconductor film, 404: oxide semiconductor film, 405a: conductive film, 405b: conductive film, 406: source electrode, 407: drain electrode, 409: insulating film, 410: thin film transistor, 700: pixel portion, 701: signal line driver circuit, 702: scan line driver circuit, 703: pixel, 704: transistor, 705: display element, 706: storage capacitor 707: signal line, 708: scan line, 710: pixel electrode, 711: counter electrode, 712: microcapsule, 713: drain electrode, 714: resin, 800: substrate, 801: gate electrode, 802: gate insulating film, 803: oxide semiconductor film, 804: oxide semiconductor film, 805: oxide semiconductor film, 806: conductive film, 806a: conductive film, 806b: conductive film, 807: source electrode, 808: drain electrode, 809: insulating film, 813: thin film transistor, 814: pixel electrode, 815: transparent conductive film, 816: transparent conductive film, 819: storage capacitor, 820: terminal, 821: terminal, 822: capacitor wiring, 1401: thin film transistor, 1402: gate electrode, 1403 gate insulating film, 1404: oxide semiconductor film, 1406a: conductive film, 1406b: conductive film, 1407: insulating film, 1408: insulating film, 1410: pixel electrode, 1411: alignment film, 1413: counter electrode, 1414: alignment film, 1415: liquid crystal, 1416: sealant, 1417: spacer, 1420: substrate, 1601: liquid crystal panel, 1602: diffusion plate, 1603: prism sheet, 1604: diffusion plate, 1605: light guide plate, 1606: reflection plate, 1607: light source, 1608: circuit substrate, 1609: FPC, 1610: FPC, 5300: substrate, 5301: pixel portion, 5302: scan line driver circuit, 5303: scan line driver circuit, 5304: signal line driver circuit, 5305: timing control circuit, 5601: shift register, 5602: sampling circuit, 5603: transistor, 5604: wiring, 5605: wiring, 6031: transistor, 6033: light-emitting element, 6034: electrode, 6035: electroluminescent layer, 6036: electrode, 6037: insulating film, 6038: bank, 6041: transistor, 6043: light-emitting element, 6044: electrode, 6045: electroluminescent layer, 6046: electrode, 6047: insulating film, 6048: bank, 6051: transistor, 6053: light-emitting element, 6054: electrode, 6055: electroluminescent layer, 6056: electrode, 6057: insulating film, 6058: bank, 7001: housing, 7002: display portion, 7011: housing, 7012: display portion, 7013: supporting base, 7021: housing, 7022: display portion, 7031: housing, 7032: housing, 7033: display portion, 7034: display portion, 7035: microphone, 7036: speaker, 7037: operation key, 7038: stylus, 7041: housing, 7042: display portion, 7043: audio input portion, 7044: audio output portion, 7045: operation key, and 7046: light-receiving portion.

The invention claimed is:

1. A semiconductor device comprising:
a substrate;
a gate electrode over the substrate;
a first insulating film over the gate electrode, the first insulating film comprising silicon and nitrogen;
a second insulating film over the first insulating film, the second insulating film comprising silicon and oxygen;
an oxide semiconductor film over the second insulating film, the oxide semiconductor film comprising indium and oxygen;
a source electrode over the oxide semiconductor film;
a drain electrode over the oxide semiconductor film;
a third insulating film over the oxide semiconductor film and covering a top surface of the source electrode and a top surface of the drain electrode, and an outer side edge of one of the source electrode and the drain electrode, when viewed in a cross-sectional view of the semiconductor device, the third insulating film comprising silicon and oxygen;
a fourth insulating film made of a silicon nitride film over the third insulating film and covering the outer side edge of the one of the source electrode and the drain electrode, when viewed in the cross-sectional view of the semiconductor device; and
a pixel electrode over the fourth insulating film, the pixel electrode being electrically connected to one of the source electrode and the drain electrode,
wherein each of the source electrode and the drain electrode comprises a first conductive film and a second conductive film,
wherein the second conductive film is over the first conductive film and is thicker than the first conductive film,
wherein the first conductive film comprises titanium, tungsten, or molybdenum, wherein the second conductive film comprises a metal with a lower electronegativity than an electronegativity of hydrogen, wherein the third insulating film is in contact with a top surface of the oxide semiconductor film and is thicker than the fourth insulating film, and wherein the metal is not aluminum.

2. The semiconductor device according to claim 1, wherein a whole of the oxide semiconductor film overlaps with and extends within a perimeter of the gate electrode when viewed in a plan view of the semiconductor device.

3. The semiconductor device according to claim 1, wherein the source electrode and the drain electrode are in contact with side edges of the oxide semiconductor film.

4. The semiconductor device according to claim 1, wherein a carrier concentration of the oxide semiconductor film is less than $1 \times 10^{18}/cm^3$.

5. The semiconductor device according to claim 1, wherein the oxide semiconductor film comprises an In—Ga—Zn—O-based oxide semiconductor.

6. A semiconductor device comprising:
a substrate;
a gate electrode over the substrate;
a first insulating film over the gate electrode, the first insulating film comprising silicon and nitrogen;
a second insulating film over the first insulating film, the second insulating film comprising silicon, oxygen, and nitrogen;
an oxide semiconductor film over the second insulating film, the oxide semiconductor film comprising indium and oxygen;
a source electrode over the oxide semiconductor film;
a drain electrode over the oxide semiconductor film;
a third insulating film over the oxide semiconductor film and covering a top surface of the source electrode and a top surface of the drain electrode, and an outer side edge of one of the source electrode and the drain electrode, when viewed in a cross-sectional view of the semiconductor device, the third insulating film comprising silicon, oxygen, and nitrogen;
a fourth insulating film made of a silicon nitride film over the third insulating film and covering the outer side edge of the one of the source electrode and the drain electrode, when viewed in the cross-sectional view of the semiconductor device; and
a pixel electrode over the fourth insulating film, the pixel electrode being electrically connected to one of the source electrode and the drain electrode,
wherein each of the source electrode and the drain electrode comprises a first conductive film and a second conductive film,
wherein the second conductive film is over the first conductive film and is thicker than the first conductive film,
wherein the first conductive film comprises titanium, tungsten, or molybdenum,
wherein the second conductive film comprises a metal with a lower electronegativity than an electronegativity of hydrogen,
wherein the third insulating film is in contact with a top surface of the oxide semiconductor film and is thicker than the fourth insulating film, and
wherein the metal is not aluminum.

7. The semiconductor device according to claim 6, wherein a whole of the oxide semiconductor film overlaps with and extends within a perimeter of the gate electrode when viewed in a plan view of the semiconductor device.

8. The semiconductor device according to claim 6, wherein the source electrode and the drain electrode are in contact with side edges of the oxide semiconductor film.

9. The semiconductor device according to claim 6, wherein a carrier concentration of the oxide semiconductor film is less than $1 \times 10^{18}/cm^3$.

10. The semiconductor device according to claim 6, wherein the oxide semiconductor film comprises an In—Ga—Zn—O-based oxide semiconductor.

11. A semiconductor device comprising:
a substrate;
a gate electrode over the substrate;
a first insulating film over the gate electrode, the first insulating film comprising silicon and nitrogen;
a second insulating film over the first insulating film, the second insulating film comprising silicon and oxygen;
an oxide semiconductor film over the second insulating film, the oxide semiconductor film comprising indium and oxygen;
a source electrode over the oxide semiconductor film;
a drain electrode over the oxide semiconductor film;
a third insulating film over the oxide semiconductor film and covering a top surface of the source electrode and a top surface of the drain electrode, the third insulating film comprising silicon and oxygen;
a fourth insulating film made of a silicon nitride film over the third insulating film;
a pixel electrode over the fourth insulating film, the pixel electrode being electrically connected to one of the source electrode and the drain electrode; and
a fifth insulating film over and in contact with the oxide semiconductor film, the fifth insulating film being below and in contact with each of the source electrode, the drain electrode, and the third insulating film, and the fifth insulating film comprising silicon and oxygen,
wherein each of the source electrode and the drain electrode comprises a first conductive film and a second conductive film,
wherein the second conductive film is over the first conductive film and is thicker than the first conductive film,
wherein the first conductive film comprises titanium, tungsten, or molybdenum,
wherein the second conductive film comprises a metal with a lower electronegativity than an electronegativity of hydrogen,
wherein the fourth insulating film is in contact with the third insulating film, and
wherein a layer comprising the third insulating film and the fifth insulating film is thicker than the fourth insulating film.

12. The semiconductor device according to claim 11, wherein a whole of the oxide semiconductor film overlaps with and extends within a perimeter of the gate electrode when viewed in a plan view of the semiconductor device.

13. The semiconductor device according to claim 11, wherein the source electrode and the drain electrode are in contact with side edges of the oxide semiconductor film.

14. The semiconductor device according to claim 11, wherein a carrier concentration of the oxide semiconductor film is less than $1 \times 10^{18}/cm^3$.

15. The semiconductor device according to claim 11, wherein the oxide semiconductor film comprises an In—Ga—Zn—O-based oxide semiconductor.

16. The semiconductor device according to claim 11,
wherein the third insulating film covers an outer side edge of one of the source electrode and the drain electrode, when viewed in a cross-sectional view of the semiconductor device, and
wherein the fourth insulating film covers the outer side edge of the one of the source electrode and the drain electrode, when viewed in the cross-sectional view of the semiconductor device.

17. A semiconductor device comprising:
a substrate;
a gate electrode over the substrate;
a first insulating film over the gate electrode, the first insulating film comprising silicon and nitrogen;
a second insulating film over the first insulating film, the second insulating film comprising silicon, oxygen, and nitrogen;
an oxide semiconductor film over the second insulating film, the oxide semiconductor film comprising indium and oxygen;
a source electrode over the oxide semiconductor film;
a drain electrode over the oxide semiconductor film;
a third insulating film over the oxide semiconductor film and covering a top surface of the source electrode and a top surface of the drain electrode, the third insulating film comprising silicon, oxygen, and nitrogen;
a fourth insulating film made of a silicon nitride film over the third insulating film;
a pixel electrode over the fourth insulating film, the pixel electrode being electrically connected to one of the source electrode and the drain electrode; and
a fifth insulating film over and in contact with the oxide semiconductor film, the fifth insulating film being below and in contact with each of the source electrode, the drain electrode, and the third insulating film, and the fifth insulating film comprising silicon and oxygen,
wherein each of the source electrode and the drain electrode comprises a first conductive film and a second conductive film,
wherein the second conductive film is over the first conductive film and is thicker than the first conductive film,
wherein the first conductive film comprises titanium, tungsten, or molybdenum,
wherein the second conductive film comprises a metal with a lower electronegativity than an electronegativity of hydrogen,
wherein the fourth insulating film is in contact with the third insulating film, and
wherein a layer comprising the third insulating film and the fifth insulating film is thicker than the fourth insulating film.

18. The semiconductor device according to claim 17, wherein the fifth insulating film comprises silicon, oxygen, and nitrogen.

19. The semiconductor device according to claim 17, wherein a whole of the oxide semiconductor film overlaps with and extends within a perimeter of the gate electrode when viewed in a plan view of the semiconductor device.

20. The semiconductor device according to claim 17, wherein the source electrode and the drain electrode are in contact with side edges of the oxide semiconductor film.

21. The semiconductor device according to claim 17, wherein a carrier concentration of the oxide semiconductor film is less than $1 \times 10^{18}/cm^3$.

22. The semiconductor device according to claim 17, wherein the oxide semiconductor film comprises an In—Ga—Zn—O-based oxide semiconductor.

23. The semiconductor device according to claim 17,
wherein the third insulating film covers an outer side edge of one of the source electrode and the drain electrode, when viewed in a cross-sectional view of the semiconductor device, and
wherein the fourth insulating film covers the outer side edge of the one of the source electrode and the drain electrode, when viewed in the cross-sectional view of the semiconductor device.

24. A semiconductor device comprising:
a substrate;
a gate electrode over the substrate;
a first insulating film over the gate electrode, the first insulating film comprising silicon and nitrogen;
a second insulating film over the first insulating film, the second insulating film comprising silicon and oxygen;
an oxide semiconductor film over the second insulating film, the oxide semiconductor film comprising indium and oxygen;
a source electrode over the oxide semiconductor film;
a drain electrode over the oxide semiconductor film;
a third insulating film over the oxide semiconductor film and covering a top surface of the source electrode and a top surface of the drain electrode, the third insulating film comprising silicon and oxygen;
a pixel electrode over the third insulating film, the pixel electrode being electrically connected to one of the source electrode and the drain electrode; and
a fourth insulating film over and in contact with the oxide semiconductor film, the fourth insulating film being below and in contact with each of the source electrode, the drain electrode, and the third insulating film, and the fourth insulating film comprising silicon and oxygen,
wherein each of the source electrode and the drain electrode comprises a first conductive film and a second conductive film,
wherein the second conductive film is over the first conductive film and is thicker than the first conductive film,
wherein the first conductive film comprises titanium, tungsten, or molybdenum,
wherein the second conductive film comprises a metal with a lower electronegativity than an electronegativity of hydrogen, and
wherein the metal is not aluminum.

25. The semiconductor device according to claim 24, wherein a whole of the oxide semiconductor film overlaps with and extends within a perimeter of the gate electrode when viewed in a plan view of the semiconductor device.

26. The semiconductor device according to claim 24, wherein the source electrode and the drain electrode are in contact with side edges of the oxide semiconductor film.

27. The semiconductor device according to claim 24, wherein a carrier concentration of the oxide semiconductor film is less than $1 \times 10^{18}/cm^3$.

28. The semiconductor device according to claim 24, wherein the oxide semiconductor film comprises an In—Ga—Zn—O-based oxide semiconductor.

29. The semiconductor device according to claim 24,
wherein the third insulating film covers an outer side edge of one of the source electrode and the drain electrode, when viewed in a cross-sectional view of the semiconductor device.

* * * * *